(12) United States Patent
Nakamura et al.

(10) Patent No.: US 6,815,767 B2
(45) Date of Patent: Nov. 9, 2004

(54) INSULATED GATE TRANSISTOR

(75) Inventors: Katsumi Nakamura, Hyogo (JP); Shigeru Kusunoki, Hyogo (JP); Hideki Nakamura, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/239,782

(22) PCT Filed: Feb. 1, 2001

(86) PCT No.: PCT/JP01/00727

§ 371 (c)(1),
(2), (4) Date: Sep. 25, 2002

(87) PCT Pub. No.: WO02/061845

PCT Pub. Date: Aug. 8, 2002

(65) Prior Publication Data
US 2003/0047778 A1 Mar. 13, 2003

(51) Int. Cl.⁷ .................. H01L 29/76; H01L 29/94; H01L 31/113; H01L 31/062; H01L 31/119
(52) U.S. Cl. .................. 257/330; 257/331; 257/332; 257/334
(58) Field of Search .................. 257/330–332, 257/334

(56) References Cited

U.S. PATENT DOCUMENTS

| 4,893,165 A | | 1/1990 | Miller et al. |
| 5,385,855 A | * | 1/1995 | Brown et al. ........... 438/238 |
| 5,721,148 A | | 2/1998 | Nishimura |
| 6,194,741 B1 | * | 2/2001 | Kinzer et al. ........... 257/77 |
| 6,600,192 B1 | * | 7/2003 | Sugawara et al. ........... 257/329 |

FOREIGN PATENT DOCUMENTS

| JP | 57-194583 | 11/1982 |
| JP | 2-1985 | 1/1990 |
| JP | 4-286163 | 10/1992 |
| JP | 7-321304 | 12/1995 |
| JP | 9-260602 | 10/1997 |
| JP | 10-74939 | 3/1998 |
| JP | 11-54519 | 2/1999 |

OTHER PUBLICATIONS

U.S. National Phase of PCT/JP01/00373, filed Sep. 10, 2002, our reference No. 57454–735, entitled Semiconductor Device, Katsumi Nakamura et al.

* cited by examiner

Primary Examiner—Allan R. Wilson
(74) Attorney, Agent, or Firm—McDermott Will & Emery LLP

(57) ABSTRACT

A semiconductor device of the present invention is provided with a power device which has a semiconductor substrate having a first main surface and a second main surface that are opposed to each other and an insulating gate structure on the first main surface side, wherein a main current flows between the first main surface and the second main surface, that is to say, is provided with an insulating gate type MOS transistor structure wherein the thickness ($t_1$) of the semiconductor substrate is no less than 50 $\mu$m and no greater than 250 $\mu$m and a low ON voltage and a high withstanding capacity against breakdown are implemented in the first main surface. Thereby, a low ON voltage, the maintaining of the withstanding capacity against breakdown and the reduction of a switching loss on the high voltage side can be implemented.

16 Claims, 76 Drawing Sheets

FIG.28

INSULATED GATE TRANSISTOR

TECHNICAL FIELD

The present invention relates to a semiconductor device and to a manufacturing method for the same and to a collector structure in the rear surface of a semiconductor substrate wherein the semiconductor substrate has been converted to a thin film, and to a manufacturing method for the same.

BACKGROUND ART

In the field of a high voltage withstanding semiconductor device that controls a voltage exceeding several hundred volts, element characteristics wherein heat emission, that is to say, loss is suppressed are required because the current handled is great. In addition, as for a driving system of a gate that controls this voltage and current, a voltage drive element of which the driving circuit is small so that the loss therein is small is desirable.

In recent years, because of the above described reasons, an insulated gate bipolar transistor, that is to say, an IGBT, has come into wide use as an element wherein a voltage drive is possible and loss is small in this field. The structure of this IGBT is a structure wherein the impurity concentration of the drain is lowered so as to secure the withstanding voltage in a MOS (metal oxide semiconductor) transistor and the drain can be regarded as a diode in order to reduce the drain resistance.

Thus, a diode carries out a bipolar operation in an IGBT and, therefore, in the present application the source of the MOS transistor of an IGBT is referred to as an emitter and the drain is referred to as a collector.

A voltage of several hundred volts is applied between the collector and the emitter of an IGBT, which is a voltage drive element and which is controlled by the gate voltage of which the voltage is ± several volts to several tens of volts. In addition, in many cases an IGBT is used as an inverter, wherein the voltage between the collector and the emitter is low in the case that the gate is in the on condition so that a great amount of current flows while no current flows and the voltage between collector and the emitter is high in the case that the gate is in the off condition.

Since the operation of an IGBT is carried out conventionally in the above described mode, the loss is divided into constant loss, which is a product of current and voltage in the on condition, and switching loss at the time of transition wherein the on condition and the off condition are switched. The product of leak current and voltage in the off condition is so small that it can be ignored.

On the other hand, it is important to prevent breakdown of the element during an abnormal state such as, for example, in the case that the load is short circuited. In this case, the gate is turned on while the power source voltage of several hundred volts is applied between the collector and the emitter so that a large current flows.

In an IGBT having a structure wherein a MOS transistor and a diode are connected in series the maximum current is controlled by the saturation current of the MOS transistor. Therefore, the current control works even at the time of short circuiting, as described above, so that breakdown of the element due to heat emission of a constant period of time can be prevented.

FIG. 75 is a cross sectional view schematically showing the configuration of a semiconductor device according to a prior art. An IGBT is formed in a semiconductor substrate having a first main surface and a second main surface that are opposed to each other. A p-type body region 102 is formed on the first main surface side of an n⁻ silicon layer 101 and an n-type emitter region 103 and a p⁺ impurity diffusion region 106 are formed in the first main surface within this p-type body region 102.

A trench 101a for a gate is created so as to penetrate this n-type emitter region 103 and this p-type body region 102 and so as to reach to n⁻ silicon layer 101. A gate insulating film 104a is formed so as to extend along the inner surface of this trench 101a for a gate and a gate electrode 105a is formed so as to fill in trench 101a for a gate. An insulating film 122A made of an oxide film is formed on the upper surface of gate electrode 105a.

This n⁻ silicon layer 101, n-type emitter region 103 and gate electrode 105a form an insulating gate type field effect transistor (here MOS transistor) having n⁻ silicon layer 101 as a drain and having n-type emitter region 103 as a source.

Insulating films 109 and 122B are formed above the first main surface and a contact hole 109a is created in these insulating films 109 and 122B so as to reach to the surface of n-type emitter region 103 and p⁺ impurity diffusion region 106. A barrier metal layer 110 is formed on the upper surfaces of insulating films 109 and 122B as well as on the inner surface of contact hole 109a and a silicide layer 121a is formed in a contact portion between barrier metal layer 110 and the semiconductor substrate. An emitter electrode 111 is formed above the first main surface so as to be electrically connected to n-type emitter region 103 and to p⁺ impurity diffusion region 106 via this barrier metal layer 110 and this silicide layer 121a.

An n-type buffer region 107 and a p-type collector region 108 are formed on the second main surface side of n⁻ silicon layer 101. A collector electrode 112 made of, for example, an aluminum compound is electrically connected to this p-type collector region 108.

In such a semiconductor device according to the prior art, thickness $t_2$ of the semiconductor substrate is 300 μm to 400 μm and, in some cases, is 500 μm.

Next, a manufacturing method for the semiconductor device according to the prior art shown in FIG. 75 is described.

FIGS. 76 to 85 are schematic cross sectional views showing the steps, in order, of the manufacturing method for the semiconductor device according to the prior art. In reference to FIG. 76, first n-type buffer region 107 and n⁻ silicon layer 101 are formed above p-type semiconductor substrate 108 that becomes the collector region through an epitaxial growth method. p-type body region 102 is formed on the first main surface side of this n⁻ silicon layer 101 and insulating film 131 made of, for example, a silicon oxide film is formed on top of that.

In reference to FIG. 77, this insulating film 131 is patterned by means of conventional photomechanical technology and etching technology. This patterned insulating film 131 is used as a mask so that ion implantation, or the like, is carried out on p-type body region 102 and, thereby, n-type emitter region 103 is formed. After this, insulating film 131 is removed.

In reference to FIG. 78, a thermal oxide film 132 and a CVD (chemical vapor deposition) oxide film 133 are sequentially formed over the entirety of the first main surface and, after that, patterning is carried out. This patterned thermal oxide film 132 and CVD oxide film 133 are used as a mask so as to carry out anisotropic etching on the semiconductor substrate. Thereby, trench 101a for a gate is created so as to penetrate n-type emitter region 103 and p-type body region 102 and so as to reach to n⁻ silicon layer 101.

In reference to FIG. 79, processes such as isotropic plasma etching and sacrificial oxidation are carried out. Thereby, the opening and the bottom portion of trench 101a for a gate become rounded and unevenness of the sidewalls of trench 101a for a gate is made flat. Furthermore, a sacrificial oxide film 132a is formed so as to extend the inner surface of trench 101a for a gate and is integrated into thermal oxide film 102. After this, CVD oxide film 133, thermal oxide film 132 and sacrificial oxide film. 132a are removed.

In reference to FIG. 80, the surface of the semiconductor substrate is exposed as a result of this removal.

In reference to FIG. 81, gate insulating film 104a made of a silicon oxide film, or the like, is formed on the inner surface of trench 101a for a gate and on the first main surface of the semiconductor substrate. Furthermore, a conductive layer 105 made of a polycrystal silicon, or the like, to which phosphorus is introduced so as to have a high concentration is formed in the first main surface of the semiconductor substrate so as to fill in trench 101a for a gate. After this, this conductive layer 105 is removed until the upper surface of gate insulating film 104a is exposed.

In reference to FIG. 82, thereby, conductive layer 105 is allowed to remain so as to fill in trench 101a for a gate so that gate electrode 105a is formed. After this, insulating film 122A is formed on the upper surface of gate electrode 105a.

In reference to FIG. 83, an insulating film 109 made of, for example, a silicate glass and an insulating film 122B made of a CVD oxide film are sequentially formed and, after that, are patterned so as to open contact hole 109a.

In reference to FIG. 84, barrier metal layer 110 is formed over the entirety of the surface. After this, lamp annealing, or the like, is carried out and, thereby, silicide layer 121a is formed in a contact portion between barrier metal layer 110 and the semiconductor substrate. Emitter electrode 111 is formed on barrier metal layer 110.

In reference to FIG. 85, p-type collector region 108 is removed through polishing.

After this, collector electrode 112 is formed so as to be connected to p-type collector region 108 in the second main surface and the semiconductor device according to the prior art, shown in FIG. 75, is completed.

In the configuration shown in FIG. 75, p-type collector region 108 of a high concentration, which is thick, exists on the second main surface side of semiconductor substrate and, therefore, the injection efficiency of holes from the collector side (second main surface side) becomes high at the time when the device turns ON. Thereby, the lowering of the ON voltage (lowering of $R_{ON}$) can be implemented.

In the configuration shown in FIG. 75, however, a main current that flows when the device turns ON becomes very large and the saturation current becomes large and, as a result, the device itself cannot control the current and it is difficult to secure or increase the withstanding capacity against breakdown at the time of device operation with no load.

In addition, in the configuration shown in FIG. 75, p-type collector region 108 of a high concentration, which is thick, exists on the second main surface side and, therefore, the injection efficiency of holes from the collector side (second main surface side) at the ON time of the device becomes very high. Therefore, the switching loss increases at the time of turning off in the case that the voltage Vce between the collector and the emitter is high (in the case of switching at high voltage).

Furthermore, in the manufacturing method shown in FIGS. 76 to 85, p-type collector region 108 and n-type buffer region 107 exist on the second main surface side from the beginning of the process and n-type buffer region 107 and n⁻ silicon layer 101 are formed through epitaxial growth. Therefore, the substrate tends to become costly and freedom in thickness of the substrate is limited.

DISCLOSURE OF THE INVENTION

An object of the present invention is to provide a semiconductor device wherein the lowering of the ON voltage is implemented, wherein the withstanding capacity against breakdown is secured and wherein switching loss on the high voltage side can be reduced and to provide a manufacturing method for the same.

In addition, another object of the present invention is to provide a semiconductor device that can prevent negative effects, due to fluctuation during the process, on the device characteristics and to provide a manufacturing method for the same.

In addition, still another object of the present invention is to provide a manufacturing method for a semiconductor device wherein limitations on the freedom of the thickness of the substrate are lessened and that is useful for lowering the price.

A semiconductor device according to one aspect of the present invention is provided with: a semiconductor substrate having a first main surface and a second main surface that are opposed to each other; and an element that includes an insulating gate type field effect transistor portion having an insulating gate structure on the first main surface side and wherein a main current flows between the first main surface and the second main surface, wherein the thickness of the semiconductor substrate (thickness of n⁻ drift layer) is no less than 50 μm and no greater than 250 μm.

Here, in the present specification, the thickness of the semiconductor substrate and the thickness of the drift layer have the same meaning.

In accordance with a semiconductor device according to one aspect of the present invention, the thickness of the semiconductor substrate is made thinner than that in the prior art so that the resistance component in the thickness direction is reduced and an insulating gate type field effect transistor structure is provided in the first main surface in order to achieve the lowering of the ON voltage and, thereby, the lowering of the ON voltage (lowering of $R_{ON}$) can be implemented.

In addition, the thickness of the semiconductor substrate is no less than 50 μm and no greater than 250 μm and the device is provided with an insulating gate type field effect transistor structure that increases the withstanding capacity against breakdown and, therefore, the withstanding capacity against breakdown at the time of device operation can be secured and loss can be reduced.

In the case that the thickness of the semiconductor substrate is less than 50 μm, the substrate is too thin and it is difficult to secure the withstanding capacity against breakdown at the time of device operation. In addition, in the case that the thickness of the semiconductor substrate exceeds 250 μm, $V_{ON}$ becomes high. Thereby, stationary loss $E_{DC}$ becomes great and it becomes difficult to reduce loss.

In the above described aspect, the insulating gate type field effect transistor portion preferably has a source diffusion region and a drain diffusion region of a first conductive type, and the source diffusion region of the first conductive type is formed in the first main surface and is opposed to the drain diffusion region sandwiching a body region of a second conductive type.

The present invention is preferably applicable to an element that has such an insulating gate type field effect transistor portion.

In the above described aspect, an impurity diffusion region of the second conductive type formed in the second main surface is preferably further provided wherein the impurity surface concentration in the second main surface of the impurity diffusion region is $5 \times 10^{15}$ cm$^{-3}$, or greater.

Thereby, a change in $V_{ON}$ or in $V_{CES}$ over time can be restricted so that negative effects on device characteristics due to such changeover time can be prevented.

In the above described aspect, the diffusion depth of the impurity diffusion region from the second main surface is preferably 1 μm, or less.

Thus, the impurity diffusion region can be thinly formed and, therefore, the thickness of the semiconductor substrate can be made thinner.

In the above described aspect, the impurity activation ratio in the impurity diffusion region is preferably 50%, or less.

Thereby, negative effects on device characteristics due to fluctuations in process conditions can be prevented.

In the above described aspect, the impurity diffusion region and the drain diffusion region preferably form a pn junction, the drain diffusion region has a first high concentration region of the first conductive type in a region that contacts the impurity diffusion region and the first high concentration region has an impurity concentration peak of a concentration, or lower, of an impurity concentration peak of the impurity diffusion region.

Thereby, the main junction leak characteristics are reduced, the withstanding voltage rises and the tail current of the $I_C$ waveform decreases at the time of turning off so that switching loss $E_{off}$ is reduced. In addition, there is an effect of the restriction of change in $E_{off}$ due to increase in $V_{CE}$.

In the above described aspect, the first high concentration region is preferably positioned in a range of a depth of 2 μm, or less, from the second main surface.

Thus, the first high concentration region can be shallowly formed and, therefore, the thickness of the semiconductor substrate can be made thinner.

In the above described aspect, a trench for a gate is preferably created in the first main surface of the semiconductor substrate, a gate electrode of the insulating gate type field effect transistor portion is filled in the trench for a gate and an upper surface of the gate electrode protrudes from the trench for a gate.

Thus, the present invention is preferably applicable to a trench MOS gate-type element.

In the above described aspect, a trench for a gate is preferably created in the first main surface of the semiconductor substrate, a gate electrode of the insulating gate type field effect transistor portion is filled in the trench for a gate and an upper surface of the gate electrode is shifted not toward the first main surface but, rather, toward the second main surface side.

Thus, the present invention is preferably applicable to a trench MOS gate-type element.

In the above described aspect, a source side electrode electrically connected to the source diffusion region is preferably further provided on the first main surface side.

Thereby, the potential of the source diffusion region can be adjusted via the source side electrode.

In the above described aspect, the semiconductor substrate preferably has a trench for a source side electrode in the first main surface and a conductive layer electrically connected to the source side electrode is filled in into the trench for a source side electrode.

Thus, a trench filled in with a conductive layer for the source potential is provided and, thereby, the effective gate width can be reduced so that an effect of suppression of the saturation current is obtained. In addition, because of the effect of the reduction of the saturation current, an arbitrary current can be held for a longer period of time than in the prior art when the device switches in the no-load condition. That is to say, there is an effect of suppression of the saturation current of the device and of an increase of withstanding capacity against breakdown. Furthermore, oscillation at the time of switching in the no-load condition can be suppressed.

In the above described aspect, a plurality of trenches of the same type as the trench for a source side electrode is preferably provided and each piece of the conductive layer that fills in the plurality of trenches for a source side electrode is integrally formed of a single layer.

Thereby, it becomes possible to fill in, integrally, a plurality of trenches for a source side electrode with a single layer.

In the above described aspect, the source side electrode is preferably formed in the first main surface, to which no trenches are provided, and a second high concentration region of the second conductive type is provided to the first main surface, to which no trenches are provided, so as to be electrically connected to the source side electrode.

Thus, a wide portion to which no trenches are provided can be secured and, thereby, the effective gate width can be reduced.

A semiconductor device according to another aspect of the present invention is provided with: a semiconductor substrate having a first main surface and a second main surface that are opposed to each other; and an element that includes an insulating gate type field effect transistor portion which has an insulating gate structure on the first main surface side and wherein a main current flows between the first main surface and the second main surface, wherein the element has an impurity diffusion region which is formed in the second main surface and of which the impurity activation ratio is no greater than 50%.

In accordance with the semiconductor device according to the other aspect of the present invention, negative effects on device characteristics due to fluctuations in process conditions can be prevented.

In the case that the impurity activation ratio of the impurity diffusion region exceeds 50%, the fluctuation in $V_{ON}$ relative to the implantation amount in the collector layer becomes great and the fluctuation in $V_{ON}$ relative to the fluctuation of the ion implantation amount becomes great and, therefore, device design becomes difficult.

In the above described other aspect, the impurity surface concentration of the impurity diffusion region in the second main surface is preferably no lower than $5 \times 10^{15}$ cm$^{-3}$.

Thereby, change in $V_{ON}$ or in $V_{CES}$ over time can be restricted and negative effects on device characteristics due to such change over time can be prevented.

In the above described other aspect, the diffusion depth of the impurity diffusion region from the second main surface is preferably no greater than 1 μm.

Thus, the impurity diffusion region can be thinly formed and, therefore, the thickness of the semiconductor substrate can be made thinner.

In the above described other aspect, the impurity diffusion region and the drain diffusion region of the insulating gate type field effect transistor portion preferably form a pn junction, the drain diffusion region has a first high concentration region of a first conductive type in a region that contacts the impurity diffusion region and the first high concentration region has an impurity concentration peak of a concentration, or lower, of an impurity concentration peak of the impurity diffusion region.

Thereby, the main junction leak characteristics are reduced, the withstanding voltage rises and the tail current of the $I_C$ waveform decreases at the time of turning off so that switching loss $E_{OFF}$ is reduced. In addition, there is an effect of the restriction of change in $E_{OFF}$ due to increase in $V_{CE}$.

In the above described other aspect, the first high concentration region is positioned in a range of a depth of 2 μm, or less, from the second main surface.

Thus, the first high concentration region can be formed shallowly and, therefore, the thickness of the semiconductor device can be made thinner.

In the above described other aspect, a trench for a gate is preferably created in the first main surface of the semiconductor substrate, in that a gate electrode of the insulating gate type field effect transistor portion is filled in the trench for a gate and an upper surface of the gate electrode protrudes from the trench for a gate.

Thus, the present invention is preferably applicable to a trench MOS gate-type element.

In the above described other aspect, a trench for a gate is preferably created in the first main surface of the semiconductor substrate, a gate electrode of the insulating gate type field effect transistor portion is filled in the trench for a gate and an upper surface of the gate electrode is shifted not toward the first main surface but, rather, toward the second main surface side.

Thus, the present invention is preferably applicable to a trench MOS gate-type element.

In the above described other aspect, a source side electrode electrically connected to the source diffusion region of the insulating gate type field effect transistor portion is preferably further provided on said first main surface side.

Thereby, the potential of the source diffusion region can be adjusted via the source side electrode.

In the above described other aspect, the semiconductor substrate preferably has a trench for a source side electrode in the first main surface and a conductive layer electrically connected to the source side electrode is filled in the trench for a source side electrode.

Thus, a trench filled in with a conductive layer for the source potential is provided and, thereby, the effective gate width can be reduced so that an effect of suppression of the saturation current is obtained. In addition, because of the effect of the reduction of the saturation current, an arbitrary current can be held for a longer period of time than in the prior art when the device switches in the no-load condition. That is to say, there is an effect of suppression of the saturation current of the device and of an increase of withstanding capacity against breakdown. Furthermore, oscillation at the time of switching in the no-load condition can be suppressed.

In the above described other aspect, a plurality of trenches of the same type as the trench for a source side electrode is preferably provided and each piece of the conductive layer that fills in the plurality of trenches for a source side electrode is integrally formed of a single layer.

Thereby, it becomes possible to fill in, integrally, a plurality of trenches for a source side electrode with a single layer.

In the above described other aspect, the source side electrode is preferably formed in the first main surface, to which no trenches are provided, and a second high concentration region of the second conductive type is provided to the first main surface, to which no trenches are provided, so as to be electrically connected to the source side electrode.

Thus, a wide portion to which no trenches are provided can be secured and, thereby, the effective gate width can be reduced.

A manufacturing method for a semiconductor device according to the present invention is provided with the following steps.

First, a semiconductor substrate of a first conductive type having a first main surface and a second main surface that are opposed to each other is prepared. Then, a body region of a second conductive type is formed in the first main surface of the semiconductor substrate. Then, a source diffusion region of the first conductive type is formed in the first main surface within the body region. Then, a gate electrode is formed so as to be opposed to, via a gate insulating film, the body region sandwiched between a region of the first conductive type of the semiconductor substrate, which becomes a drain diffusion region, and the source diffusion region. Then, the thickness of said semiconductor substrate is made to be no less than 50 μm and no greater than 250 μm by removing the second main surface of the drift layer (drain diffusion region) after the formation of an insulating gate type field effect transistor portion having the drain diffusion region, the source diffusion region and the gate electrode.

In accordance with the manufacturing method for a semiconductor device according to the present invention, the semiconductor substrate can be made thinner through polishing.

In addition, since the thickness of the semiconductor substrate is thinner than in the prior art, the resistance component in the thickness direction lowered so that the lowering of the ON voltage (lowering of $R_{ON}$) can be implemented.

In addition, the thickness of the semiconductor substrate is no less than 50 μm and no greater than 250 μm and the device is provided with an insulating gate type field effect transistor structure that increases the withstanding capacity against breakdown and, therefore, the withstanding capacity against breakdown at the time of device operation can be secured and loss can be reduced.

In the above described aspect, the step of forming an impurity diffusion region of the second conductive type in the second main surface of the semiconductor substrate after the removal of the second main surface is, preferably, further provided.

Thereby, the impurity diffusion region can be formed without undergoing a heat treatment applied during the process and, therefore, the impurity diffusion region can be formed shallowly vis-à-vis the second main surface. Thereby, the semiconductor substrate can be made thinner.

In the above described aspect, the impurity diffusion region is preferably formed through ion implantation.

Thereby, the impurity diffusion region can be formed under effective control.

In the above described aspect, the step of forming a high concentration region of the first conductive type having an impurity concentration higher than that of the drain diffusion region in the second main surface from which the drain diffusion region is removed by polishing is preferably further provided. The impurity diffusion region is formed in the second main surface so as to form, together with the high concentration region, a pn junction. The high concentration region has an impurity concentration peak of a concentration, or less, of an impurity concentration peak of the impurity diffusion region.

Thereby, the main junction leak characteristics are reduced, the withstanding voltage rises and the tail current of the $I_C$ waveform decreases at the time of turning off so that switching loss $E_{OFF}$ is reduced. In addition, there is an effect of the restriction of change in $E_{OFF}$ due to increase in $V_{CE}$.

In the above described aspect, the high concentration region is preferably formed so as to be positioned in a range of a depth of no greater than 2 μm from the second main surface.

Thus, the high concentration region can be shallowly formed and, therefore, the thickness of the semiconductor substrate can be made thinner.

In the above described aspect, the impurity diffusion region is preferably formed so that the impurity activation ratio becomes no greater than 50%.

Thereby, negative effects on device characteristics due to fluctuations in process conditions can be prevented.

In the above described aspect, the step of creating a trench for a gate in the first main surface of the semiconductor substrate is preferably further provided and the gate electrode is formed so as to be filled in the trench for a gate.

Thus, the present invention is preferably applicable to a trench MOS gate-type element.

In the above described aspect, the gate electrode is preferably formed so that an upper surface thereof protrudes from the trench for a gate.

Thus, the present invention is preferably applicable to a trench MOS gate-type element.

In the above described aspect, the gate electrode is preferably formed so that an upper surface thereof is shifted not toward the first main surface but, rather, toward the second main surface side.

Thus, the present invention is preferably applicable to a trench MOS gate-type element.

In the above described aspect, the step of forming a source side electrode electrically connected to the source diffusion region is preferably further provided on the first main surface side.

Thereby, the potential of the source diffusion region can be adjusted via the source side electrode.

In the above described aspect, the step of creating a trench for a source side electrode in said first main surface of said semiconductor substrate is preferably further provided and a conductive layer electrically connected to the source side electrode is formed so as to fill in the trench for a source side electrode.

Thus, a trench filled in with a conductive layer for the source potential is provided and, thereby, the effective gate width can be reduced so that an effect of suppression of the saturation current is obtained. In addition, because of the effect of the reduction of the saturation current, an arbitrary current can be held for a longer period of time than in the prior art when the device switches in the no-load condition. That is to say, there is an effect of suppression of the saturation current of the device and of an increase of withstanding capacity against breakdown. Furthermore, oscillation at the time of switching in the no-load condition can be suppressed.

In the above described aspect, a plurality of trenches of the same type as the trench for a source side electrode is preferably created and a conductive layer for the electrode of the same type as the source side electrode is formed in the first main surface and after that is patterned so as to fill in the plurality of trenches for the source side electrode and, thereby, each piece of the conductive layer that fills in the plurality of trenches for the source side electrode is integrally formed of a single layer.

Thereby, it becomes possibly to integrally fill in a plurality of trenches for the source side electrode with a single layer.

BRIEF DESCRIPTION OF THE DRAWINGS

FIG. 28 is a schematic cross sectional view along line XXVIII—XXVIII in FIG. 27;

BEST MODE FOR CARRYING OUT THE INVENTION

In the following, the embodiments of the present invention are described in reference to the drawings.

(Embodiment 1)

Figure 1:
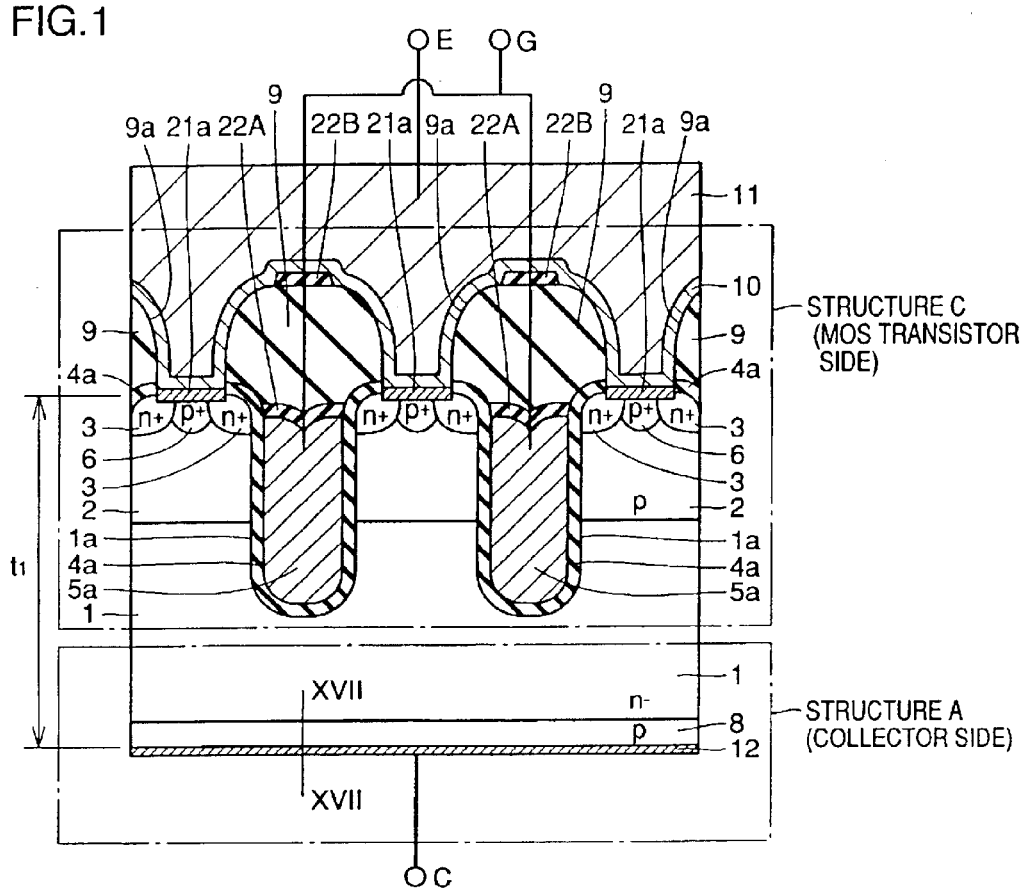
FIG. 1 is a cross sectional view schematically showing the configuration of a semiconductor device according to an embodiment 1 of the present invention.
Figure 2:
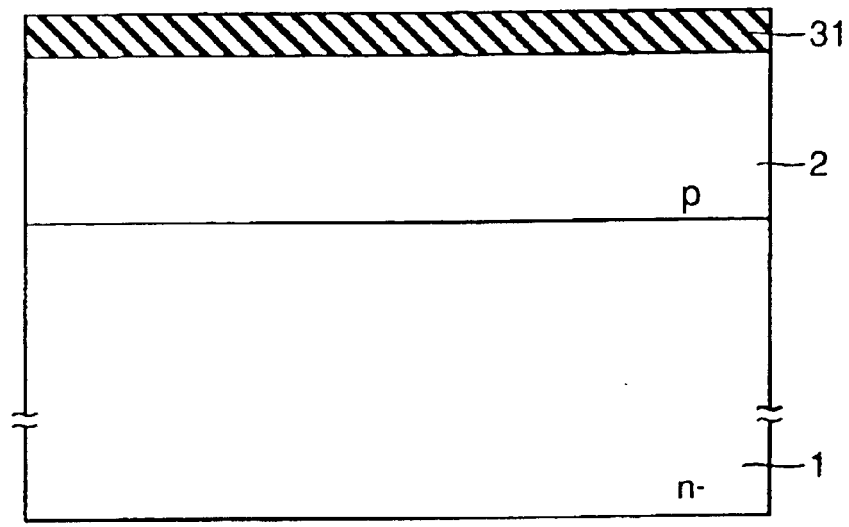
FIGS. 2 to 11 are schematic cross sectional views showing the steps, in order, of a manufacturing method for the semiconductor device according to the embodiment 1 of the present invention.

FIG. 1 is a schematic cross sectional view showing the configuration of a semiconductor device according to the embodiment 1 of the present invention. In reference to FIG. 1, a semiconductor device of the present embodiment is a trench-type IGBT formed in a semiconductor substrate having a thickness $t_1$ of, for example, 50 μm to 250 μm. An n⁻ silicon substrate 1 has a concentration of, for example, approximately $1 \times 10^{14}$ cm⁻³. A p-type body region 2 made of a p-type semiconductor, of which the concentration is approximately $1 \times 10^{15}$ cm⁻³ to $1 \times 10^{18}$ cm⁻³ and of which the diffusion depth from the first main surface is approximately 1.0 μm to 4.0 μm, is formed on the first main surface side of this n⁻ silicon substrate 1. An n-type emitter region 3 made of an n-type semiconductor, of which the concentration is, for example, $1 \times 10^{18}$ cm⁻³ to $1 \times 10^{20}$ cm⁻³ and of which the diffusion depth from the first main surface is approximately 0.3 μm to 2.0 μm, is formed in the first main surface within p-type body region 2. A p⁺ impurity diffusion region 6 for forming a low resistance contact with p-type body region 2 is formed in the first main surface adjoining this n-type emitter region 3, of which the diffusion depth from the first main surface is no greater than the depth of n-type emitter region 3, so as to have the concentration of, for example, $1 \times 10^{18}$ cm⁻³ to $1 \times 10^{20}$ cm⁻³.

A trench 1a for a gate that penetrates n-type emitter region 3 and p-type body region 2 and that reaches to n⁻ silicon substrate 1 is created in the first main surface. This trench 1a for a gate has a depth of, for example, 3 μm to 10 μm from the first main surface and the pitch of trenches 1a for gates is, for example, 2.0 μm to 6.0 μm. A gate insulating film 4a is formed on the inner surface of this trench 1a for a gate. This gate insulating film 4a has a layered structure with a silicon oxide film formed through a CVD method and a silicon oxide film formed through a thermal oxidation method or has a layered structure with a silicon nitride oxide film wherein nitrogen is segregated in the interface of $Si/SiO_2$ for the object of improving, for example, characteristics, reliability and device yield of the gate insulating film.

A polycrystal silicon into which phosphorus, for example, is introduced so as to have a high concentration and gate electrode 5a made of metal material, such as $W/TiS_2$, is formed so as to fill in trench 1a for a gate. Here, a silicide layer (for example, $TiSi_2$, CoSi, and the like) may be formed on the surface of gate electrode 5a in order to reduce the resistance of gate electrode 5a. An insulating film 22A made of, for example, a silicon oxide film is formed on the upper surface of this gate electrode 5a. In addition, gate electrode 5a is electrically connected to a control electrode that gives gate potential G.

Thus, trench 1a for a gate, gate insulating film 4a and a gate electrode 5a form a gate trench. In addition, n⁻ silicon substrate 1, n-type emitter region 3 and gate electrode 5a form an insulating gate type field effect transistor portion (here a MOS transistor) is formed having n⁻ silicon substrate 1 as a drain and having n-type emitter region 3 as a source. A plurality of such MOS transistor portions is formed in the first main surface.

An insulating film 9 made of silicate glass and insulating film 22B made of silicon oxide film formed through a CVD method are, for example, formed in the first main surface and contact holes 9a that reach to the first main surface are provided in these insulating films 9 and 22B. A barrier metal layer 10 is formed along the inner surface of contact holes 9a and along the top surface of insulating films 9 and 22B. A silicide layer 21a is formed in a portion wherein this barrier metal layer 10 and the semiconductor substrate contact each other. An emitter electrode 11 that provides emitter potential E is electrically connected to n-type emitter region 3 and p⁺ impurity diffusion region 6 via this barrier metal layer 10 and silicide layer 21a.

In addition, a p-type collector region 8 is formed on the second main surface side of n⁻ silicon substrate 1 and a collector electrode 12 that provides the collector potential C is electrically connected to this p-type collector region 8. The material of this collector electrode 12 is, for example, an aluminum compound.

In the present embodiment, the thickness ti of the semiconductor substrate is no less than 50 μm and no greater than 250 μm.

In the semiconductor device of the present embodiment, gate potential G of the control electrode is a control signal in a pulse form that is set at −15V during the off condition and at +15V during the on condition in reference to the emitter potential at the time of, for example, inverter connection and collector potential C of collector electrode 12 is set at a voltage approximately between power supply voltage and saturation voltage in accordance with gate potential G.

Next, a manufacturing method of the present embodiment is described.

FIGS. 2 to 11 are schematic cross sectional views showing the steps, in order, of a manufacturing method for a semiconductor device according to the embodiment 1 of the present invention. First, in reference to FIG. 2, a p-type body region 2 of which the peak concentration is, for example, $1\times10^{15}$ cm$^{-3}$ to $1\times10^{18}$ cm$^{-3}$ and of which the diffusion depth from the first main surface is 1.0 μm to 4.0 μm is formed in a substrate surface made of a thick n$^-$ silicon substrate 1. Next, a mask layer 31 is formed on the first main surface.

Figure 3:
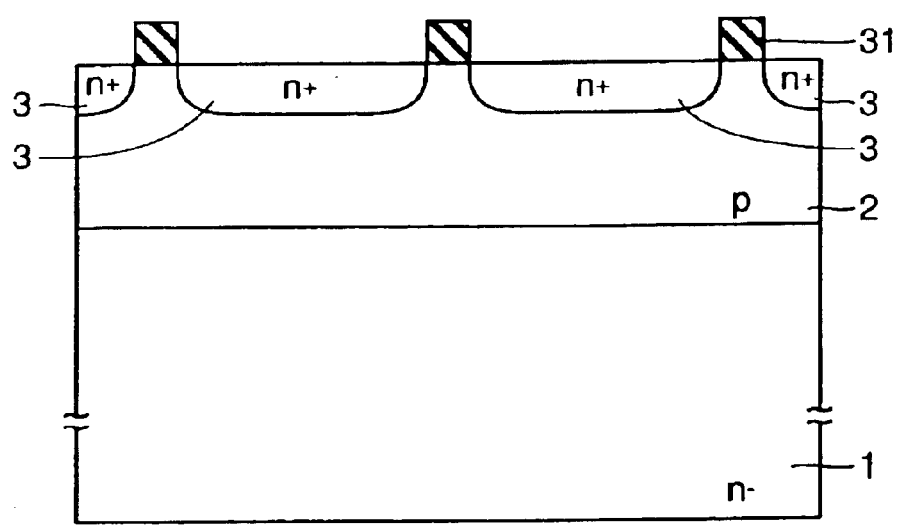

In reference to FIG. 3, mask layer 31 is patterned. This patterned mask layer 31 is used as a mask so as to carry out, for example, an ion implantation, and the like, and, thereby, an n-type emitter region 3, of which the surface concentration is $1\times10^{18}$ cm$^{-3}$ to $1\times10^{20}$ cm$^{-3}$ and of which the diffusion depth from the first main surface is 0.3 μm to 2.0 μm is formed in the first main surface within p-type body region 2. After this, mask layer 31 is removed.

Figure 4:
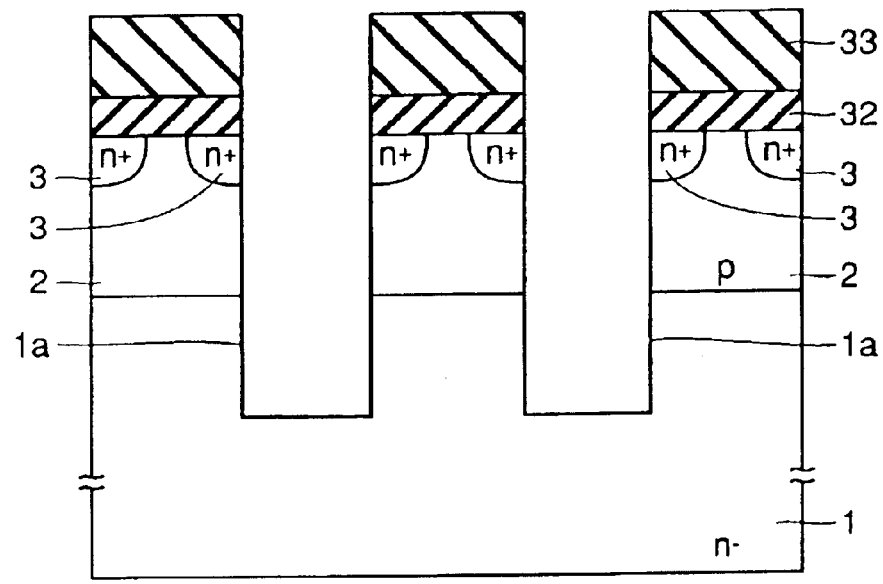

In reference to FIG. 4, a silicon oxide film 32 formed through, for example, thermal oxidization and a silicon oxide film 33 formed through a CVD method are sequentially formed on the first main surface. These silicon oxide films 32 and 33 are patterned by means of conventional photomechanical technology and etching technology. These patterned silicon oxide films, 32 and 33, are used as a mask so as to carry out anisotropic etching on the semiconductor substrate. Thereby, trench 1a for a gate that penetrates n-type emitter region 3 and p-type body region 2 and that reaches to n$^-$ silicon substrate 1 is created.

Figure 5:
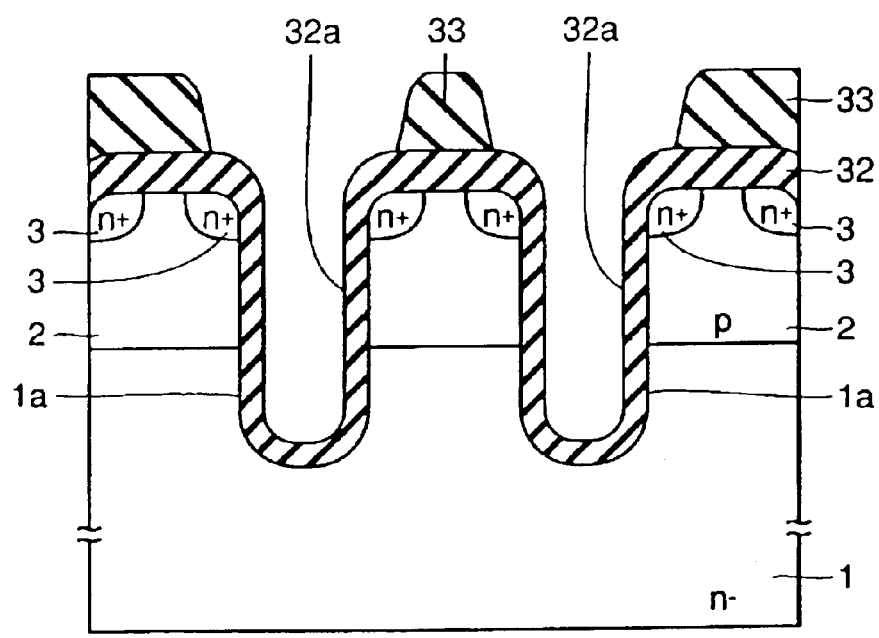

In reference to FIG. 5, processing, such as isotropic plasma etching and sacrificial oxidation, is carried out and, thereby, the opening and the bottom of trench 1a for a gate is rounded and the unevenness of the sidewalls of trench 1a for a gate is flattened. In addition, due to the above described sacrificial oxidation, sacrificial oxidation film 32a is formed on the surface within trench 1a for a gate so as to be integrated to the thermal oxide film 32. Thus, it becomes possible to improve the characteristics of gate insulating film formed on the inner surface of trench 1a for a gate by carrying out isotropic plasma etching and sacrificial oxidation. After this, oxide films 32, 32a and 33 are removed.

Figure 6:
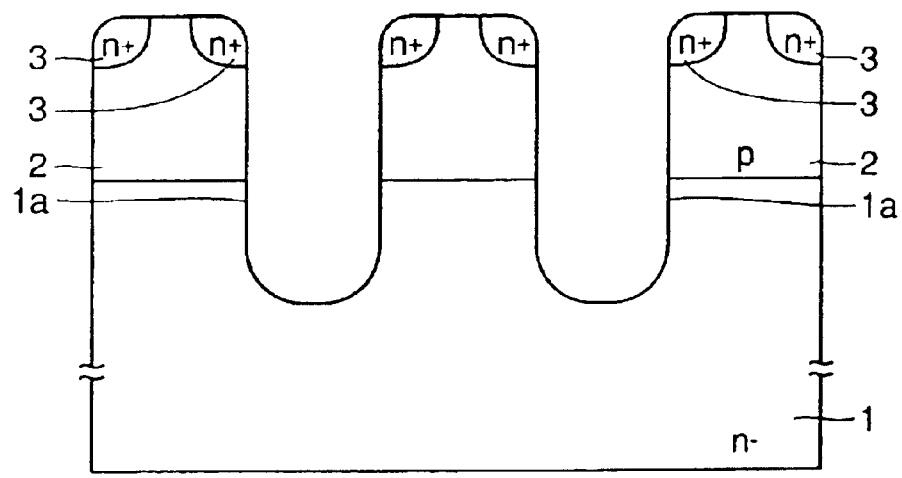

In reference to FIG. 6, through the removal of the above described oxide films, the first main surface of the semiconductor substrate and the inner surface of trench 1a for a gate are exposed.

Figure 7:
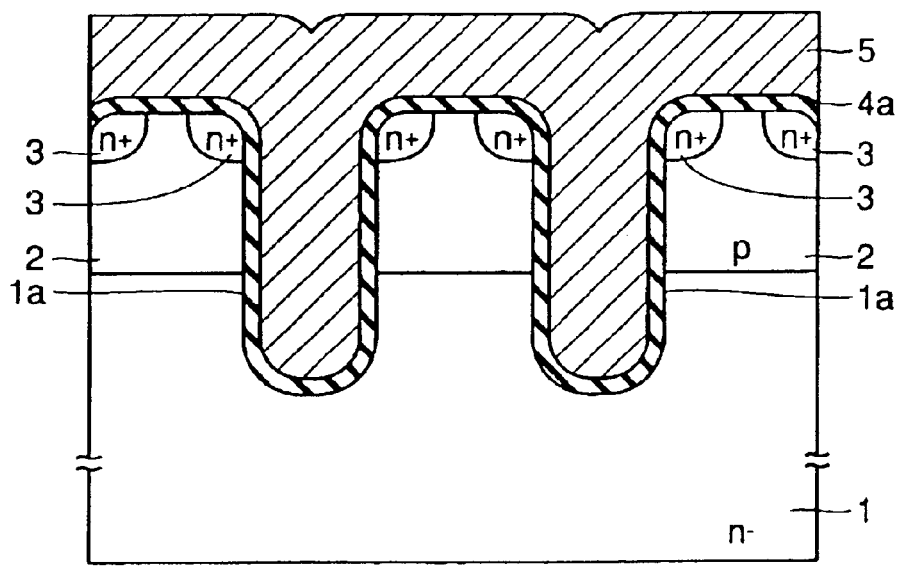

In reference to FIG. 7, a gate insulating film 4a made of, for example, a silicon oxide film is formed along the inner surface of trench 1a for a gate and along the first main surface. A conductive layer 5 made of a polycrystal silicon into which phosphorus, for example, is introduced so as to have a high concentration or a material wherein phosphorus is introduced through ion implantation into a polycrystal silicon, into which impurities are not introduced, or a metal material, such as W (tungsten)/TiSi$_2$ (titanium silicide) is formed over the entirety of the surface so as to fill in trench 1a for a gate.

Here, it is preferable to use, for gate insulating film 4a, a layered structure made of a silicon oxide film formed through a CVD method and a silicon oxide film formed through thermal oxidation or a nitride oxide film wherein nitrogen is segregated in the interface between silicon and silicon oxide for the object of improving the characteristics of the gate insulating film, reliability and device yield.

After this, conductive layer 5 is patterned according to conventional photomechanical technology and etching technology.

Figure 8:
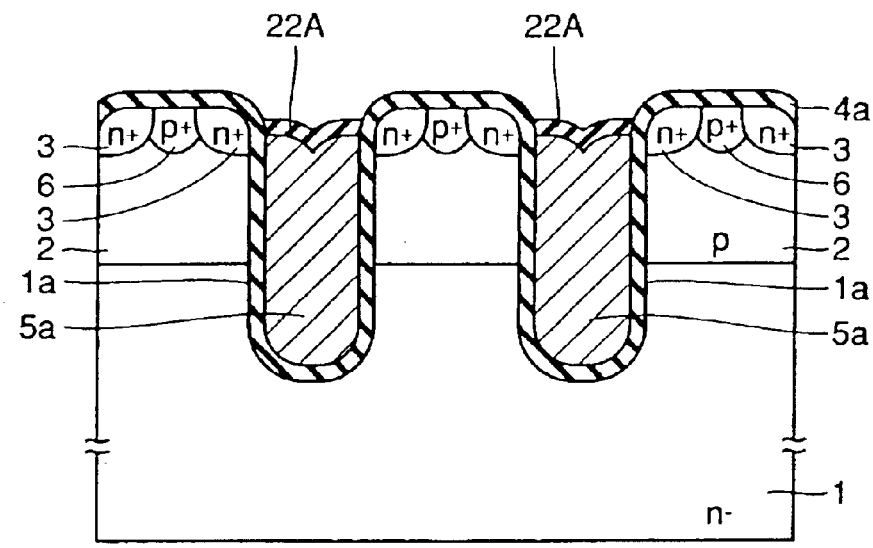

In reference to FIG. 8, the conductive layer is allowed to remain within trench 1a for a gate so as to form gate electrode 5a through this patterning. Here, a silicide layer (for example, TiSi$_2$ or CoSi) may be formed on the surface of gate electrode 5a for the reduction of resistance of gate electrode 5a. After this, the upper surface of gate electrode 5a is oxidized and, thereby, an insulating film 22A made of, for example, a silicon oxide film is formed. After this, a p$^+$ impurity diffusion region 6, of which the surface concentration in the first main surface is, for example, $1.0\times10^{18}$ cm$^{-3}$ to $1.0\times10^{20}$ cm$^{-3}$ and of which the diffusion depth from the first main surface is shallower than that of the n-type emitter region 3, is formed.

Figure 9:
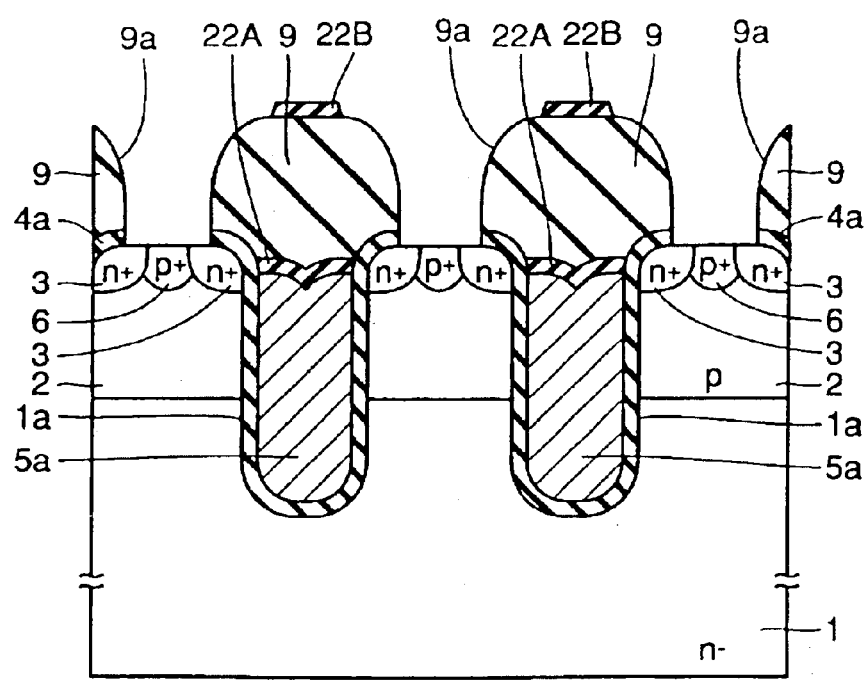

In reference to FIG. 9, an insulating film 9 made of, for example, silicate glass and an insulating film 22B made of silicon oxide film formed by means of a CVD method are sequentially formed in the first main surface. A contact hole 9a is created by means of conventional photomechanical technology and etching technology in these insulating films 9 and 22B.

Figure 10:
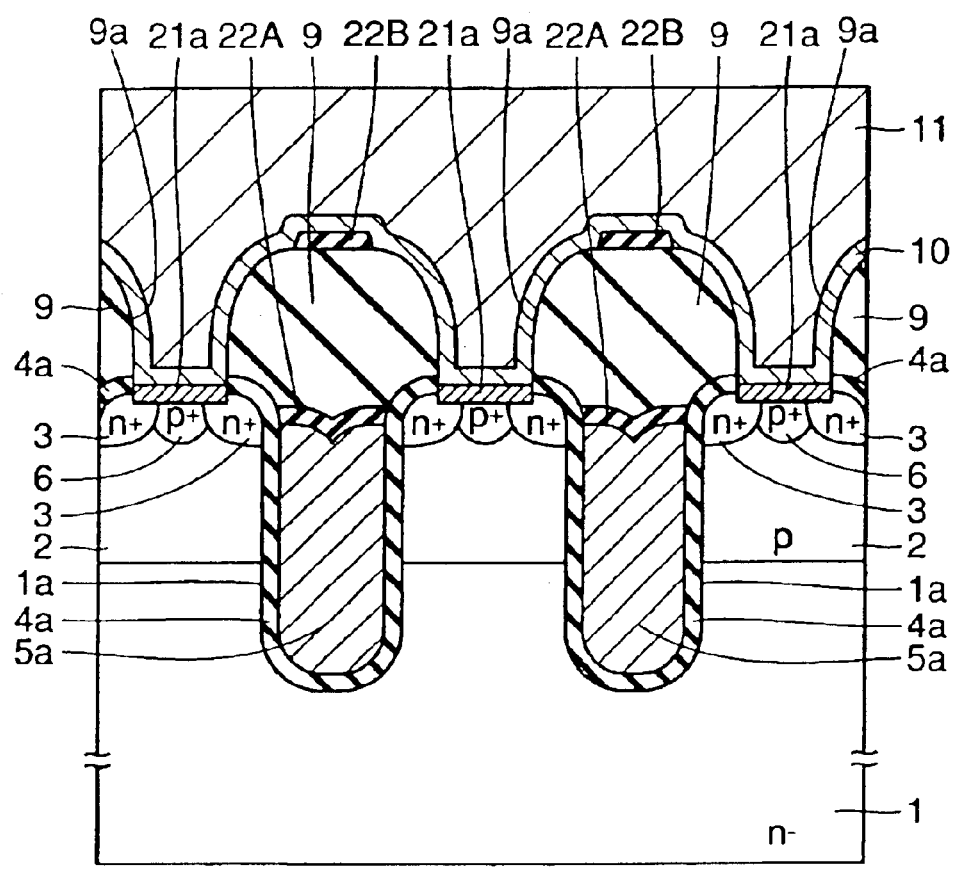

In reference to FIG. 10, a barrier metal layer 10 made of, for example, a metal layer is formed by means of a sputtering method. After this, lamp annealing is carried out so that a silicide layer 21a is formed at a contact portion between barrier metal layer 10 and the semiconductor substrate. After this, an emitter electrode 11 is formed.

Figure 11:
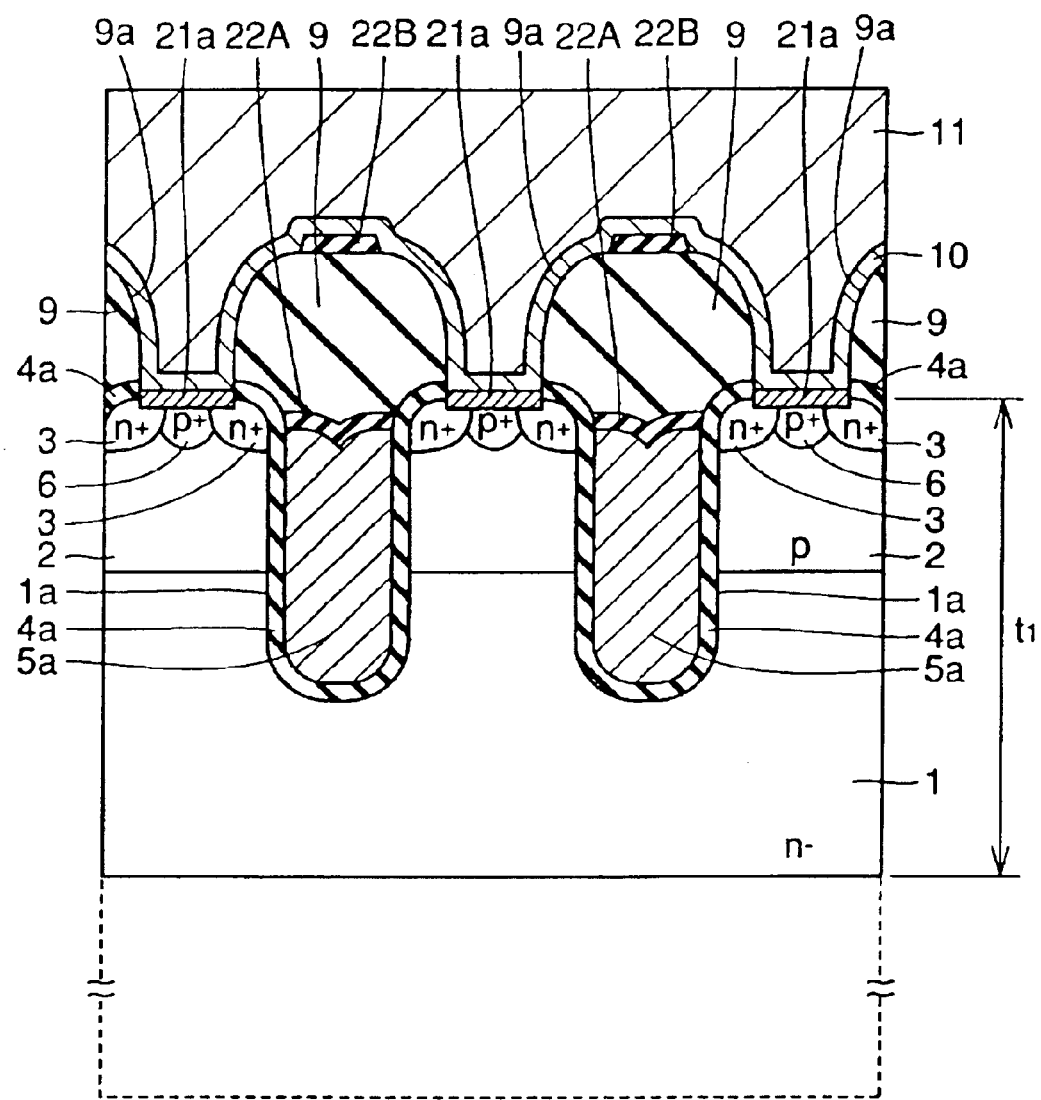

In reference to FIG. 11, n$^-$ drift layer 1 on the second main surface side of the semiconductor substrate is polished. Through this polishing, the thickness $t_1$ of the semiconductor substrate is adjusted to no less than 50 μm and no greater than 250 μm.

A p-type collector region 8 is formed in the second main surface after polishing through diffusion after the implantation of a p-type impurity, for example, by means of an ion implantation method and, in addition, a collector electrode 12 made of, for example, an aluminum compound is formed so as to complete the semiconductor device shown in FIG. 1.

Here, the present embodiment has the step of the polishing of the second main surface of the drift layer (n$^-$ layer 1) after the formation of emitter electrode 11, as shown in FIG. 11. However, as shown in FIG. 9, the thickness of the semiconductor substrate may be reduced to no less than 50 μm and no greater than 250 μm by polishing the second main surface of the drift layer (n$^-$ layer 1) after opening or before opening contact hole 9a.

Figure 75:
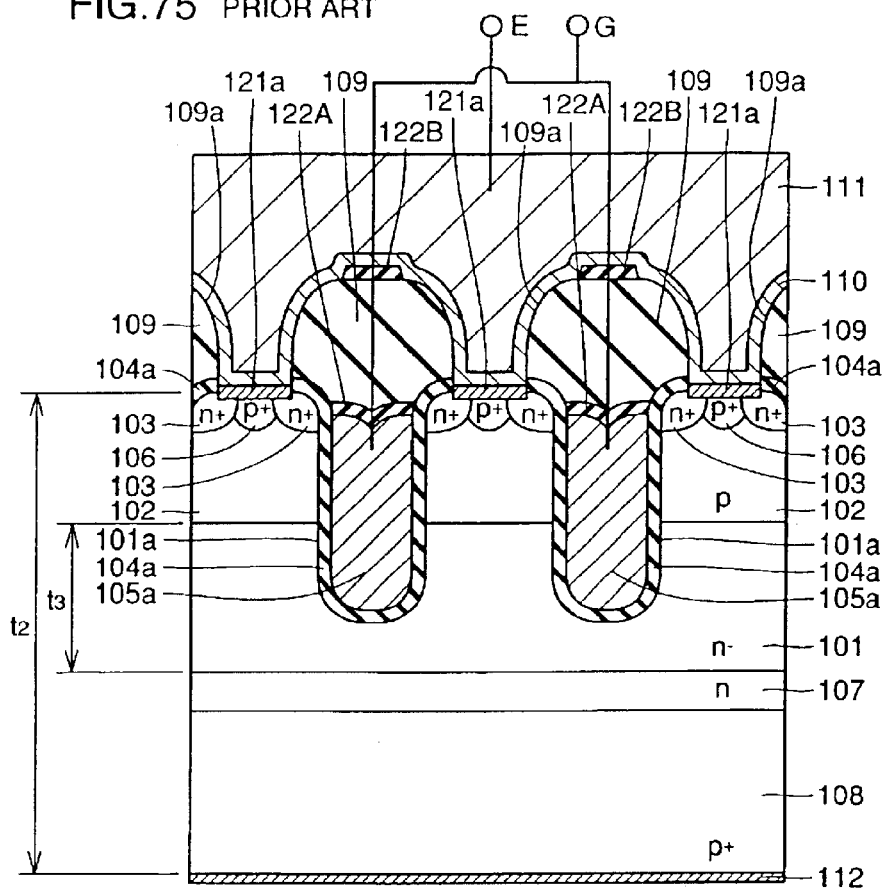
FIG. 75 is a cross sectional view schematically showing the configuration of a semiconductor device according to a prior art.

In addition, thickness $t_1$ of the semiconductor substrate in the present embodiment is greater than thickness $t_3$ of n$^-$ silicon layer 101 according to the prior art shown in FIG. 75.

Next, the reason why the thickness of the semiconductor substrate is made to be no less than 50 μm and no greater than 250 μm in the present embodiment is described.

Figure 12:
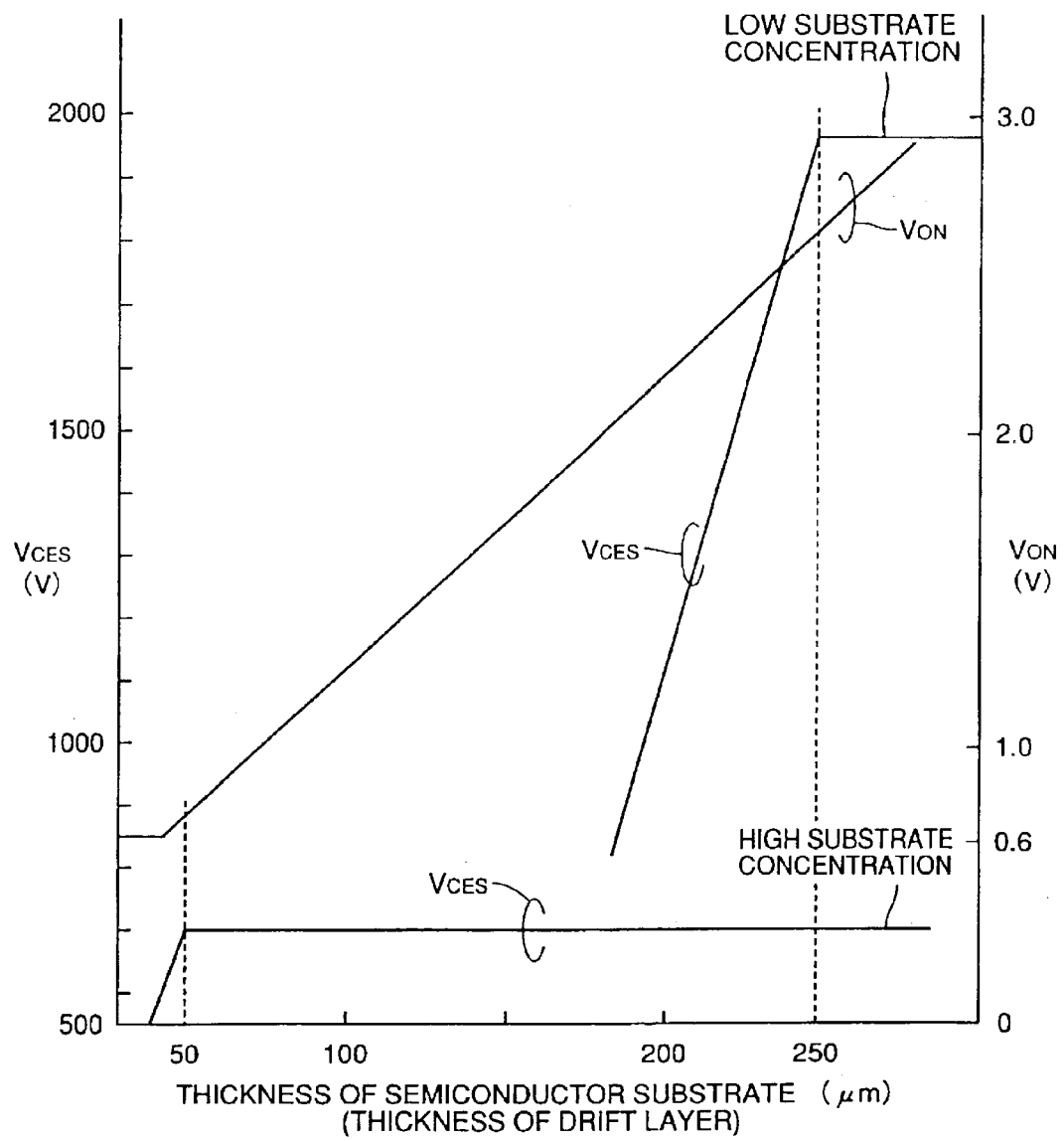
FIG. 12 is a graph showing the relationship between $V_{CES}$ or $V_{ON}$ and the thickness of the semiconductor substrate.

FIG. 12 is a diagram showing the relationship between $V_{CES}$ or $V_{ON}$ and the thickness of the semiconductor substrate. In reference to FIG. 12, in the case that the concentration of the substrate is high, $V_{CES}$ suddenly drops in the case that the thickness is less than 50 μm. Thereby, it becomes difficult to secure the main withstanding voltage at the time of device operation and, therefore, the lower limit value of thickness $t_1$ of the semiconductor substrate is set at 50 μm.

In addition, when thickness $t_1$ of the semiconductor substrate becomes greater than 250 μm, $V_{CES}$ shows an approximately constant value and it is found that increase in the main withstanding voltage is not affected in the case that the concentration of the substrate is low. In addition, in the case that thickness $t_1$ of the semiconductor substrate exceeds 250 μm, the stationary loss ($E_{DC}$) at the time when the IGBT operates suddenly increases. This is described in the following.

Figure 13:
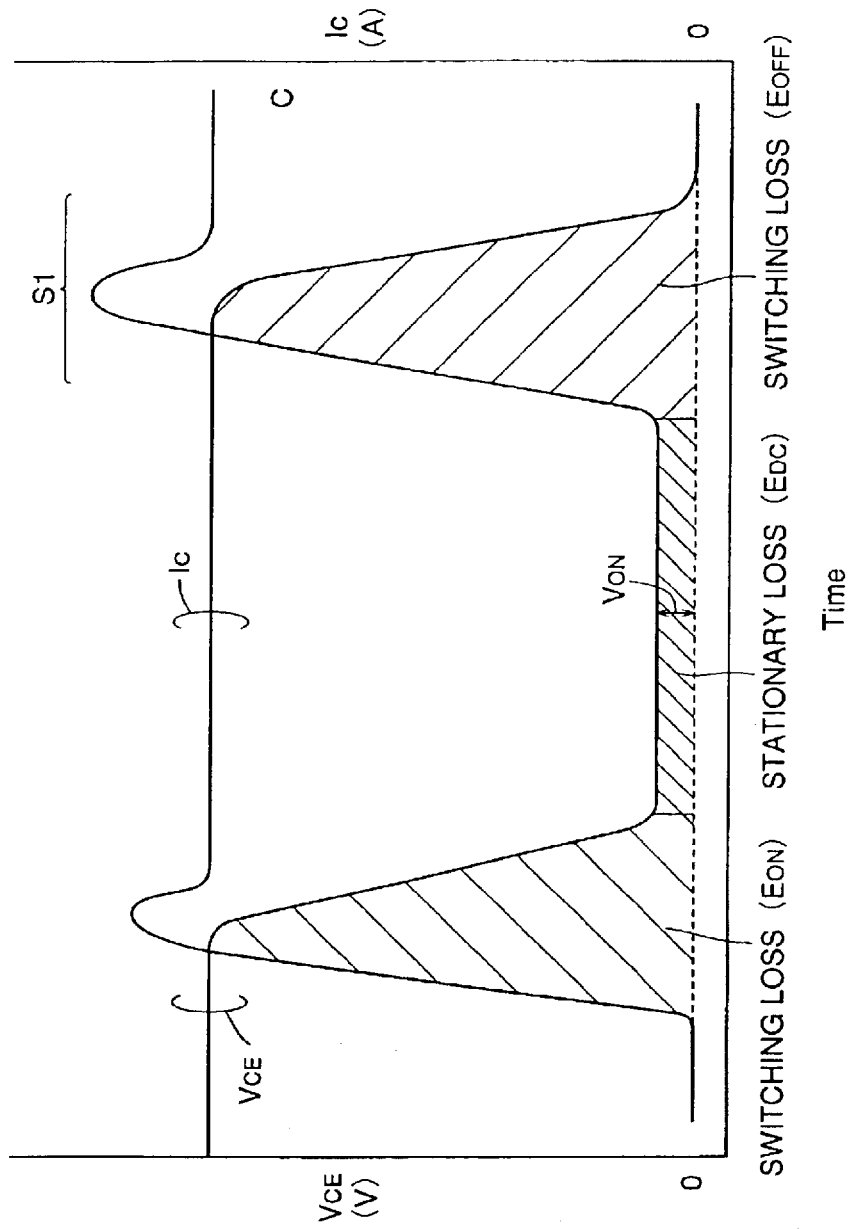
FIG. 13 is a graph showing the relationship between $V_{CE}$ or $I_C$ and time.

FIG. 13 is a diagram showing the relationship between $V_{CE}$ or $I_C$ and time. In reference to FIG. 13, the loss ($E_{total}$) at the time when the power device generally operates (switches) with an inductive load is represented in the hatched region and is represented in the following equation.

$$E_{total}=E_{SW}+E_{DC}$$

Here, $E_{DC}$ is a loss (stationary loss) when the device is in the ON condition. In addition, ESW is a loss when the device turns ON and OFF and is represented in the following equation.

$$E_{SW}=E_{ON}+E_{OFF}$$

wherein $E_{ON}$ is the switching loss when the device turns ON and $E_{OFF}$ is the switching loss when the device turns OFF.

Figure 14:
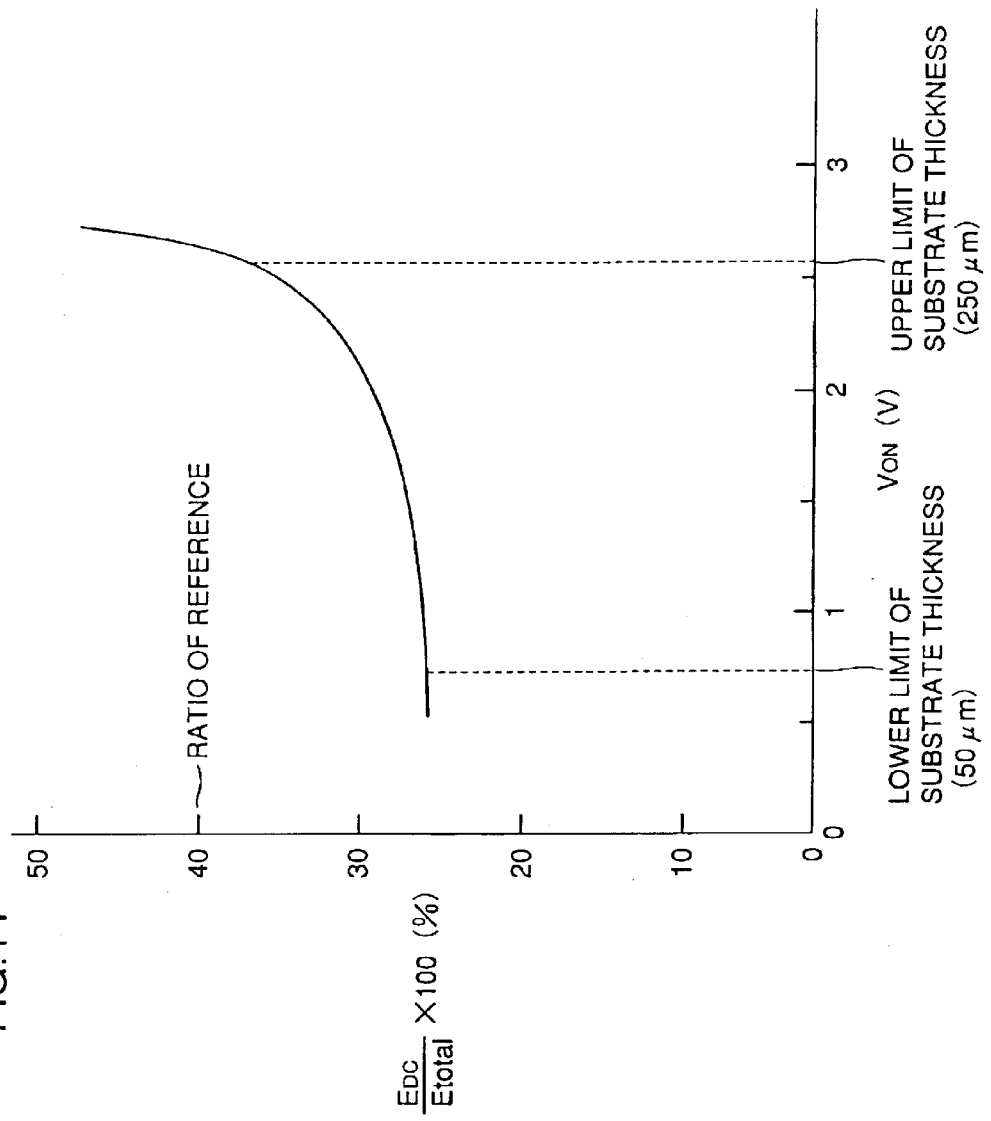
FIG. 14 is a diagram showing the relationship between loss and $V_{ON}$.

Stationary loss $E_{DC}$ in the above equation is affected by $V_{ON}$ and increases as $V_{ON}$ becomes higher. This stationary loss $E_{DC}$ usually occupies approximately 20% to 30% of the total loss $E_{total}$. However, when the thickness of the semiconductor substrate becomes great and $V_{ON}$ increases, the ratio occupied by $E_{DC}$ in $E_{total}$ increases. In particular, the ratio occupied by $E_{DC}$ in $E_{total}$ suddenly increases in the vicinity of $V_{ON}$=2.6V and the device is negatively affected. Here, when $V_{ON}$ is 2.6V, thickness $t_1$ of the semiconductor substrate is found, from FIG. 12, to be approximately 250 μm. This can also be seen from the sudden increase of stationery loss $E_{DC}$ relative to the total loss $E_{total}$ when the thickness of the semiconductor substrate exceeds 250 μm in FIG. 14.

Thus, the upper limit of thickness of the semiconductor substrate is set at 250 μm in order to lower $V_{ON}$ and, thereby, to reduce loss $E_{total}$.

As described above, thickness $t_1$ of the semiconductor device is set at no less than 50 μm and no greater than 250 μm as in the present embodiment and, thereby, an effect can be obtained wherein the freedom of the thickness of the semiconductor substrate increases in comparison with the prior art without negatively affecting the device characteristics, such as ON voltage ($V_{ON}$), main withstanding voltage ($V_{CES}$) or loss ($E_{total}$).

(Embodiment 2)

In reference to FIG. 1, the impurity activation ratio of p-type collector region 8 is no greater than 50% in the present embodiment.

Here, the parts of the configuration other than this are approximately the same as in the configuration of the above described the embodiment 1, of which the descriptions are omitted.

In addition, the manufacturing method of the present embodiment is approximately the same as the manufacturing method of the above described the embodiment 1, of which the descriptions are omitted.

In the present embodiment, p-type collector region 8 is formed by means of, for example, ion implantation after the formation of respective regions 1, 2, 3 and 6 shown in FIG. 1. Therefore, p-type collector region 8 does not undergo a heat treatment of high temperature for diffusing the impurities in respective regions 1, 2, 3 and 6. Therefore, the impurity activation ratio of p-type collector region 8 of the present embodiment can be can be held at the low level of no greater than 50%.

Figure 76:
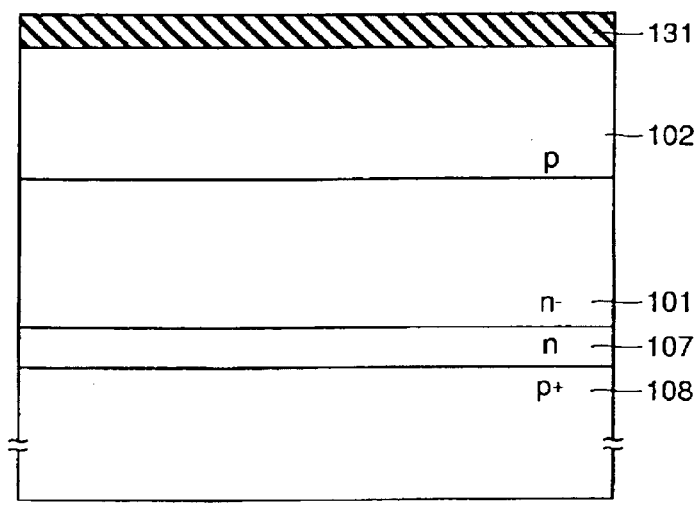
FIGS. 76 to 85 are schematic cross sectional views showing the steps in the order of a manufacturing method for the semiconductor device according to the prior art.
Figure 77:
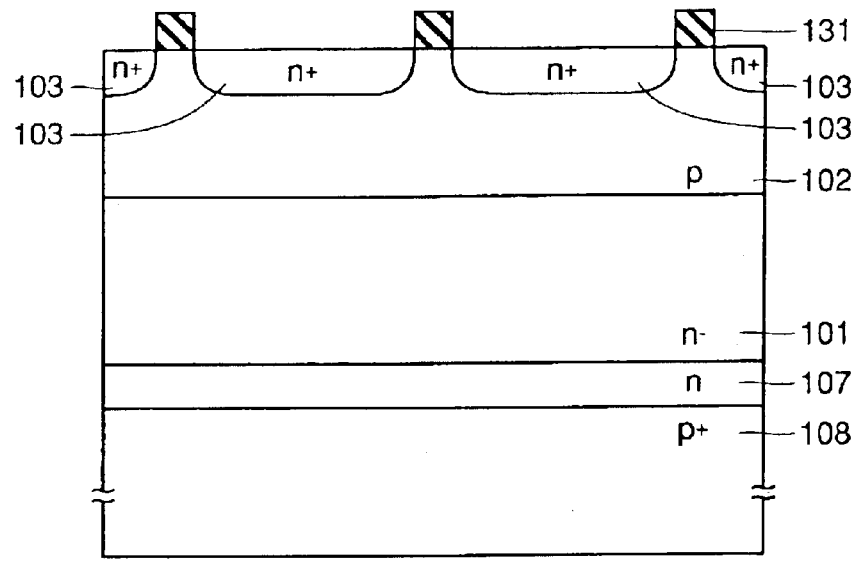
Figure 78:
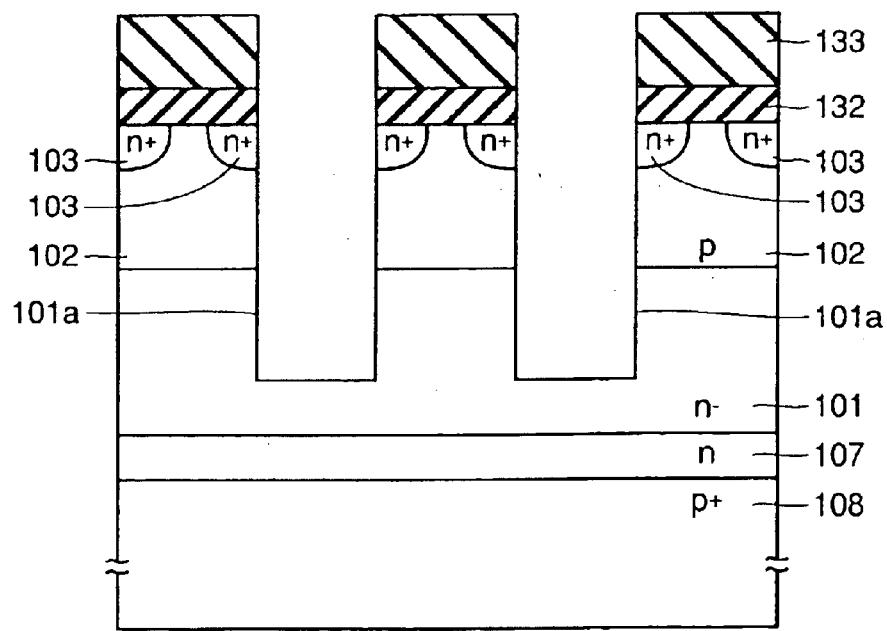
Figure 79:
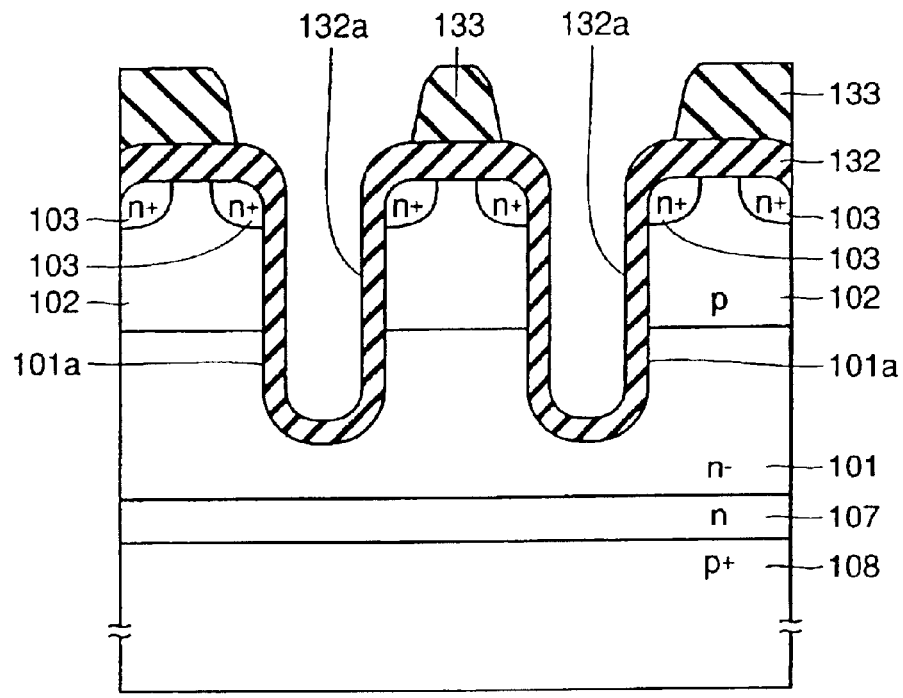
Figure 80:
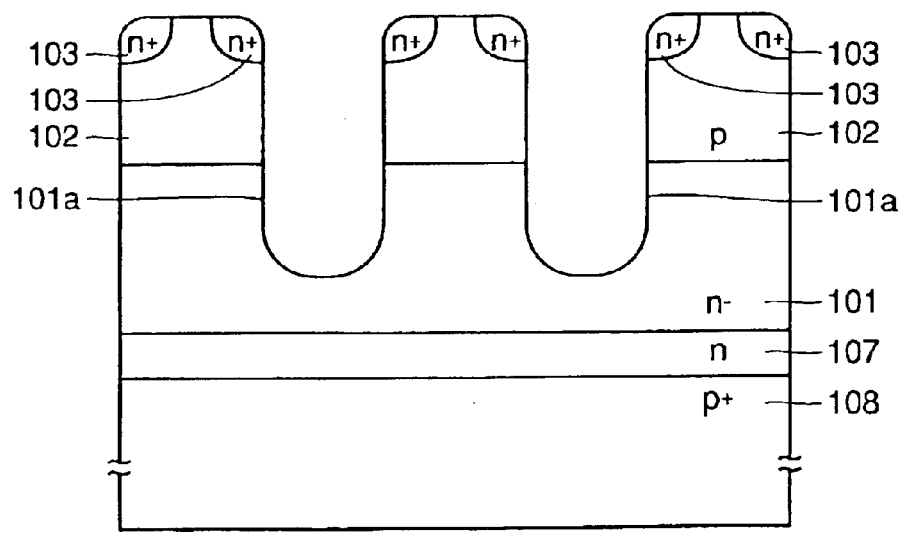
Figure 81:
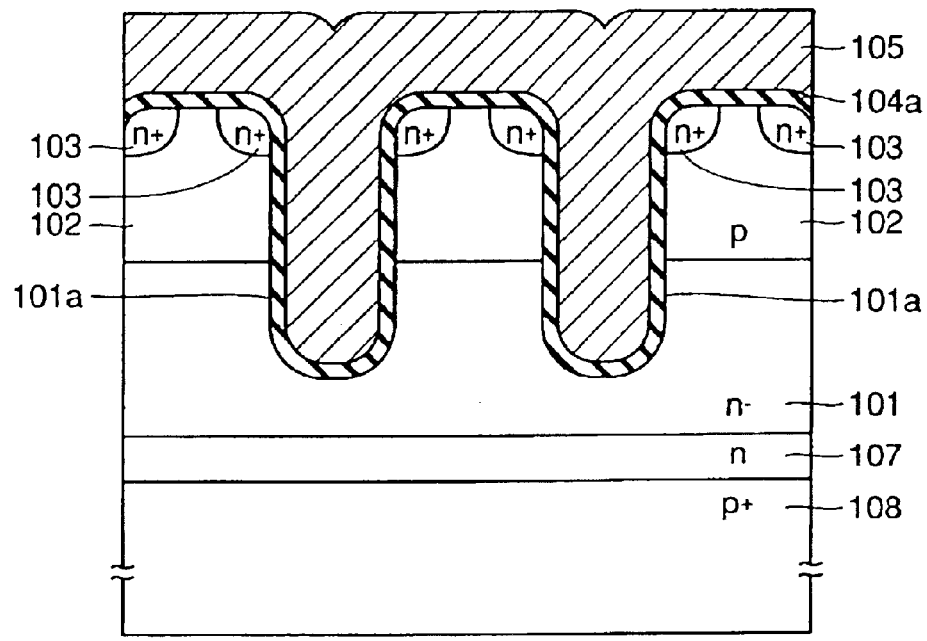
Figure 82:
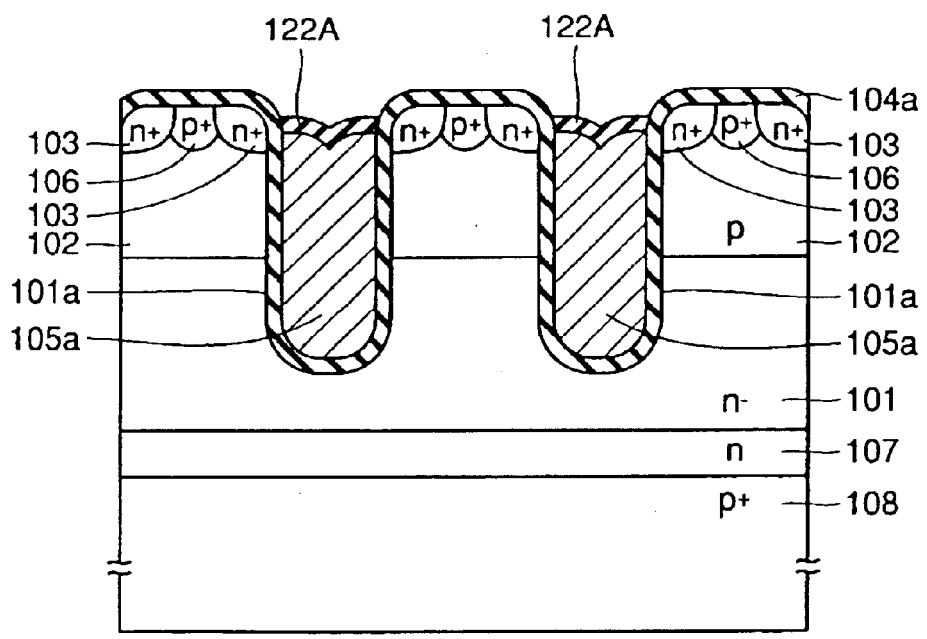
Figure 83:
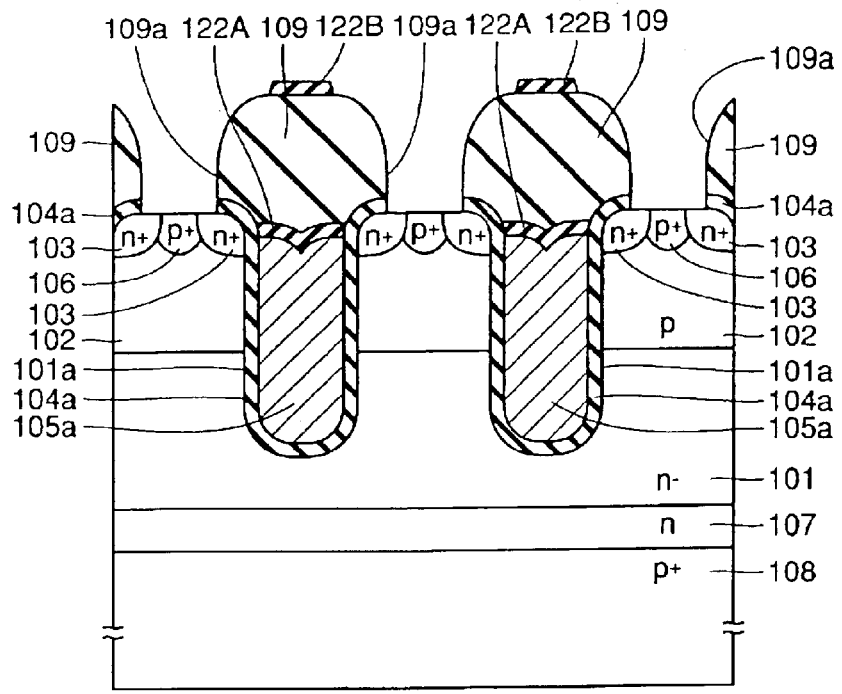
Figure 84:
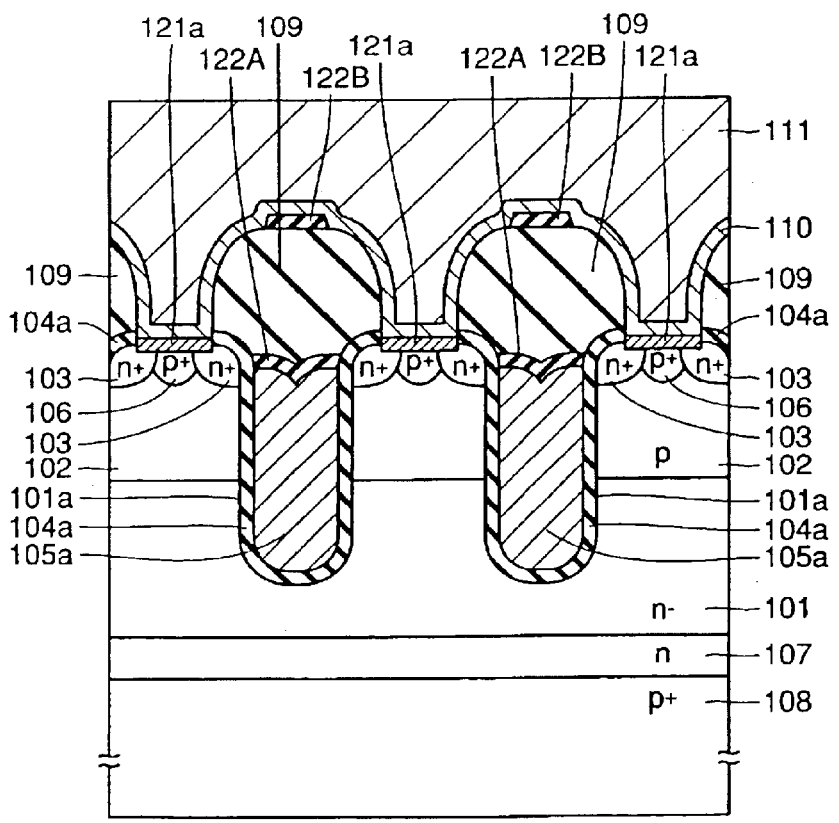
Figure 85:
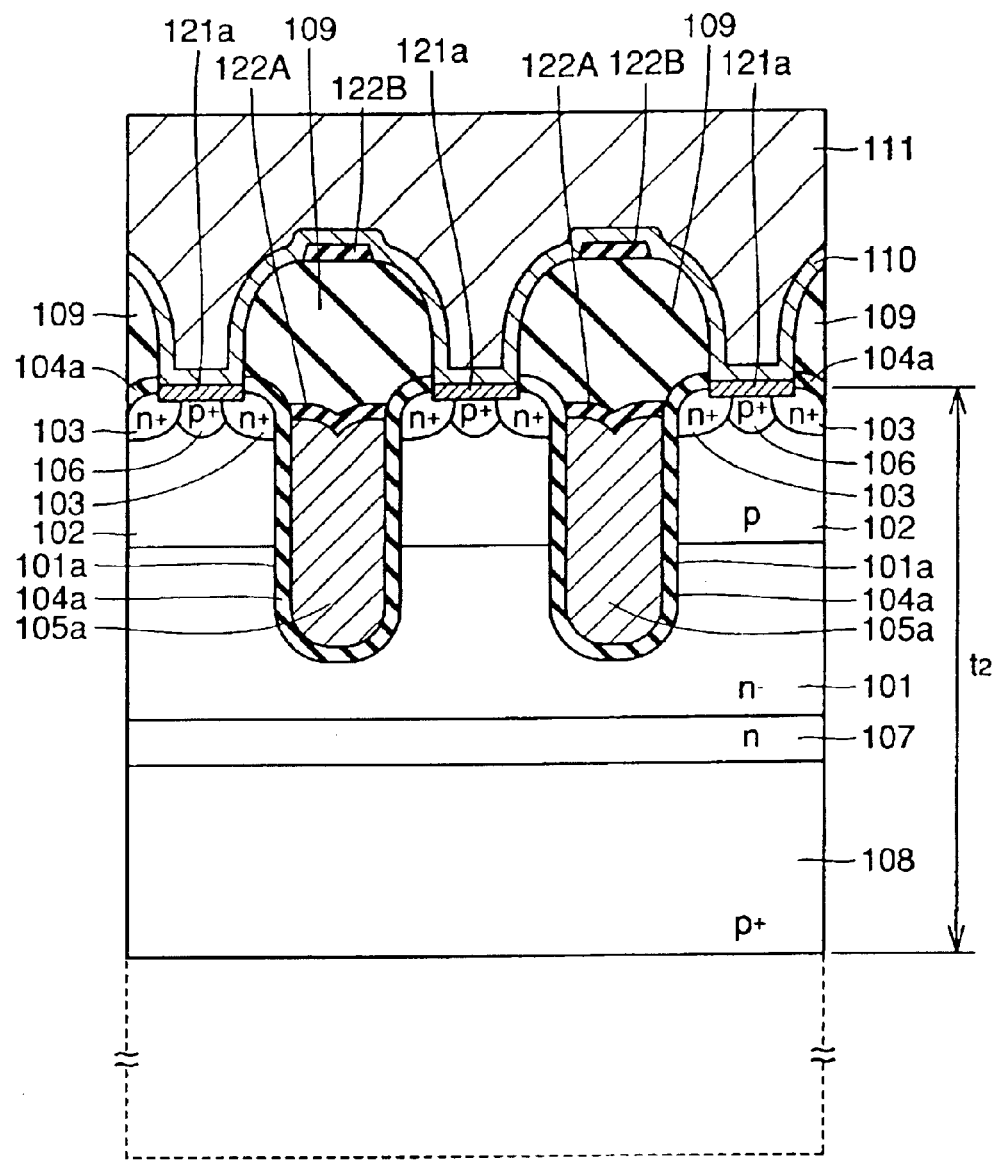

In contrast to this, p-type collector region 108 already exists from the first process, as shown in FIG. 76, of the conventional manufacturing method shown in FIGS. 76 to 85. Therefore, p-type collector region 108 undergoes all of the heat treatments of the manufacturing process. Accordingly, conventional p-type collector region 108 has approximately 100% of the impurity activation ratio and it is difficult to have an activation ratio lower than this.

Figure 15:
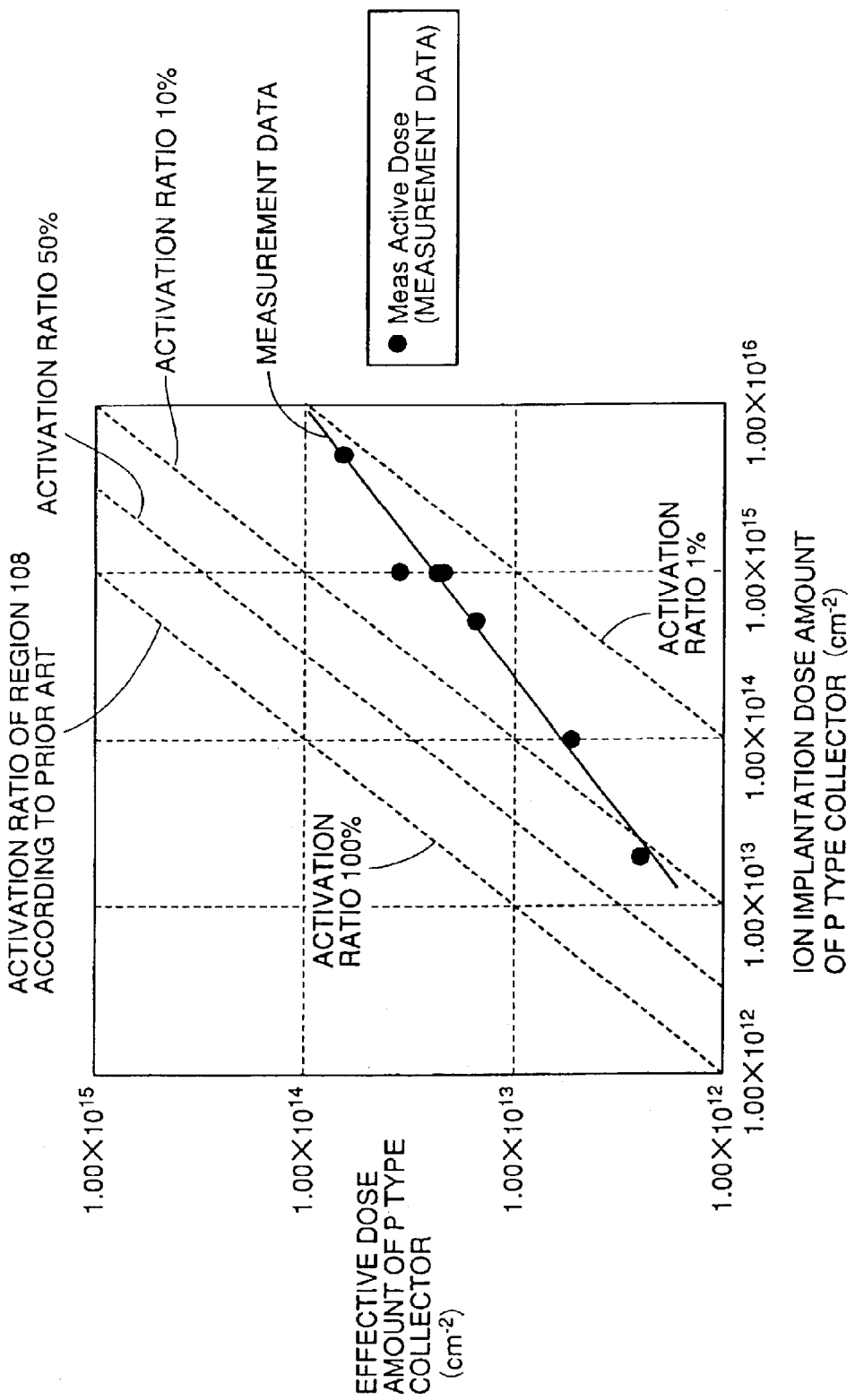
FIG. 15 is a graph showing the relationship between the effective dose amount of the p-type collector and the ion implantation dose amount of the p-type collector.

As described above, the impurity activation ratio of p-type collector region 8 of the present embodiment differs from the impurity activation ratio (100%) of conventional p-type collector region 108 and can be made to be no greater than 50% as shown in FIG. 15.

Here, FIG. 15 is a graph showing the relationship between the actual ion implantation amount (lateral axis) and the effective dose amount (longitudinal axis) of the p-type collector layer in the configuration of FIG. 1. In addition, round, black dots in FIG. 15 show measurement data of the impurity activation ratio of p-type collector region 8 in the configuration of FIG. 1 formed through the steps of FIGS. 2 to 11.

Next, the reason why the impurity activation ratio of p-type collector region 8 is made to be no greater than 50% in the present embodiment is described.

Figure 16:
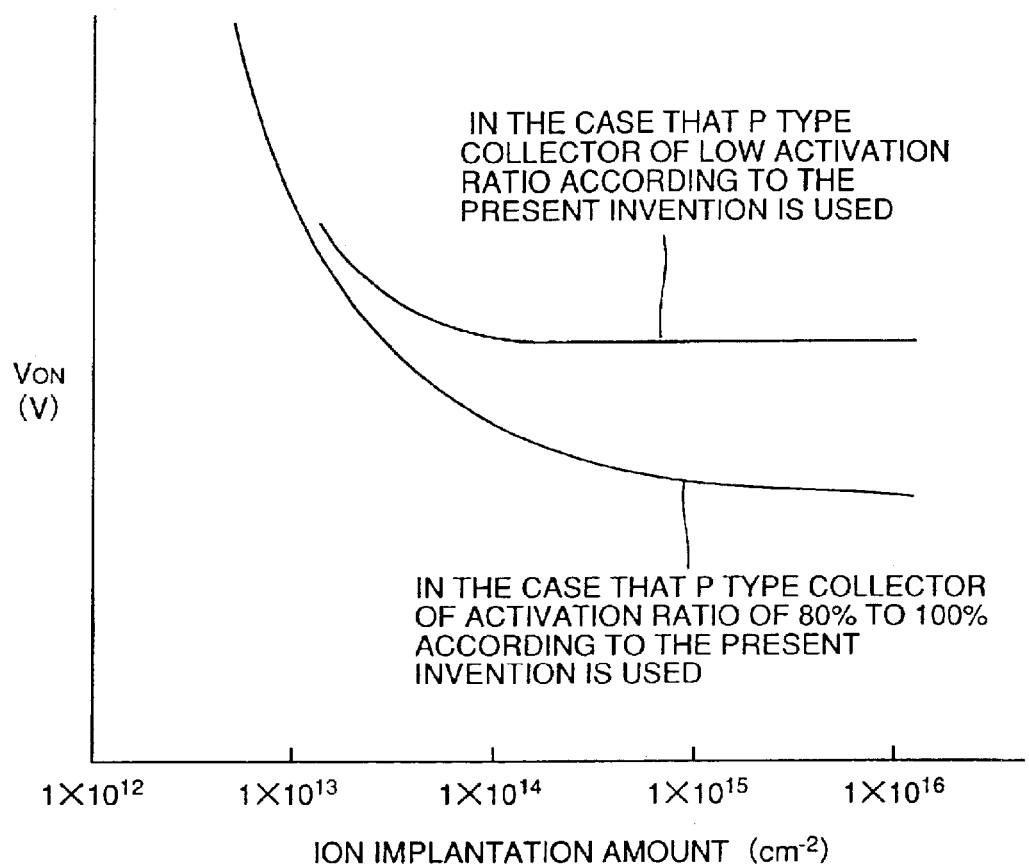
FIG. 16 is a graph showing the relationship between $V_{ON}$ and the ion implantation amount of the p-type collector.

FIG. 16 is a graph showing the relationship between the ion implantation amount (implantation amount at the time of ion implantation) of the p-type collector layer and $V_{ON}$.

In the present embodiment, the impurity activation ratio of p-type collector region 8 is low, such as no greater than 50%, and, therefore, a change in the concentration of p-type collector region 8, formed with respect to the actually set ion implantation amount, can be made small. Thereby, the fluctuation in the concentration of p-type collector region 8 that becomes effective after a heat treatment for the actually set ion implantation amount becomes small. That is to say, the margin, in the case wherein the set value fluctuates, becomes great. Therefore, even when the implantation amount fluctuates at the time of ion implantation, it becomes possible for p-type collector region 8 formed in the semiconductor substrate to implement the concentration at the time of design.

In reference to FIG. 16, the concentration of p-type collector region 8 of the IGBT has an effect on the $V_{ON}$ value. This $V_{ON}$ increases suddenly together with a decrease in the ion implantation amount starting from the ion implantation amount of approximately $1\times10^{14}$ cm$^{-2}$ of the p-type collector region. In the case of p-type collector region 108 that has the impurity activation ratio 100% according to the prior art, the fluctuation in $V_{ON}$ for the collector region implantation amount is great and the fluctuation in the effective concentration of the collector region when the ion implantation amount fluctuates at the time of ion implantation, shown in FIG. 15, is great and, therefore, the fluctuation in $V_{ON}$ when the ion implantation amount fluctuates at the time of ion implantation becomes great and device design becomes difficult.

On the other hand, in the case of p-type collector region 8 having a low impurity activation ratio of the present embodiment, there is an effect wherein the above described problem with conventional collector region 108 is resolved and there is also an effect wherein a sufficient freedom in device design is obtained so that the margin becomes great relative to fluctuation during the process and wherein negative affects on the device characteristics due to fluctuation in the process are prevented.

(Embodiment 3)

Figure 17:
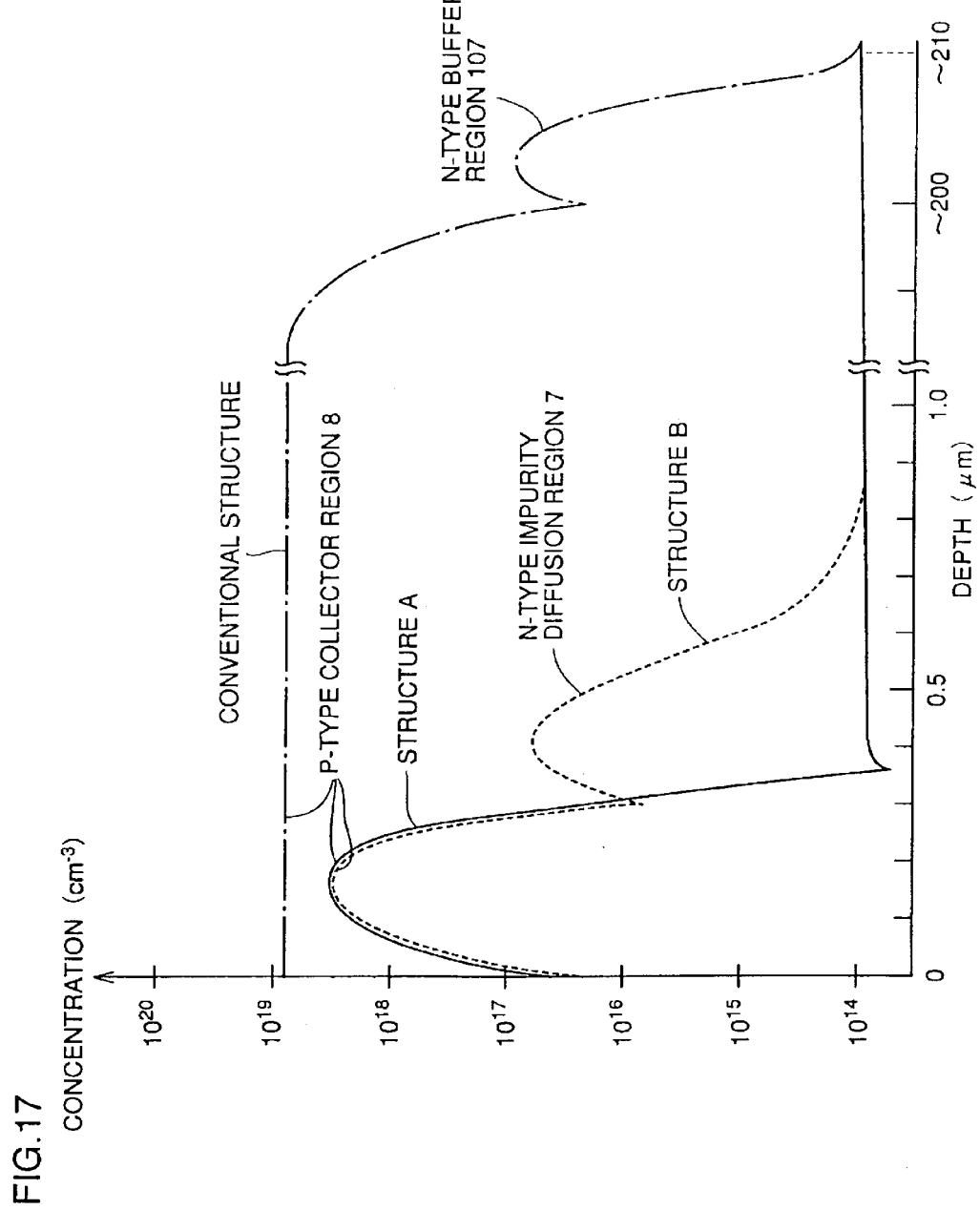
FIG. 17 is a graph showing the impurity concentration profile corresponding to the portion along line XVII—XVII in FIG. 1.

FIG. 17 is a graph showing the impurity concentration profile corresponding to the portion along line XVII—XVII, shown in FIG. 1. In reference to FIG. 17, the solid line shows the impurity profile of structure A on the collector side in FIG. 1, the dotted line shows the impurity profile of collector structure B of the below described the embodiment 4 (FIG. 21) and the one-dotted chain line shows the impurity profile of the collector structure in FIG. 75, respectively.

In structure A on the collector side in FIG. 1, the surface concentration in the second main surface of p-type collector region 8 is no less than $5 \times 10^{15}$ cm$^{-3}$ and the depth of p-type collector region 8 from the second main surface is no greater than 1 μm. The reason why the diffusion depth of p-type collector region 8 is shallow is that p-type collector region 8 is formed after the formation of the other impurity regions. That is to say, this p-type collector region 8 does not undergo heat treatments of high temperature for the formation of the other impurity regions.

In addition, the surface concentration of p-type collector region 8 in the second main surface is made to be no less than $5 \times 10^{15}$ cm$^{-3}$ and, thereby, a low resistance contact between p-type collector region 8 and collector electrode 12 can be implemented so that the device characteristics can be prevented from becoming unstable.

Figure 18:
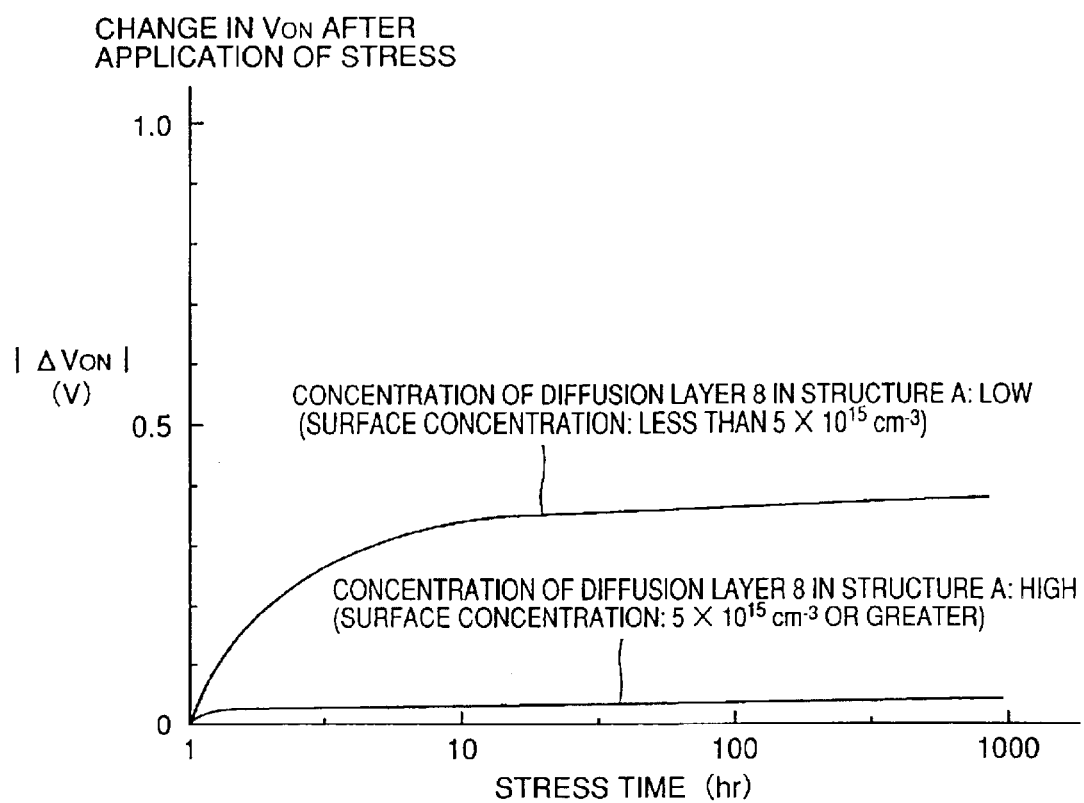
FIG. 18 is a graph showing the relationship between the change amount of $V_{ON}$($|\Delta V_{ON}|$) and stress time.
Figure 19:
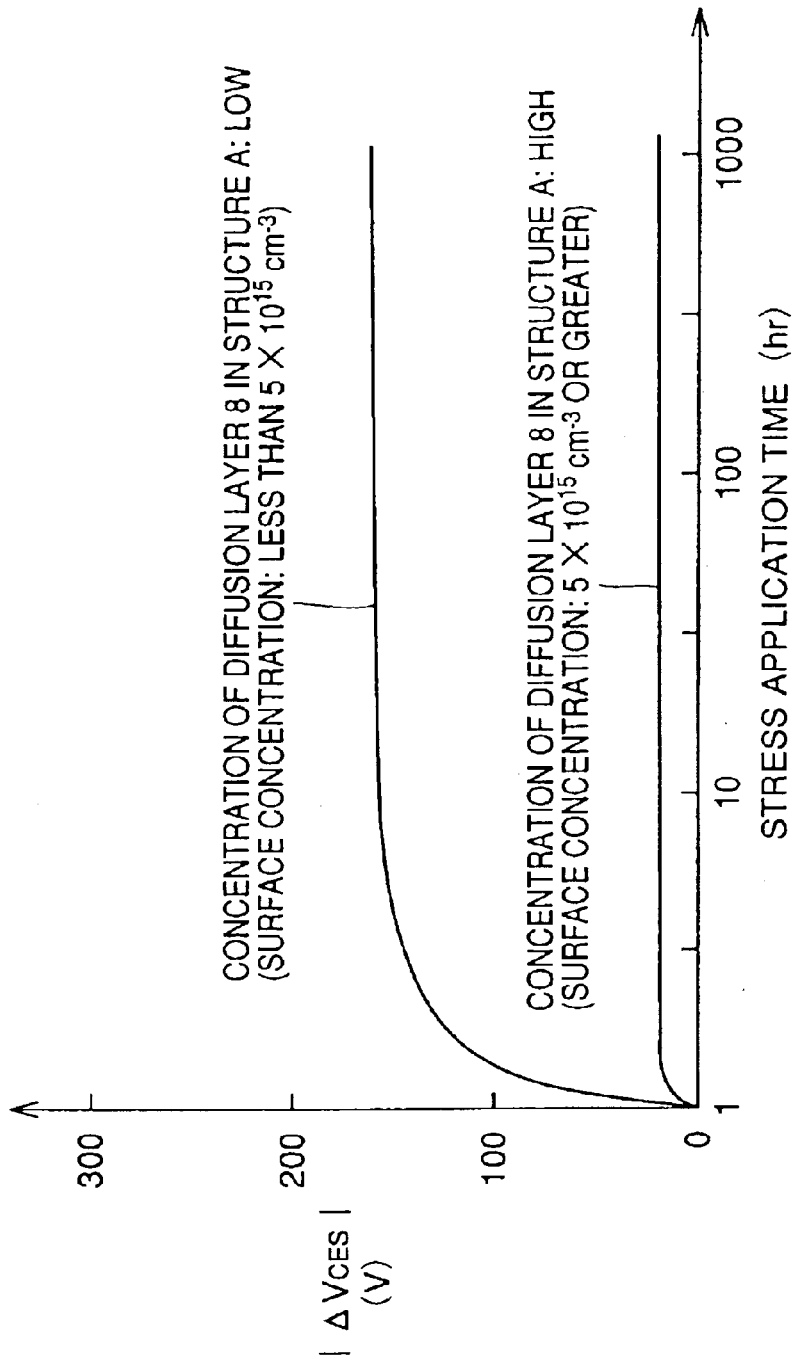
FIG. 19 is a graph showing the change amount of $V_{CES}$ ($|\Delta V_{CES}|$) after stress is applied.

Changes in $V_{ON}$ and in $V_{CS}$ over time after stress is applied, in the case that the surface concentration of p-type collector region 8 is changed in the present embodiment, are shown in FIGS. 18 and 19. In reference to FIGS. 18 and 19, changes in $V_{ON}$ and $V_{CES}$ over time become great in the case that the surface concentration of p-type collector region 8 is lower than $5 \times 10^{15}$ cm$^{-3}$. Thereby, it can be seen that change in device characteristics becomes great so as to negatively affect the device characteristics when the surface concentration of p-type collector region 8 is too low, for example lower than $5 \times 10^{15}$ cm$^{-3}$. Accordingly, it can be seen that there is an effect wherein the reliability of the device is prevented from being decreased by allowing the surface concentration to be no less than $5 \times 10^{15}$ cm$^{-3}$ as in structure A on the collector side of the present embodiment.

Figure 20:
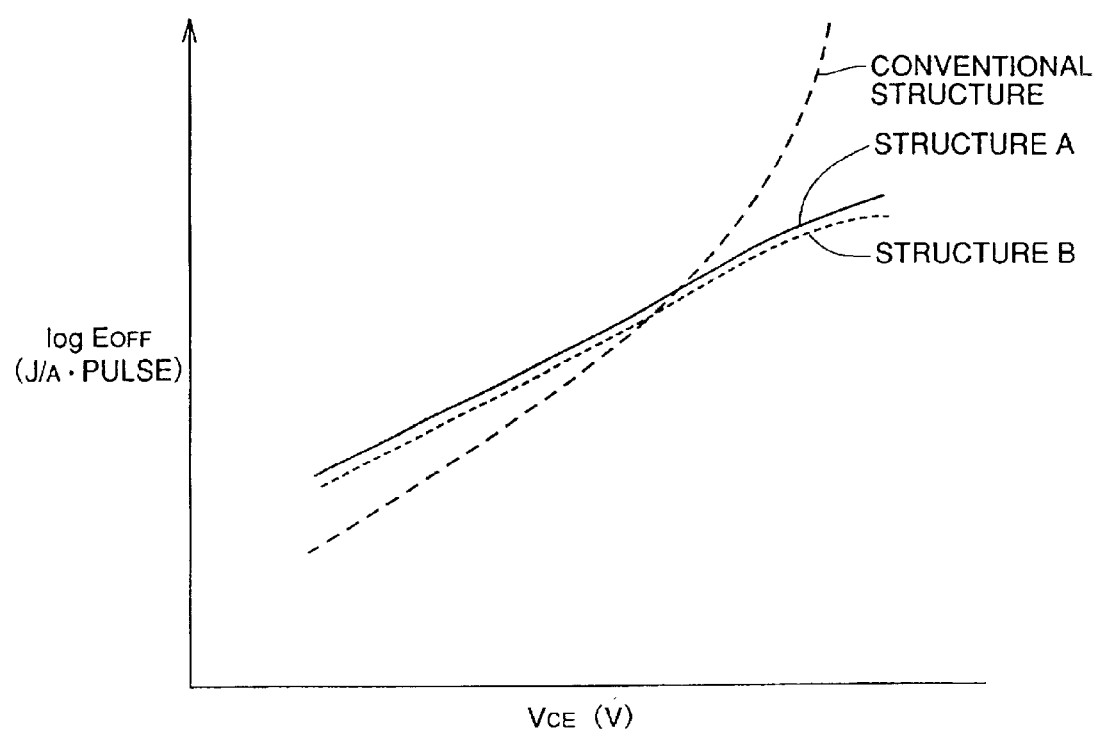
FIG. 20 is a graph showing the relationship between log $E_{OFF}$ and $V_{CE}$.

In addition, the main relationship between switching loss ($E_{OFF}$) and $V_{CC}$ at the time of turning off) is shown in FIG. 20. It can be seen from FIG. 20 that $E_{OFF}$ suddenly rises as $V_{CE}$ rises in the conventional collector structure shown in FIG. 75. On the other hand, the change in $E_{OFF}$ due to change in $V_{CE}$ is small in collector structure A of the present embodiment and it can be seen that an effect is obtained wherein an increase and change in the switching loss can be prevented when the power supply voltage, at the time of device operation, is changed.

This is because, in collector structure A of the present embodiment, the surface concentration in the second main surface of p-type collector region 8 is low (or the impurity activation ratio is low, for example no greater than 50%) in comparison with the conventional collector structure and the diffusion depth is shallow, for example no greater than 1 μm, and, therefore, the carrier injection effect from the collector region at the time when the device is ON is smaller than that in the conventional collector structure even when $V_{CE}$ has risen so that the amount of holes stored in n$^-$ silicon substrate 1 at the time when the device is OFF becomes small.

(Embodiment 4)

Figure 21:
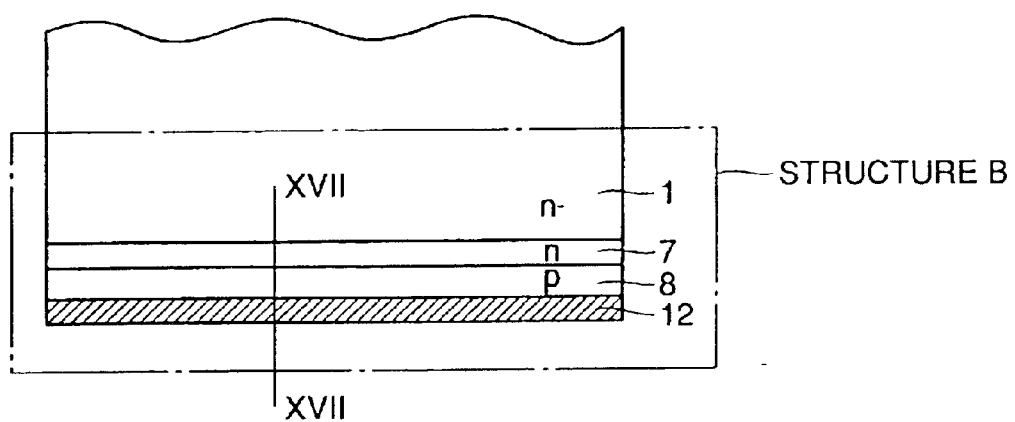
FIG. 21 is a schematic cross sectional view showing the collector structure of a semiconductor device according to an embodiment 3 of the present invention.

FIG. 21 is a schematic cross sectional view showing the configuration on the collector side of a semiconductor device according to the embodiment 4 of the present invention. In reference to FIG. 21, the configuration of the present embodiment differs from the configuration shown in FIG. 1 in the point of having an n-type impurity diffusion region 7 of a high concentration in the vicinity of a region wherein n$^-$ silicon substrate 1, together with p-type collector region 8, has a pn junction. n-type impurity diffusion region 7 in structure B on the collector side of the present embodiment has, as shown in FIG. 17, an impurity concentration peak of a concentration of the impurity concentration peak of p-type collector region 8, or less. In addition, n-type impurity diffusion region 7 is formed so that the depth from the second main surface becomes 2 μm or less.

Here, the other parts of p-type collector region 8 and the structure on the MOS transistor side have the same structure as in Embodiments 1 to 3, of which the descriptions are omitted.

In the manufacturing method of the present embodiment, as shown in FIG. 11, after the second main surface of the drift layer (n$^-$ layer 1) is polished, n-type impurity diffusion region 7 is formed on the second main surface and, after that, p-type collector region 8 is formed. Here, the other parts of the manufacturing method are approximately the same as in the above described method of the embodiment 1, of which the descriptions are omitted.

The diffusion depth of n-type impurity diffusion region 7 becomes shallow in the present embodiment because n-type impurity diffusion region 7 is formed after the formation of impurity regions on the MOS transistor side and, therefore, n-type impurity diffusion region 7 does not undergo a heat treatment of a high temperature for the formation of impurity regions on the MOS transistor side.

Collector structure B of the present embodiment is a structure wherein injection efficiency of holes from p-type collector region 8 is restricted in comparison with collector structure A shown in FIG. 1.

In the present embodiment, n-type impurity diffusion region 7 is provided and, thereby, the following effects can be obtained in comparison with collector structure A shown in FIG. 1.

Figure 22:
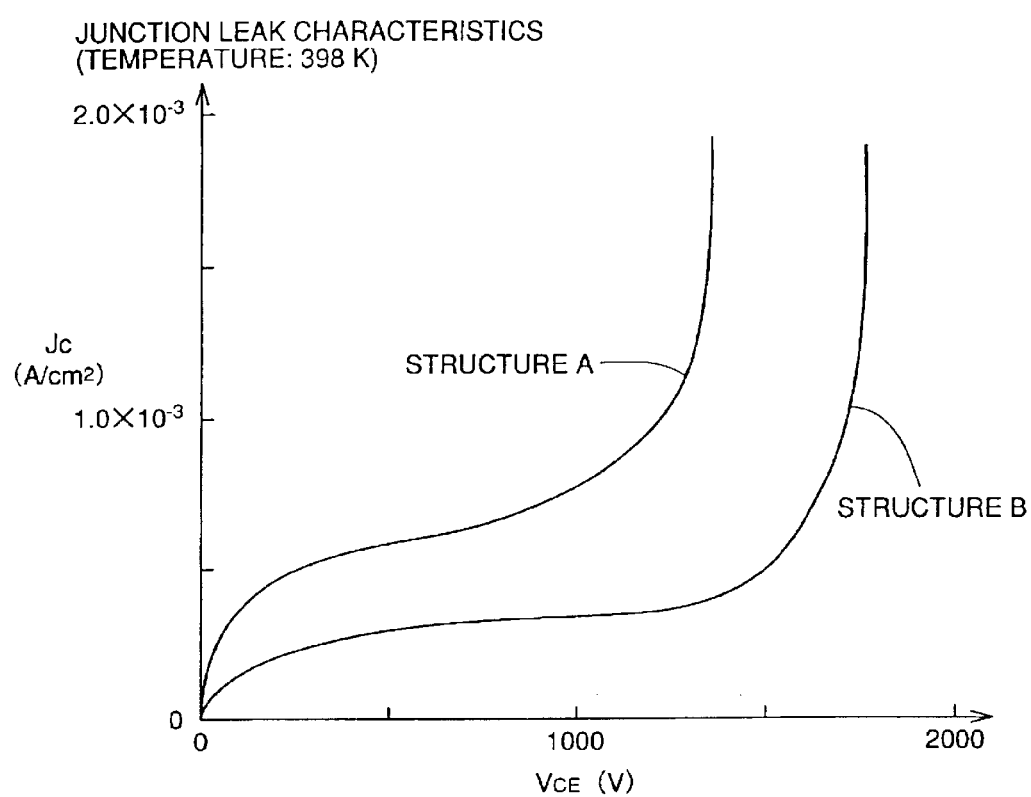
FIG. 22 is a graph showing the junction leak characteristics.

(1) The main junction leak characteristics are lowered as shown in FIG. 22 so that the withstanding voltage rises.

Figure 23:
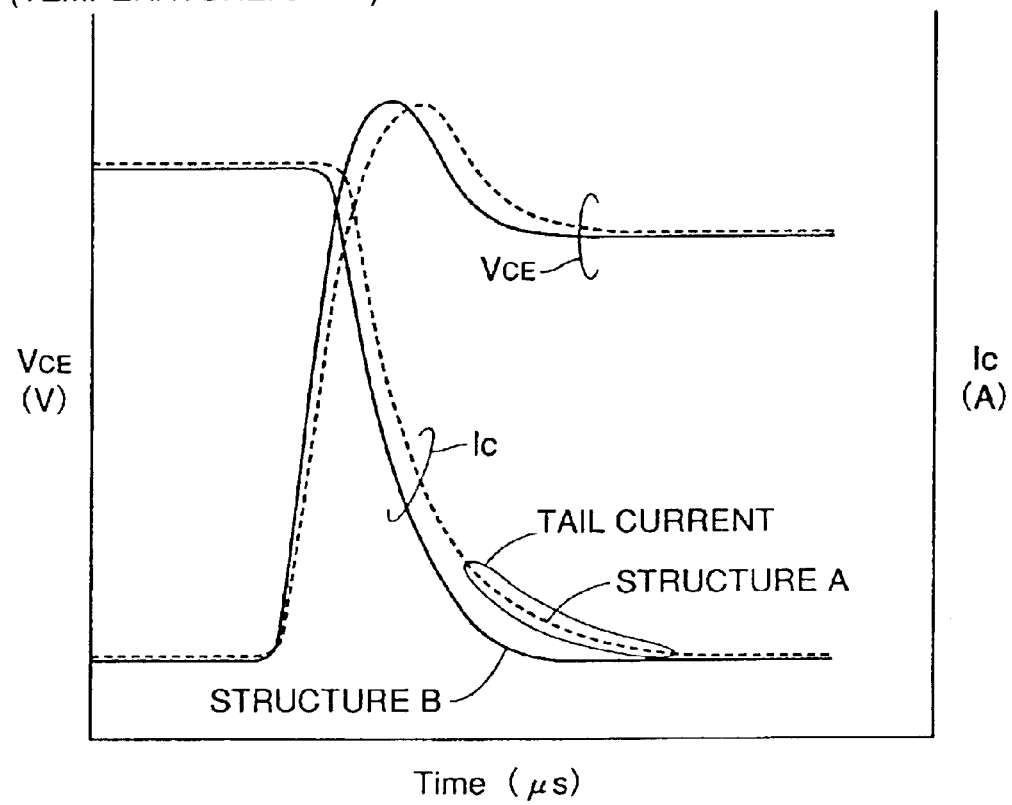
FIG. 23 is a graph showing the relationship between $V_{CE}$ or $I_C$ at the time of turning off and time.

(2) The tail current decreases in the waveform of $I_C$ at the time when turned off as shown in FIG. 23 and, as a result, the switching loss ($E_{OFF}$) is reduced.

In addition, in structure B, p-type collector region 8 has the same structure as in structure A and, therefore, as shown in FIG. 20, an effect of restricting the change in $E_{OFF}$ due to the change in $V_{CE}$ is obtained.

(Embodiment 5)

Figure 24:
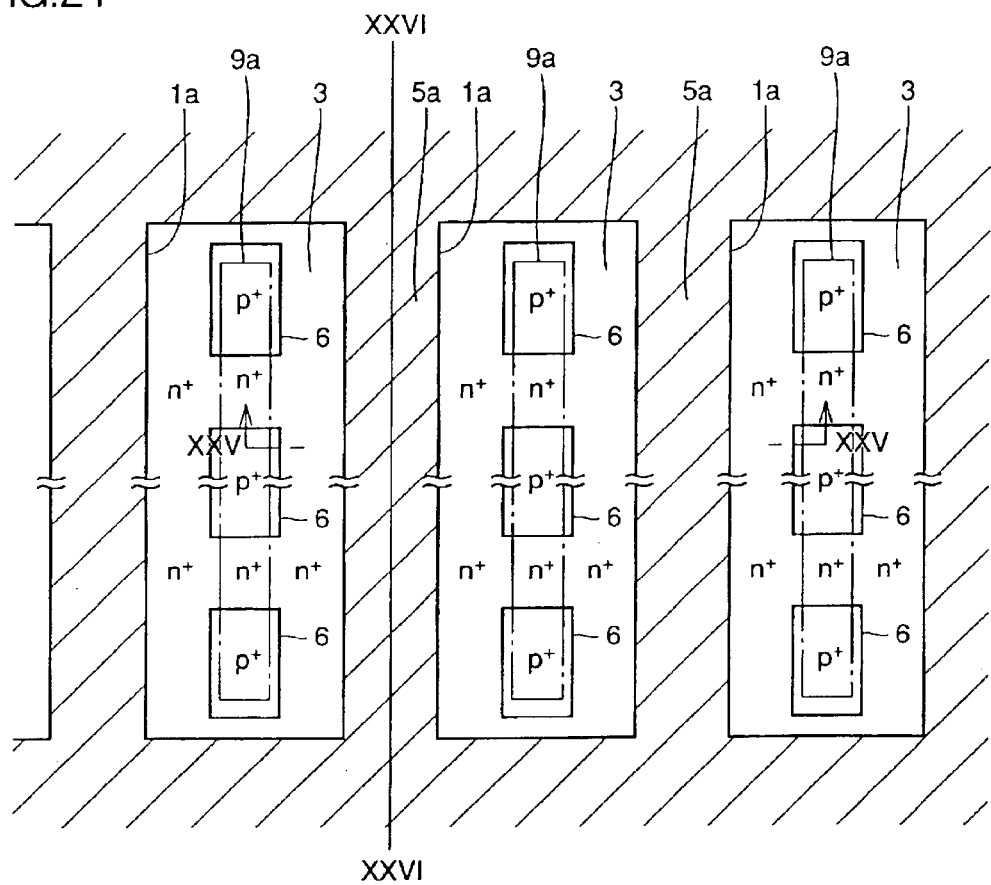
FIG. 24 is a plan view schematically showing a configuration of a semiconductor device according to an embodiment 5 of the present invention.

FIG. 24 is a plan view schematically showing the configuration of a semiconductor device according to the embodiment 5 of the present invention. In addition, FIGS. 25 and 26 are schematic cross sectional views along line XXV—XXV and line XXVI—XXVI, respectively, in FIG. 24.

Figure 25:
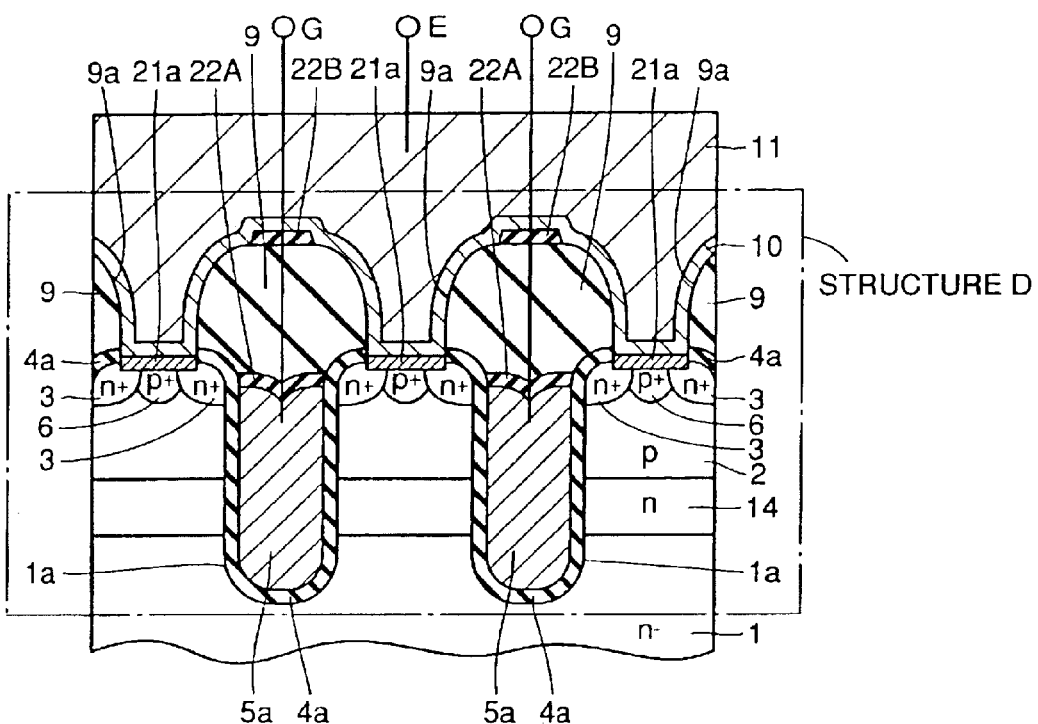
FIGS. 25 and 26 are schematic cross sectional views along line XXV—XXV and along line XXVI—XXVI, respectively, in FIG. 24.

In reference primarily to FIG. 25, in the present embodiment an n-type impurity diffusion region 14 of a comparatively high concentration is provided in the vicinity of a region wherein n$^-$ silicon substrate 1 forms, together with p-type body region 2, a pn junction.

In reference primarily to FIG. 24, p$^+$ impurity diffusion region 6 in the first main surface sandwiched between two trenches 1a for gates is divided into a plurality of pieces (for example three) in the upward and downward direction of the figure. Each p$^+$ impurity diffusion region 6 divided in the upward and downward direction of this figure is electrically connected to emitter electrode 11 via a single contact hole 9a.

Figure 26:
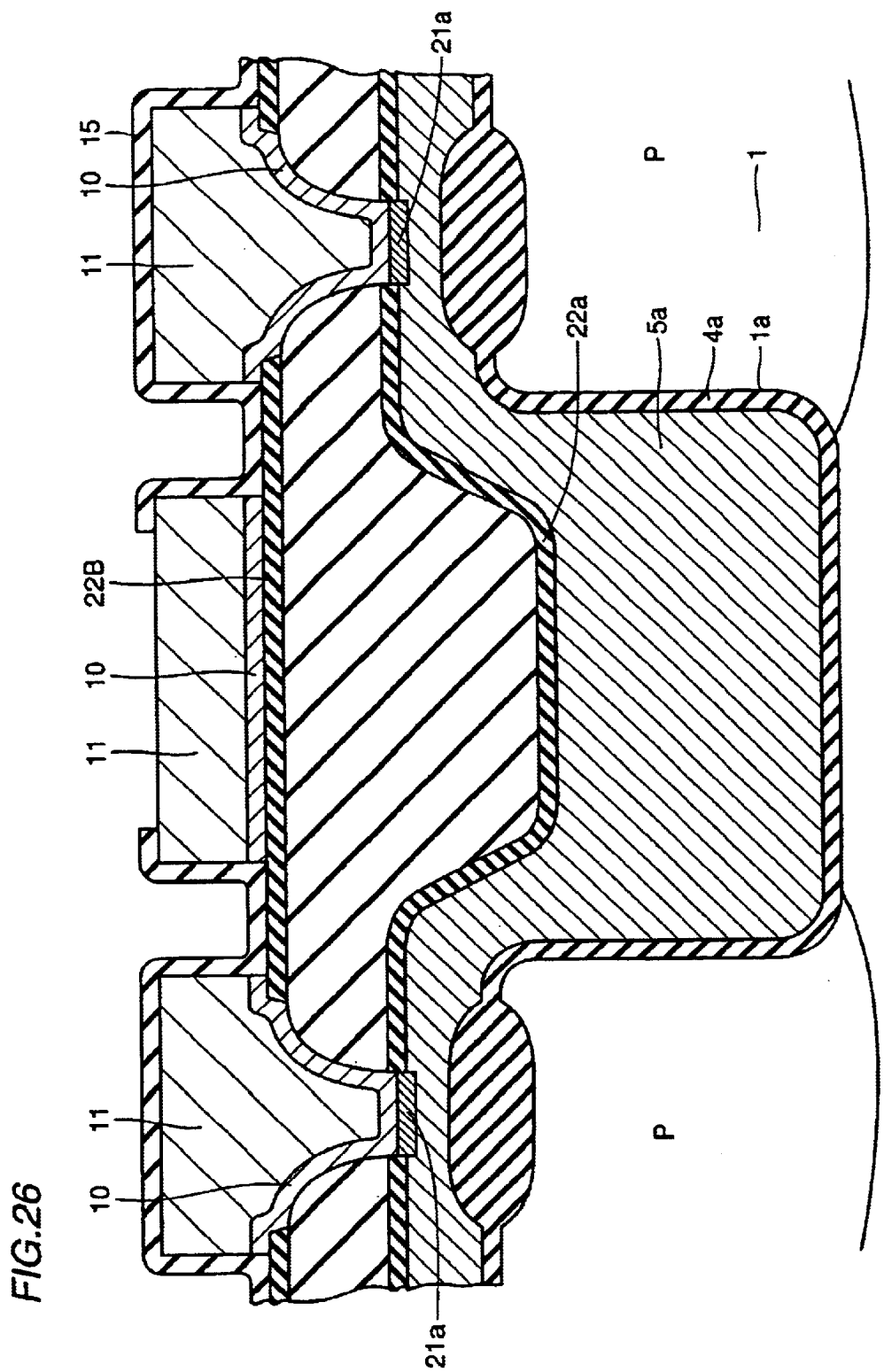

In reference primarily to FIGS. 24 and 26, gate electrode 5a that fills in trench 1a for a gate extends on the first main surface, also, outside of trench 1a for a gate so as to be electrically connected to conductive layer 11 that becomes a pad in the extended portion. Barrier metal layer 10 is positioned in the lower layer of conductive layer 11 that becomes this pad and silicide layer 21a is formed in a region wherein barrier metal layer 10 and gate electrode 5a contact each other.

Here, a passivation film 15 is formed above conductive layer 11, which is the above pad, and emitter electrode 11.

Here, the parts of the configuration other than the above are approximately the same as in the above described configuration of the embodiment 1 and, therefore, the same symbols are attached to the same members, of which the descriptions are omitted.

Figure 27:
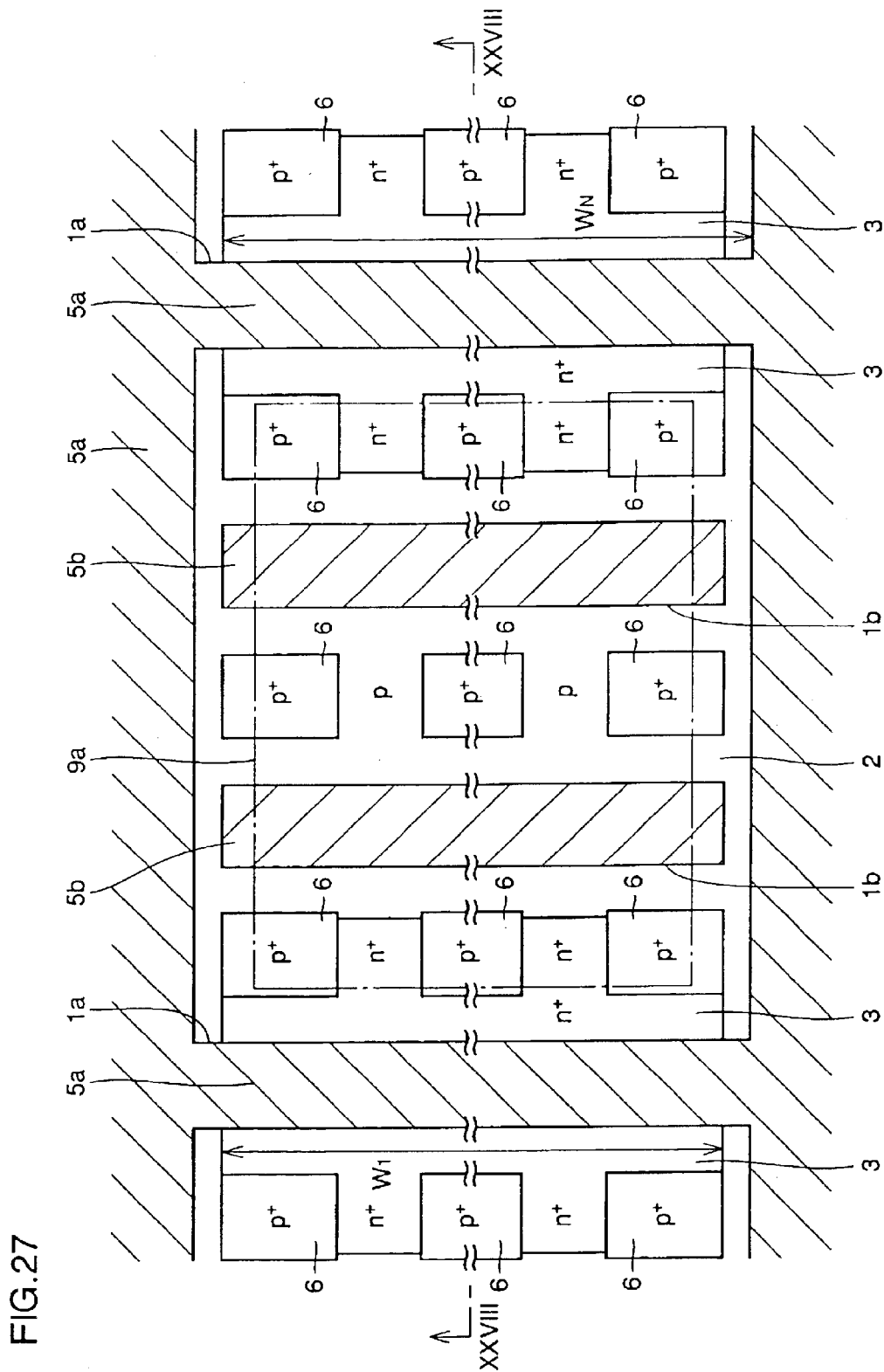
FIG. 27 is a schematic plan view showing another configuration of the semiconductor device according to the embodiment 5 of the present invention.
Figure 28:
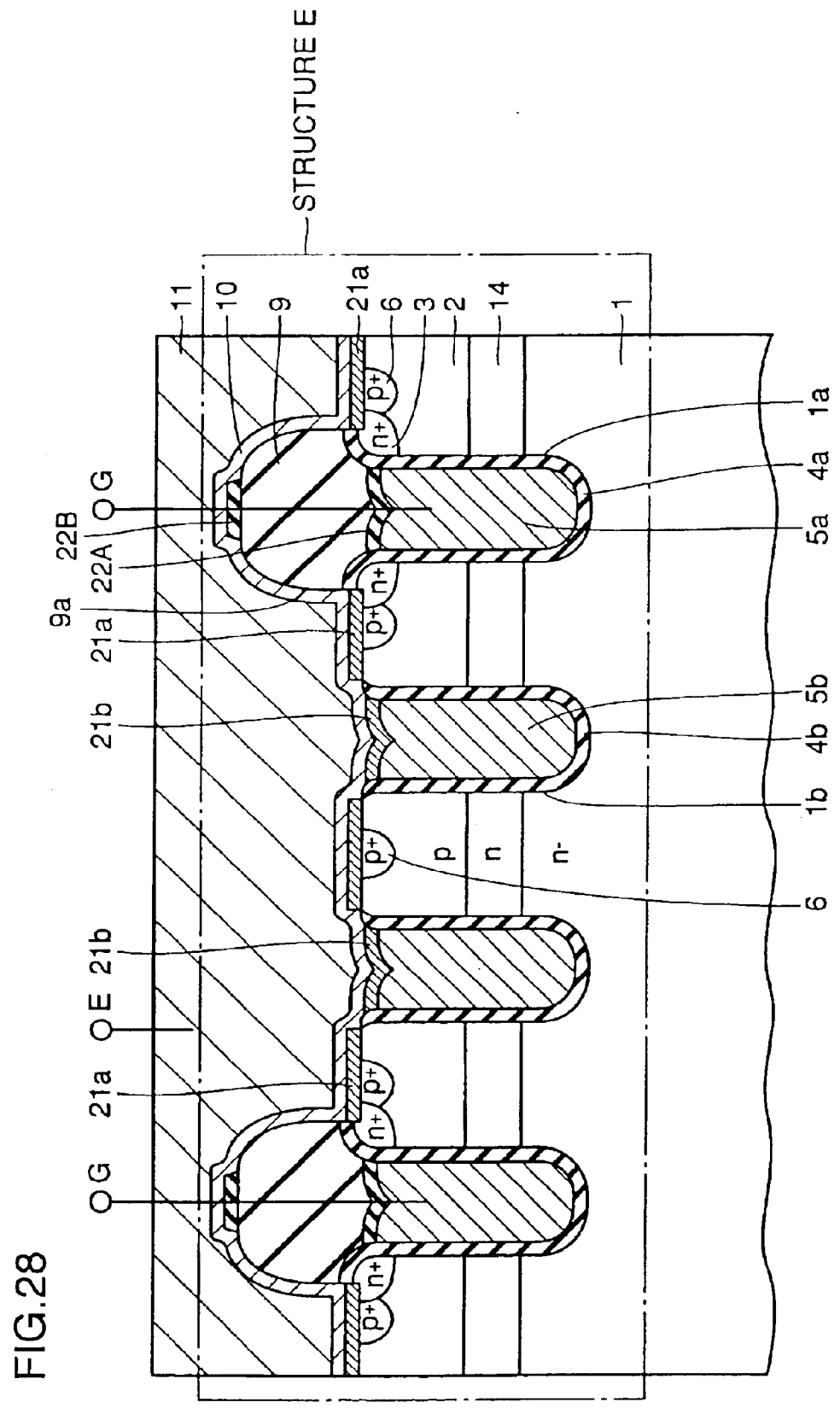

The configuration wherein n-type impurity diffusion region 14 is provided is not limited to the configuration of FIGS. 24 to 26 but, rather, may be a configuration as shown in, for example, FIGS. 27 and 28. That is to say, n-type impurity diffusion region 14 may be provided in a configuration wherein an emitter trench is provided.

FIG. 27 is a schematic plan view showing the configuration of a modified example of the semiconductor device according to the embodiment 5 of the present invention while FIG. 28 is a schematic cross sectional view along line XXVIII—XXVIII in FIG. 27.

In reference to FIGS. 27 and 28, an emitter trench is provided in a region sandwiched between two MOS transistors. The emitter trench is formed of trench 1b for an emitter, insulating film 4b for an emitter and conductive layer 5b for an emitter. Trench 1b for an emitter penetrates ptype body region 2 and n-type impurity diffusion region 14 so as to reach to n⁻ silicon substrate 1. Insulating film 4b for an emitter is formed so as to extend along the inner surface of this trench 1b for an emitter. Conductive layer 5b for an emitter is formed so as to fill in trench 1b for an emitter and is electrically connected to emitter electrode 11 in the upper layer thereof.

Barrier metal layer 10 is formed in the lower layer of emitter electrode 11 and silicide layer 21b is formed between this barrier metal layer 10 and conductive layer 5b for an emitter.

p⁺ impurity diffusion region 6 for forming a low resistance contact with p-type body region 2 is formed in the first main surface sandwiched between two emitter trenches and silicide layer 21a is formed on top of this.

In such a configuration, n-type impurity diffusion region 14 of a comparatively high concentration is provided in the vicinity of a region wherein n⁻ silicon substrate 1, together with p-type body region 2, form a pn junction.

Here, the parts of the configuration other than this are approximately the same as in the above described configuration of FIGS. 24 to 26 and, therefore, the same symbols are attached to the same members, of which the descriptions are omitted.

Figure 29:
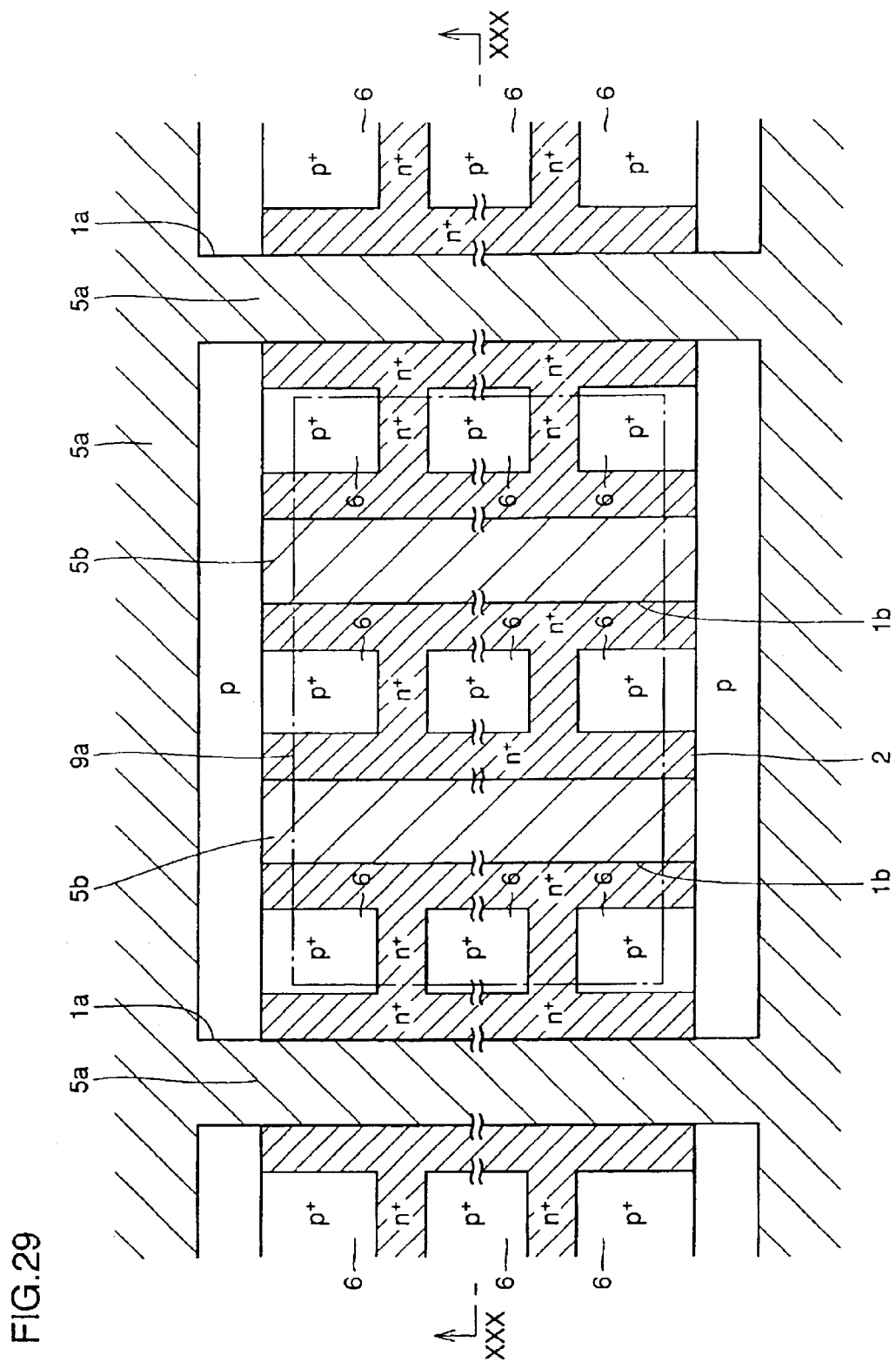
FIG. 29 is a schematic plan view showing still another configuration of the semiconductor device according to the embodiment 5 of the present invention.
Figure 30:
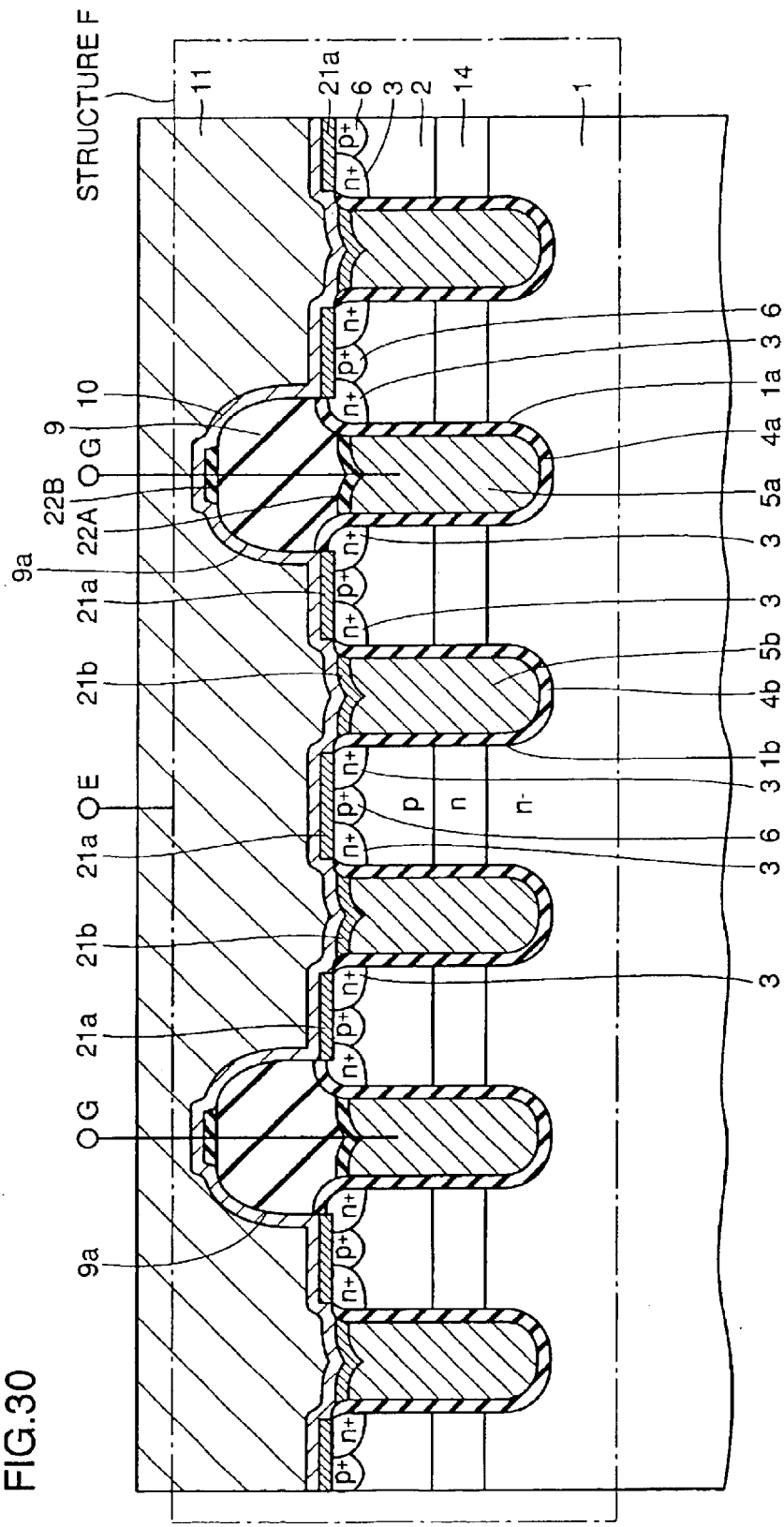
FIG. 30 is a schematic cross sectional view along line XXX—XXX in FIG. 29.

In addition, the configuration of FIGS. 29 and 30 differs from the configuration of FIGS. 27 and 28 in the point that an n-type impurity diffusion region 3 is added to a sidewall of the emitter trench, which is in the first main surface.

Here, the parts of the configuration other than this are approximately the same as in the configuration of FIGS. 27 and 28 and, therefore, the same symbols are attached to the same members, of which the descriptions are omitted.

In respect to FIGS. 27 to 30, though a case is described wherein conductive layer 5b that fills in trench 1b for an emitter becomes of the emitter potential, this conductive layer 5b may have a floating potential. The configuration thereof is described below.

Figure 31:
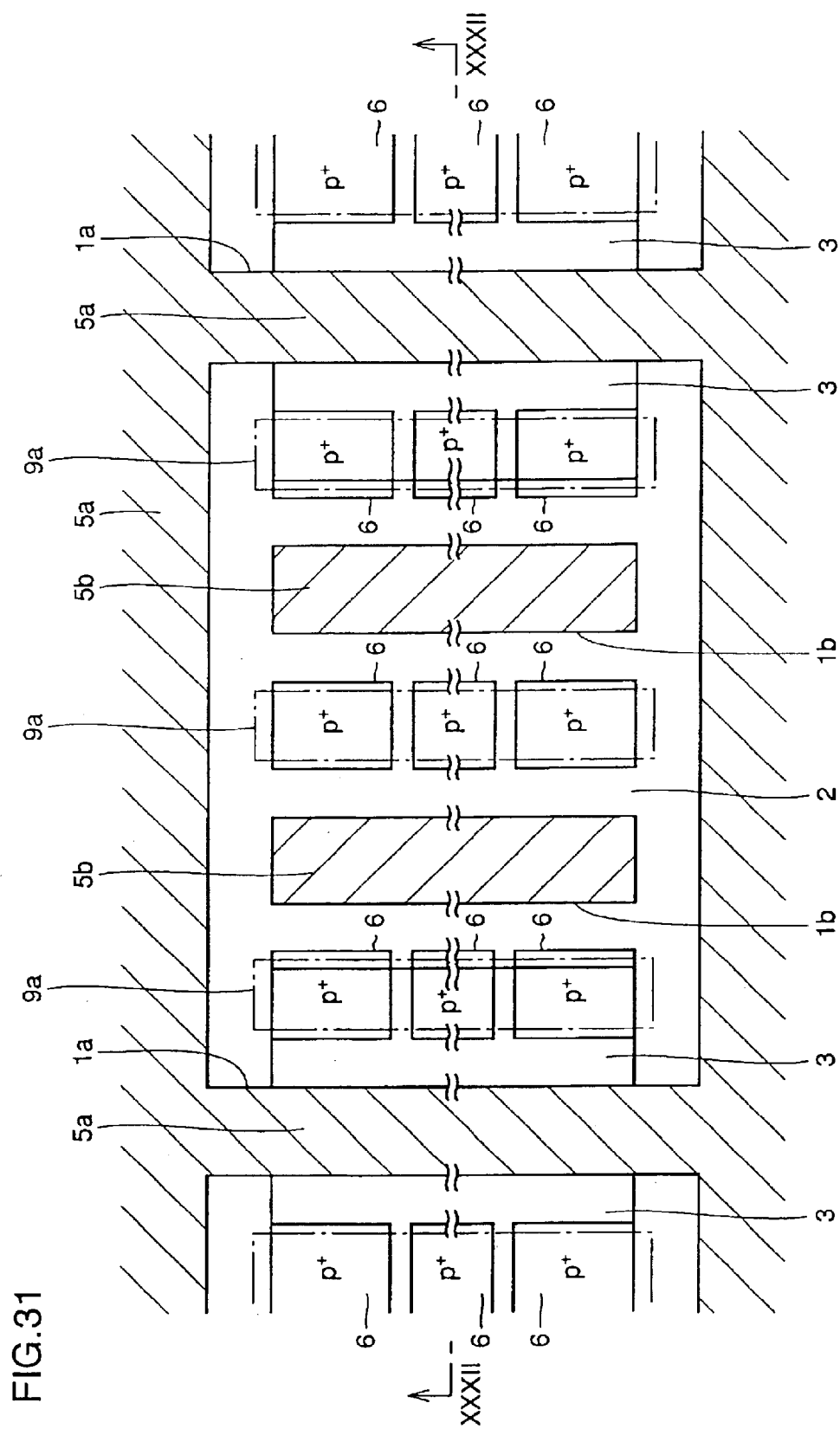
FIG. 31 is a schematic plan view showing yet another configuration of the semiconductor device according to the embodiment 5 of the present invention.
Figure 32:
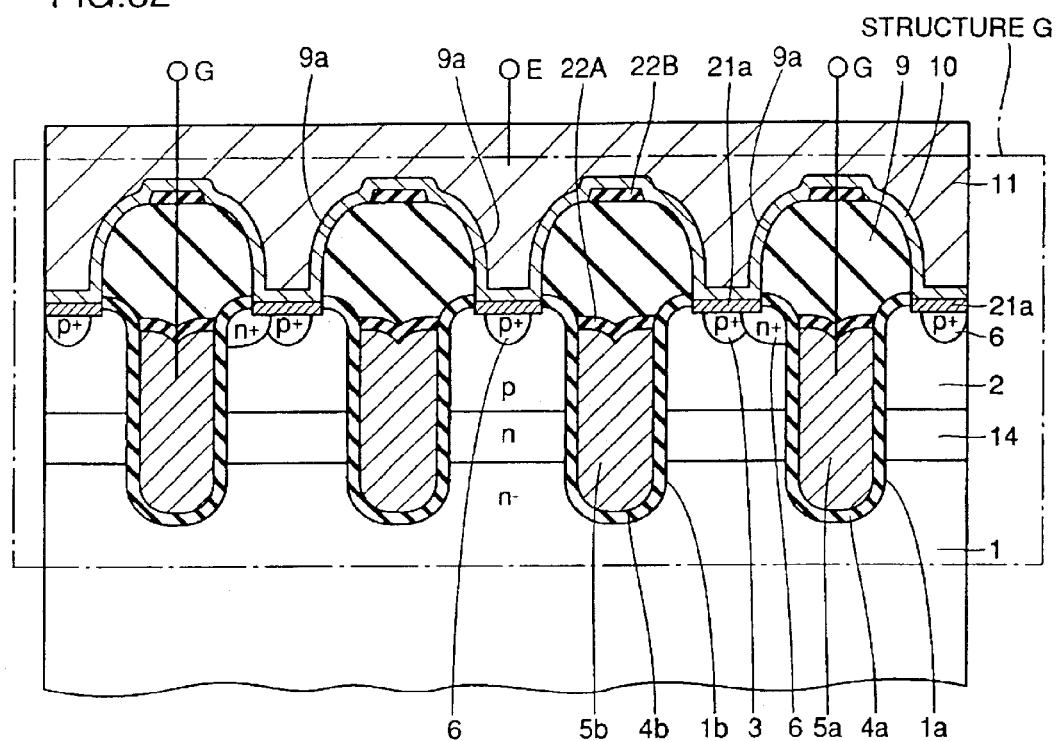
FIG. 32 is a schematic cross sectional view along line XXXII—XXXII in FIG. 31.

In reference to FIGS. 31 and 32, conductive layer 5b that fills in trench 1b is electrically isolated from emitter electrode 11 and has a floating potential. In this case, insulating film 22A made of, for example, a silicon oxide film, an insulating film 9 made of, for example, a silicate glass and insulating film 22B made of, for example, a silicon oxide film are formed above conductive layer 5b that fills in trench 1b.

Figure 33:
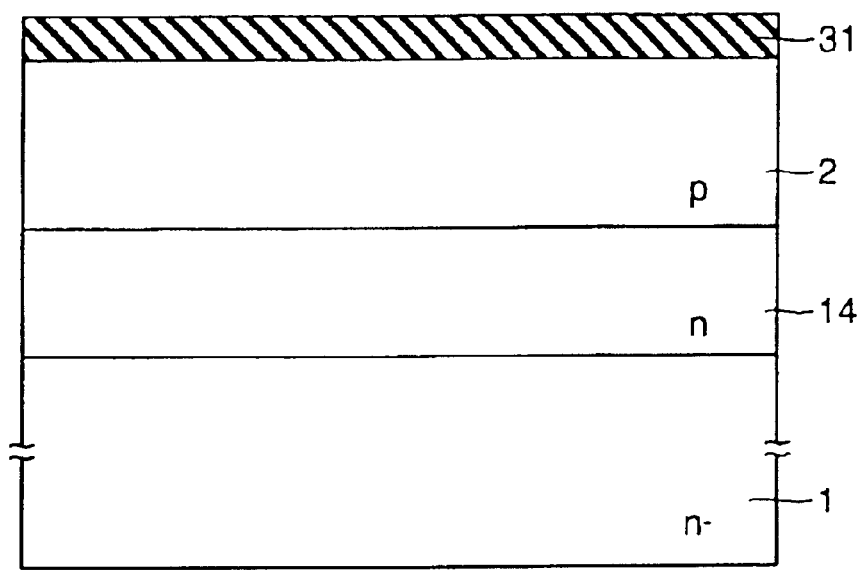
FIG. 33 is a schematic cross sectional view showing a manufacturing method for the semiconductor device according to the embodiment 5 of the present invention.

Here, the parts of the configuration other than this are approximately the same as in the configuration shown FIGS. 27 and 28 and, therefore, the same symbols are attached to the same members, of which the descriptions are omitted.

n-type impurity diffusion region 14 provided in the present embodiment is formed through ion implantation and diffusion, as shown in FIG. 33, before the formation of p-type body region 2. After this, p-type body region 2 is formed and, in addition, the same finishing steps as in the embodiment 1 are followed and, thereby, a variety of semiconductor devices (FIGS. 24 to 32) of the present embodiment are manufactured.

In addition, each of MOS transistor structures E (FIG. 28), F (FIG. 30) and G (FIG. 32) has a trench of the emitter potential or a floating potential and, thereby, has a smaller effective gate width than those of MOS transistor structures C (FIG. 1) and D (FIG. 25). As a result, as shown in FIG. 34, structures E, F and G have a smaller amount of current flowing there through than structures C and D and, thereby, have the effect of restricting the saturation current.

Figure 34:
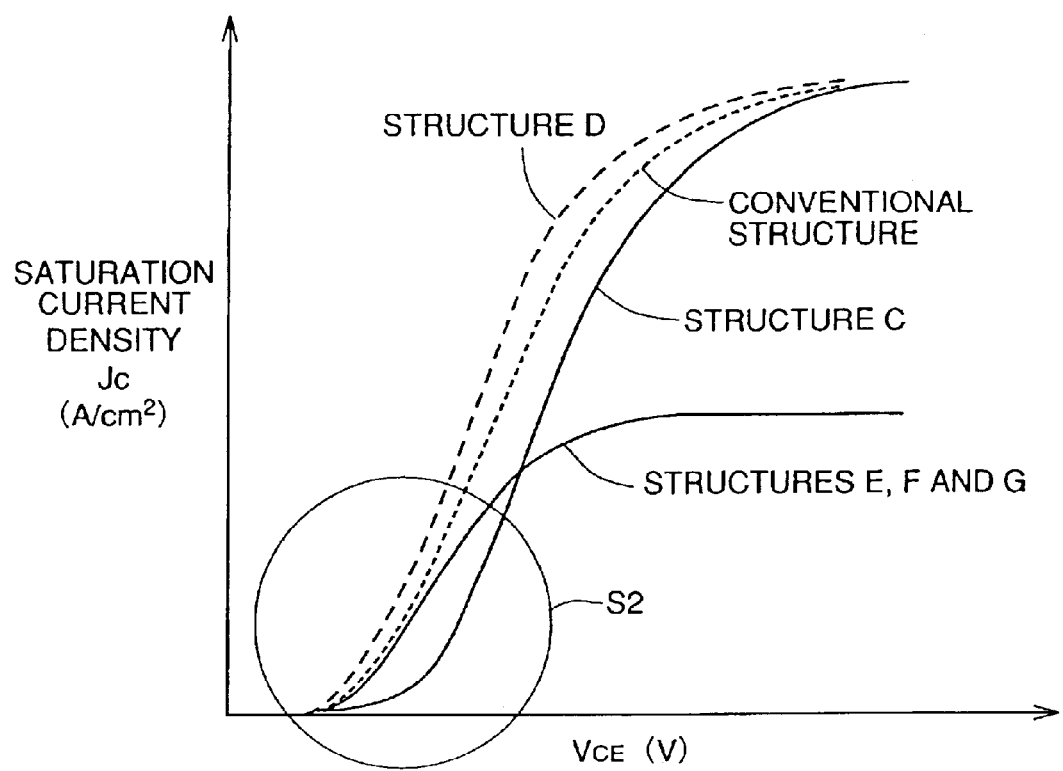
FIG. 34 is a graph showing the relationship between $J_C$ and $V_{CE}$.
Figure 35:
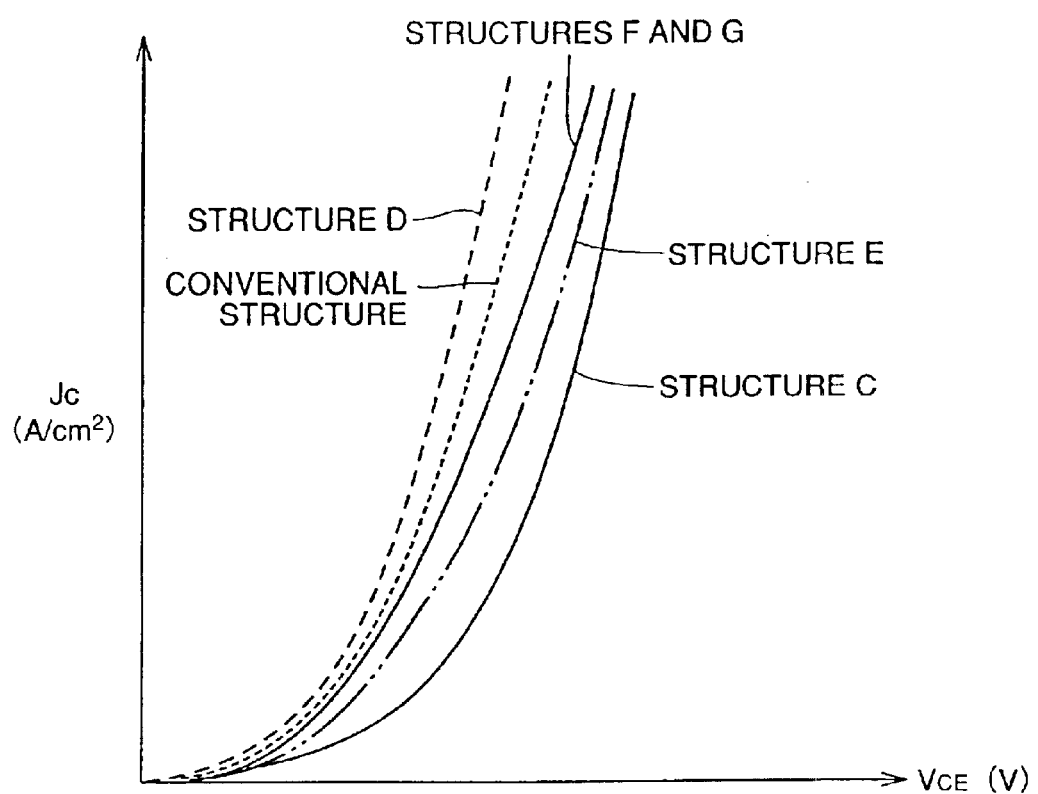
FIG. 35 is a graph showing an enlarged view of region S2 in FIG. 34.

Furthermore, in reference to FIG. 35, the ON voltage becomes greater in the area of low voltage/low current density (region S2 in FIG. 34) in structures E, F and G than in structures C and D. In MOS transistor structure C, n⁻ silicon substrate 1 is thicker than in the conventional structure and the hole injection efficiency from p-type collector region 8 is low and, thereby, the ON voltage rises. In addition, the ON voltage becomes lower in MOS transistor structure D because of the hole storage effect due to n-type impurity diffusion region 14, as described in U.S. Pat. No. 6,040,599, even in the case that n⁻ silicon substrate 1 is thick in collector structure A. MOS transistor structure D has the effect of lowering the ON voltage even in the case that n⁻ silicon substrate 1 is thicker than in the conventional structure.

Figure 36:
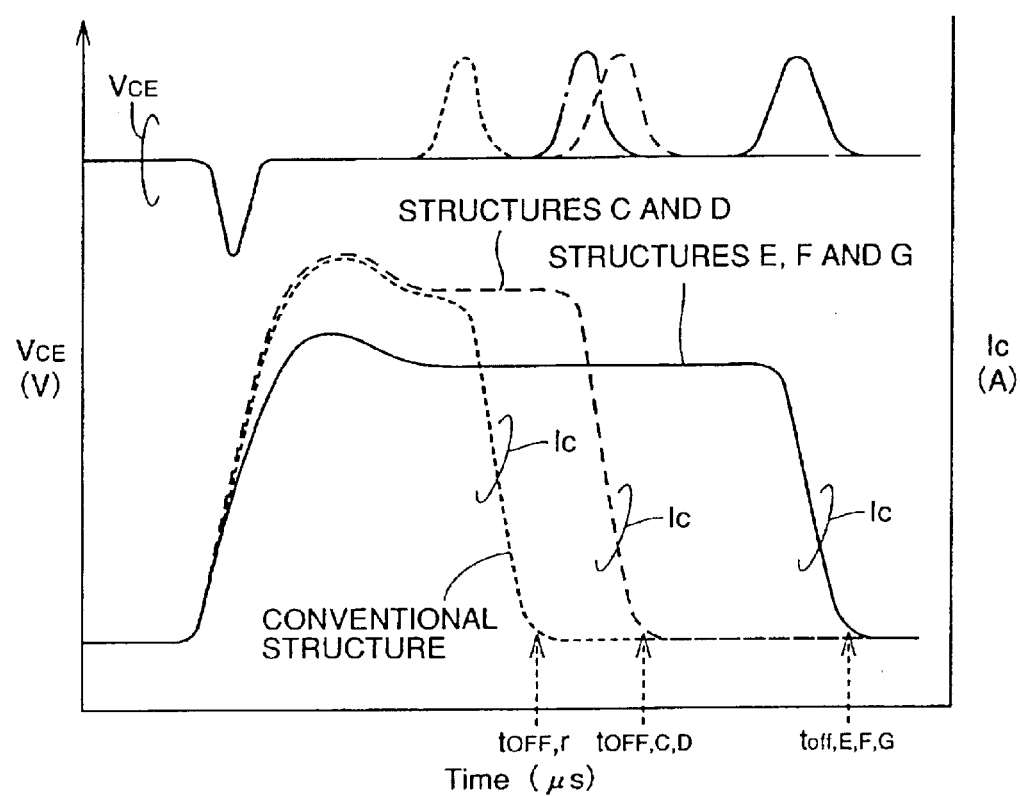
FIGS. 36 and 37 are graphs showing the relationship between $V_{CE}$ or $I_C$ and time.

As shown in FIG. 34, in MOS transistor structures E, F and G an arbitrary amount of current can be held for a longer period of time than in the conventional structure or in MOS transistor structures C and D because of the effect of the lowering of the saturation current when the device switches in the no-load condition, as shown in FIG. 36. That is to say, MOS transistor structures E, F and G have the effect of restricting the saturation current of the device and of increasing the withstanding capacity against breakdown.

Figure 37:
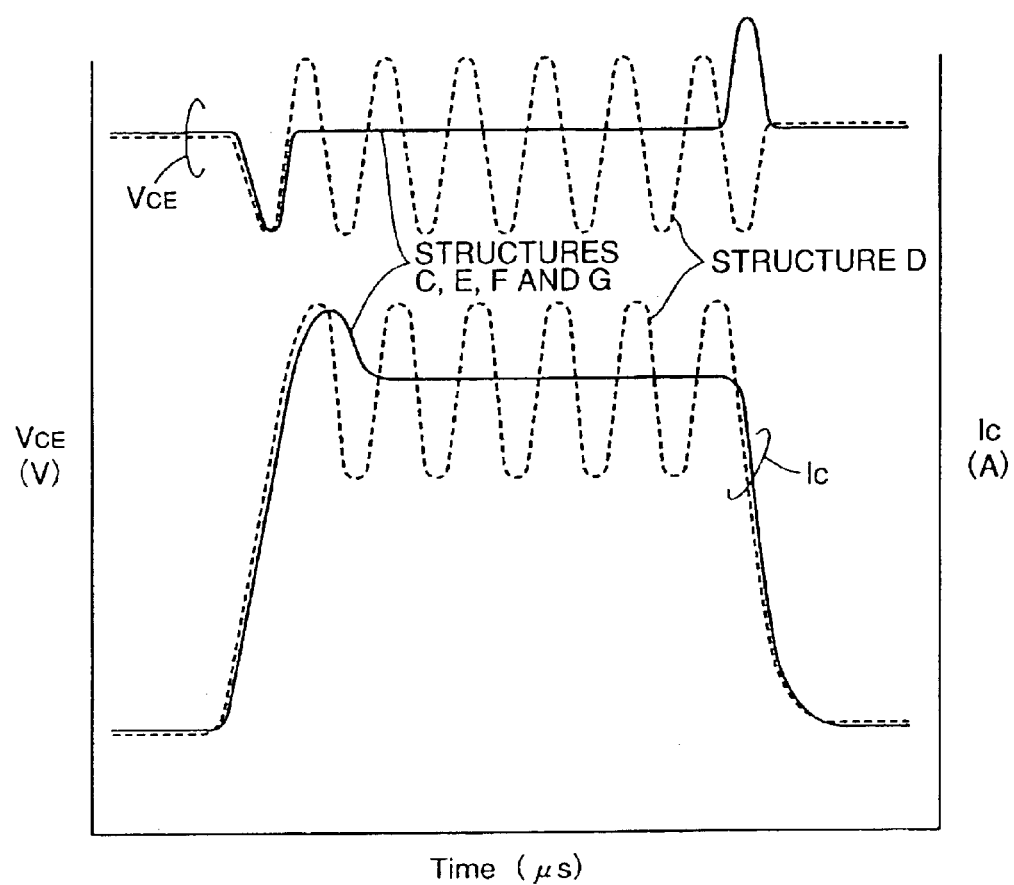
Figure 38:
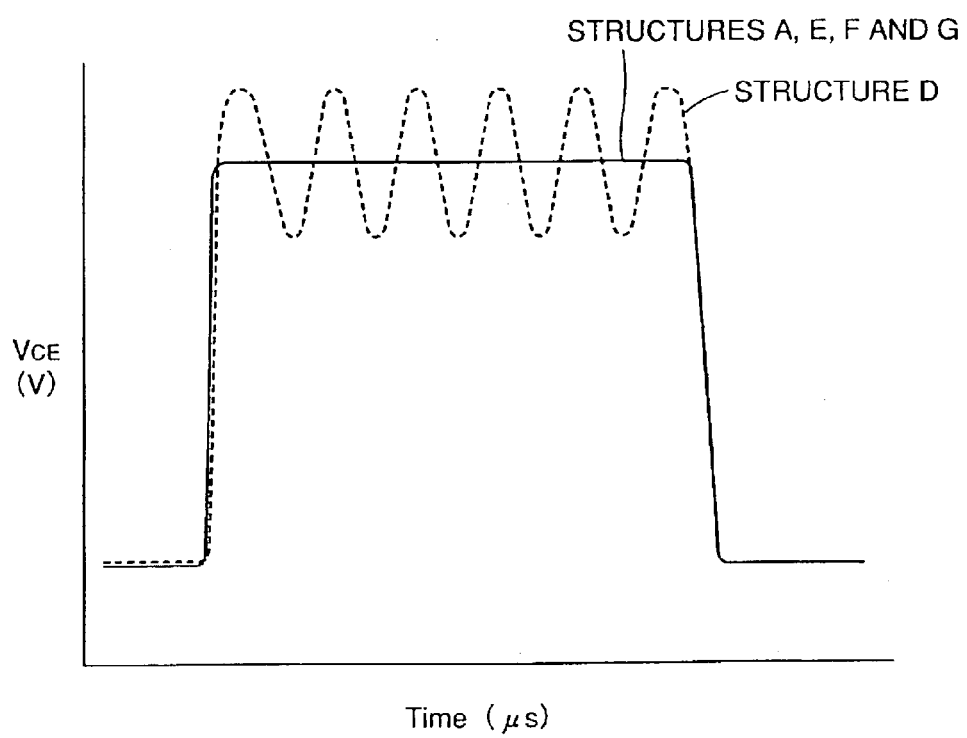
FIG. 38 is a graph showing the relationship between $V_{GE}$ and time.

Furthermore, in MOS transistor structure D that has the effect of lowering the ON voltage, an oscillation phenomenon occurs at the time of switching in the no-load condition, as shown in FIGS. 37 and 38. However, MOS transistor structures E, F and G have the effect of preventing the oscillation phenomenon because of the existence of conductive layer 5b that becomes of the emitter potential or of a floating potential in spite of the existence of n-type impurity diffusion region 14.

In addition, the above described effects of MOS transistor structures E, F and G can be obtained in the same manner as in the case wherein the collector structure on the second main surface side is of structure A, shown in FIG. 1, and as in the case wherein it is of structure B, shown in FIG. 21.

Contrarily, the same effects as in Embodiments 1 to 4 can be obtained in the case that MOS transistor structure C, shown in Embodiments 1 to 4, is modified to any of the other MOS transistors D to G.

(Embodiment 6)

FIGS. 39 to 74 are schematic cross sectional views showing the derived structures of a variety of MOS transistor structures wherein the same effects as in the embodiment 5 can be obtained. In any of the structures shown in FIGS. 39 to 74 or in any of the combinations wherein any of these MOS transistor structures is combined with either collector structure A or B, the effects resulting from the MOS transistor structure shown in the embodiment 5 can be obtained.

In addition, the effects in Embodiments 1 to 4 obtained from collector structure A or B can be obtained in the same manner even in the case of a combination with any of the MOS transistor structures shown in FIGS. 39 to 73.

In the following, each of the MOS transistor structures shown in FIGS. 39 to 73 is described.

Figure 39:
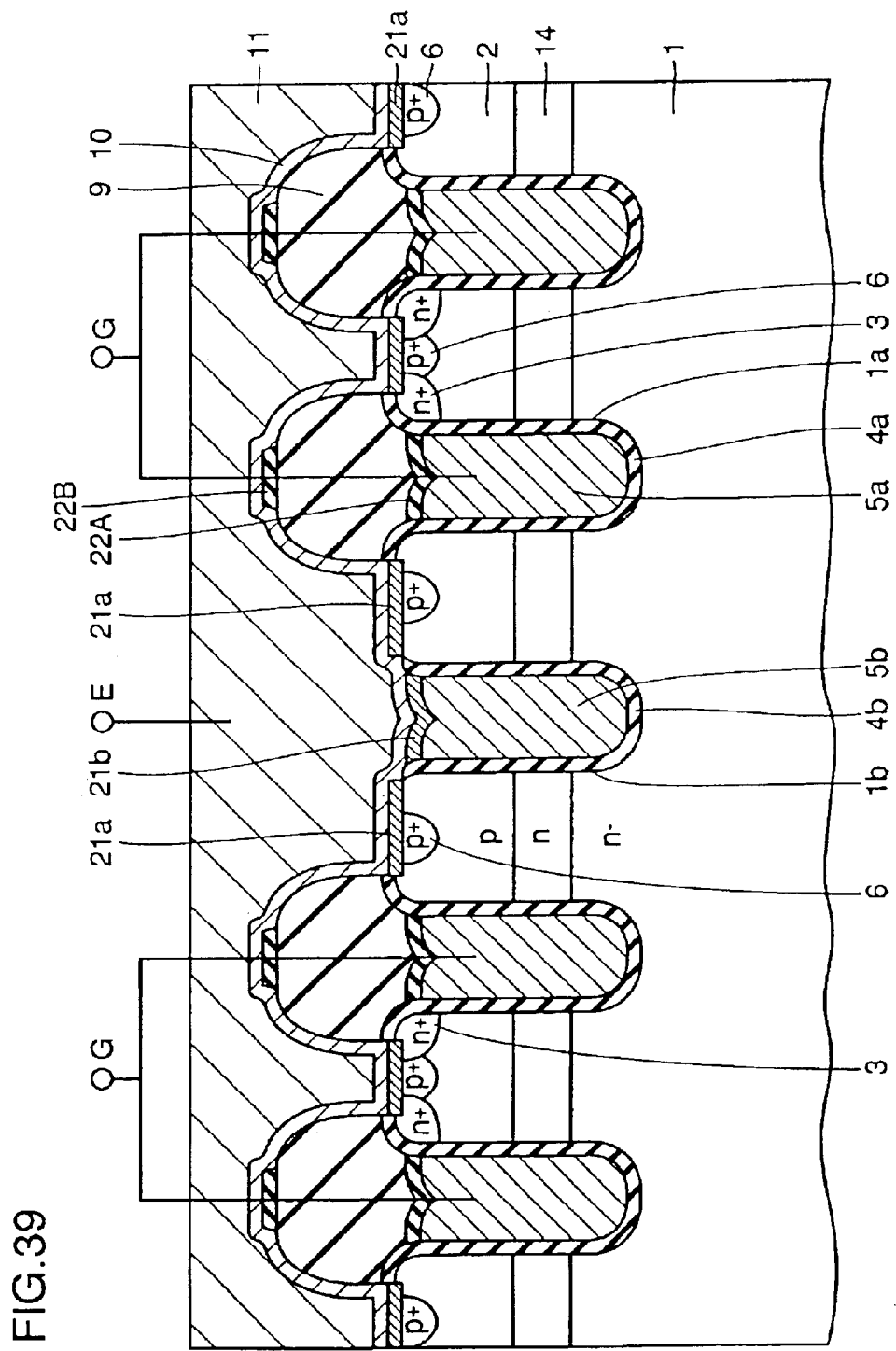
FIGS. 39 to 74 are schematic cross sectional views showing the configurations of a variety of semiconductor devices according to an embodiment 6 of the present invention.

The configuration shown in FIG. 39 differs from the configuration shown in FIG. 28 in the point that one emitter trench, which becomes of the emitter potential, is provided in a region sandwiched between two MOS transistor portions and in the point that n-type emitter region 3 is formed on only one side of trench 1a for a gate.

Figure 40:
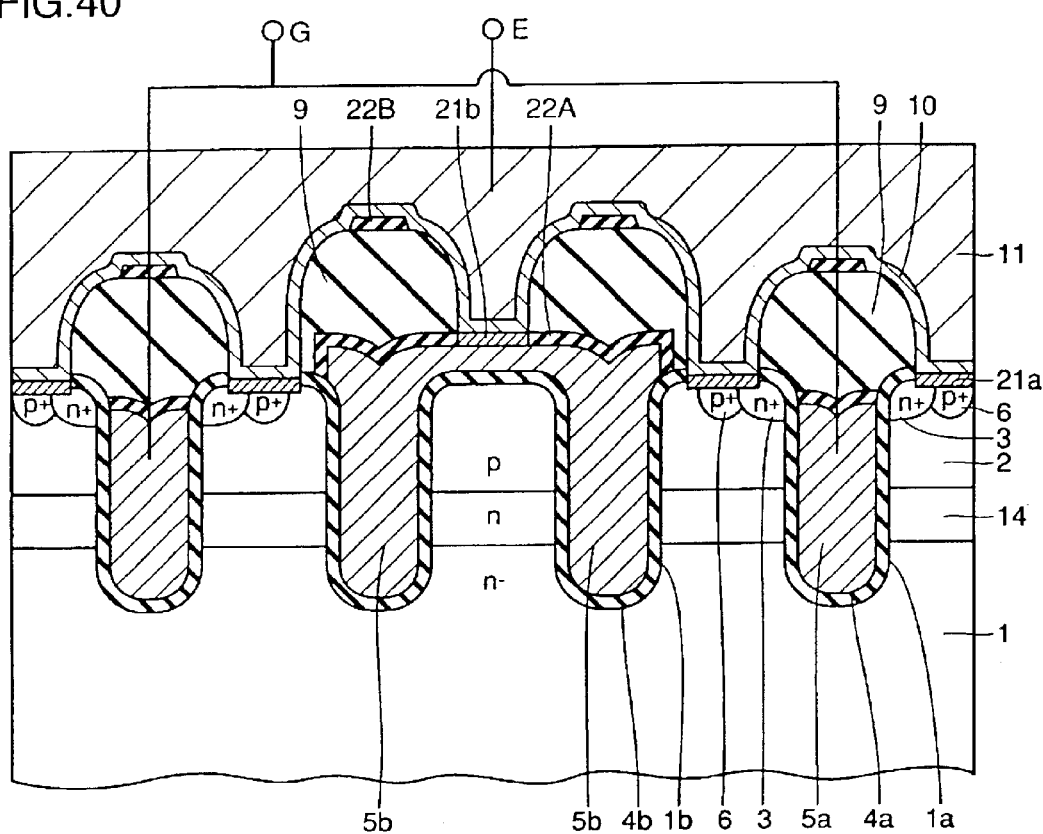

In the configuration shown in FIG. 40, a plurality of trenches 1b for an emitter is filled in with conductive layer 5b for an emitter that is formed of an integrated single layer. In addition, conductive layer 5b for an emitter is electrically connected to barrier metal layer 10 and emitter electrode 11 via silicide layer 21b. This silicide layer 21b is formed on a bridge that connects respective trenches 1b for an emitter. In addition, insulating films 22A, 9 and 22B are formed above conductive layer 5b for an emitter in the regions other than the region wherein silicide layer 21b is formed.

The parts of the configuration other than the above are approximately the same as in the above described configuration shown in FIG. 28 and, therefore, the same symbols are attached to the same members, of which the descriptions are omitted.

Figure 41:
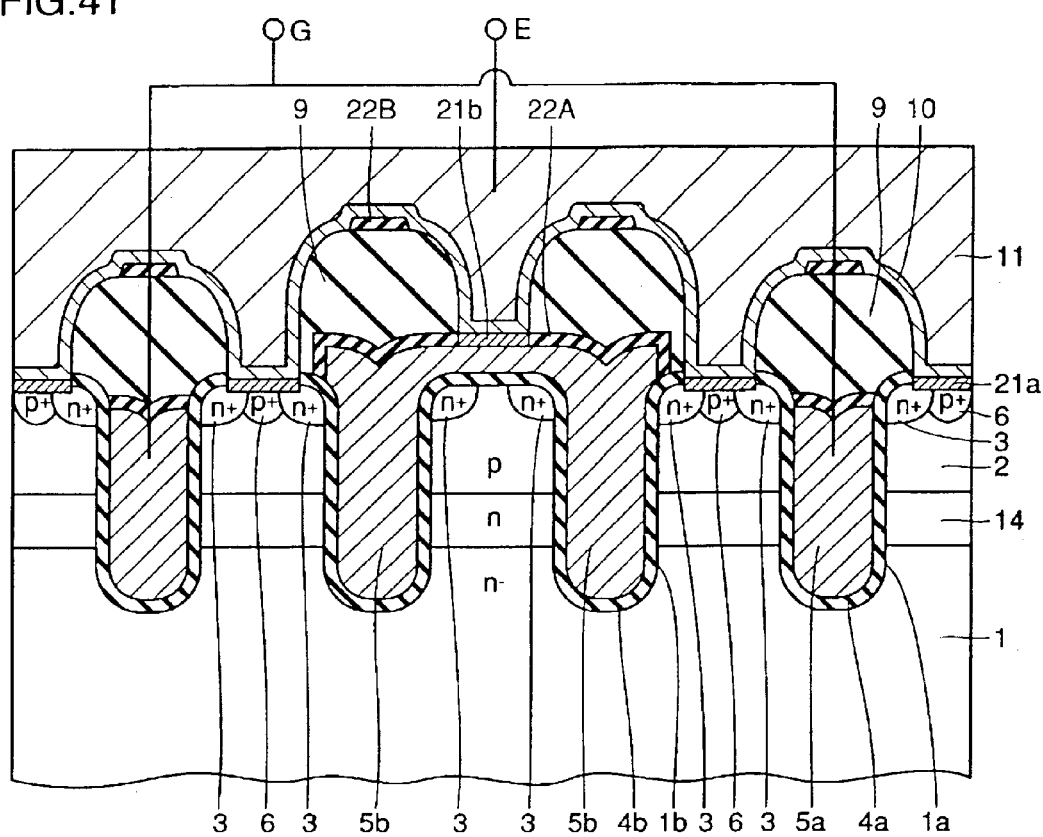

The configuration shown in FIG. 41 differs from the configuration shown in FIG. 40 in the point that n-type impurity diffusion region 3 is added to the two sidewalls of trench 1b for an emitter, which is in the first main surface.

Figure 42:
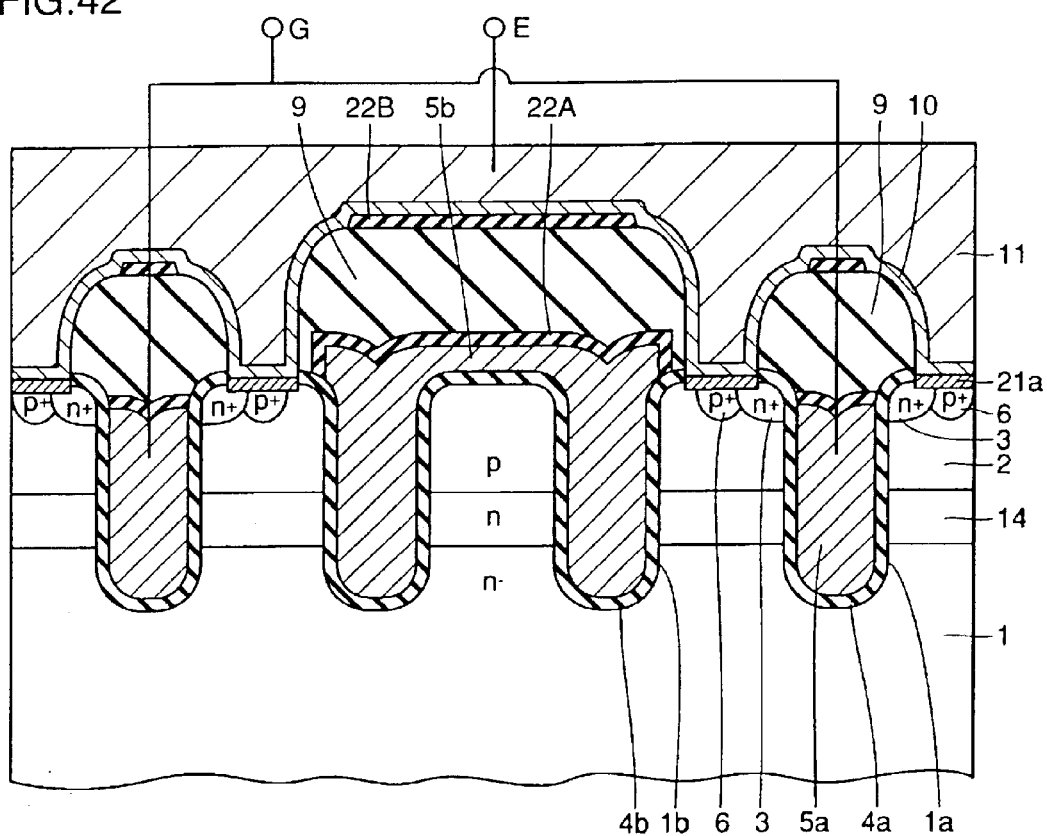

The configuration shown in FIG. 42 differs from the configuration in FIG. 40 in the point that conductive layer 5b that fills in trench 1b for an emitter becomes of a floating potential. In this case, insulating films 22A, 9 and 22B are formed over the entire surface of conductive layer 5b and conductive layer 5b is electrically isolated from emitter electrode 11.

Figure 43:
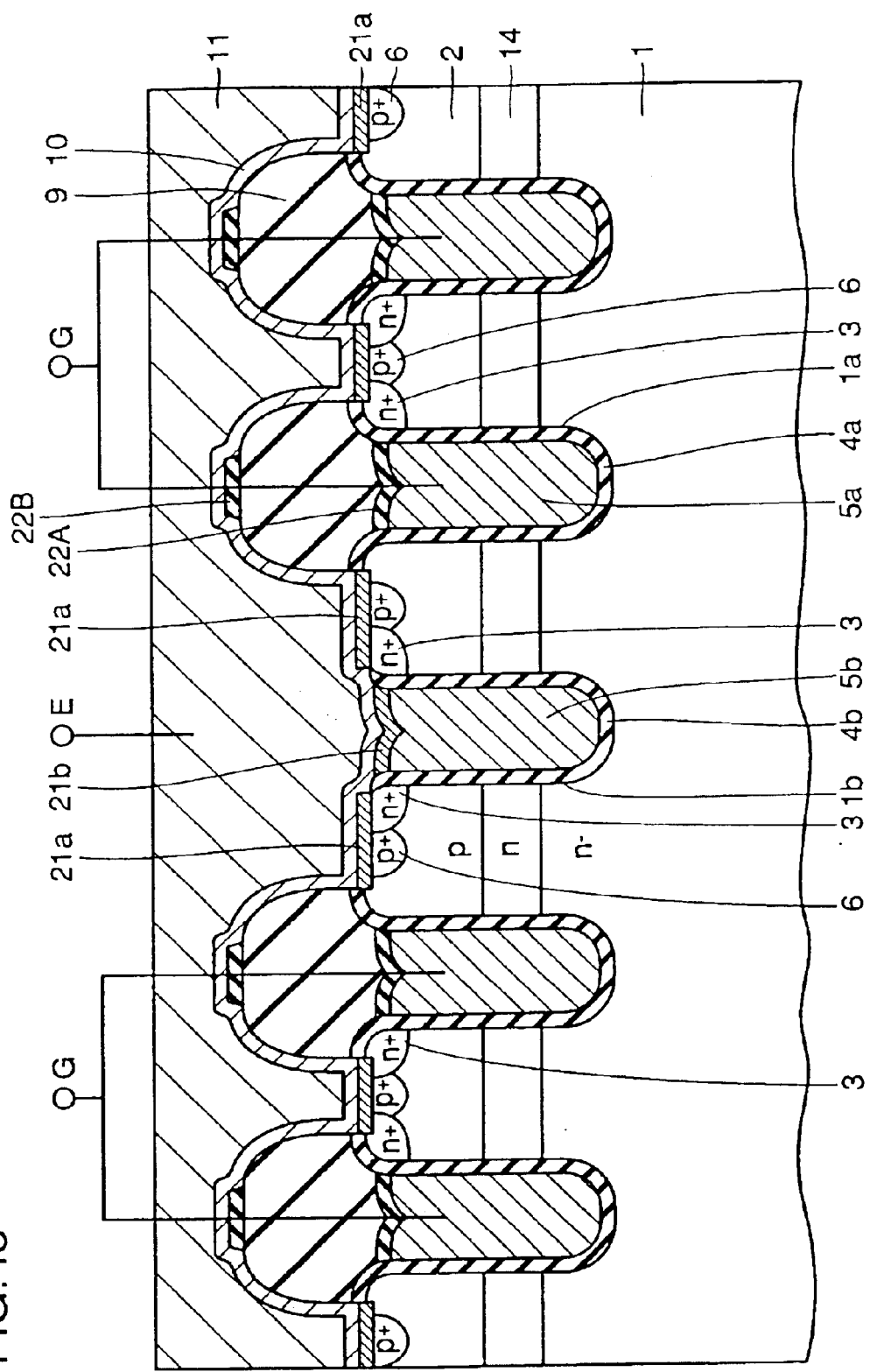

The configuration shown in FIG. 43 differs from the configuration shown in FIG. 39 in the point that n-type impurity diffusion region 3 is added to the two sidewalls of trench 1b for an emitter, which is in the first main surface.

Figure 44:
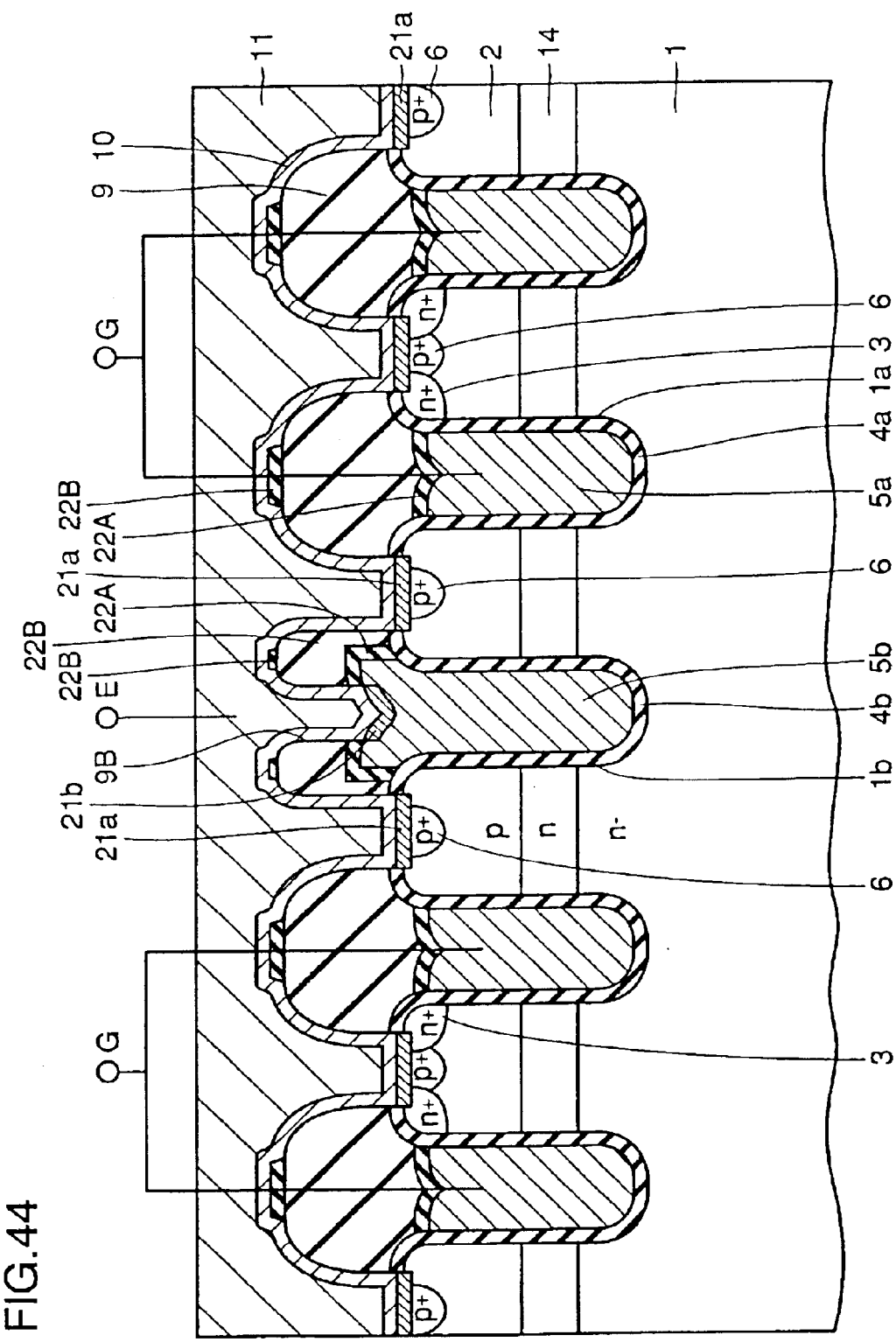

The configuration shown in FIG. 44 differs from the configuration shown in FIG. 39 in the point that the upper surface of conductive layer 5b for an emitter protrudes upwardly from trench 1b for an emitter. In this case, conductive layer 5b for an emitter is electrically connected to barrier metal layer 10 and to emitter electrode 11 via silicide layer 21b formed on a portion of the surface of the conductive layer. In addition, insulating films 22A, 9 and 22B are formed above conductive layer 5b for an emitter in the regions other than in the region on which silicide layer 21b is formed.

Figure 45:
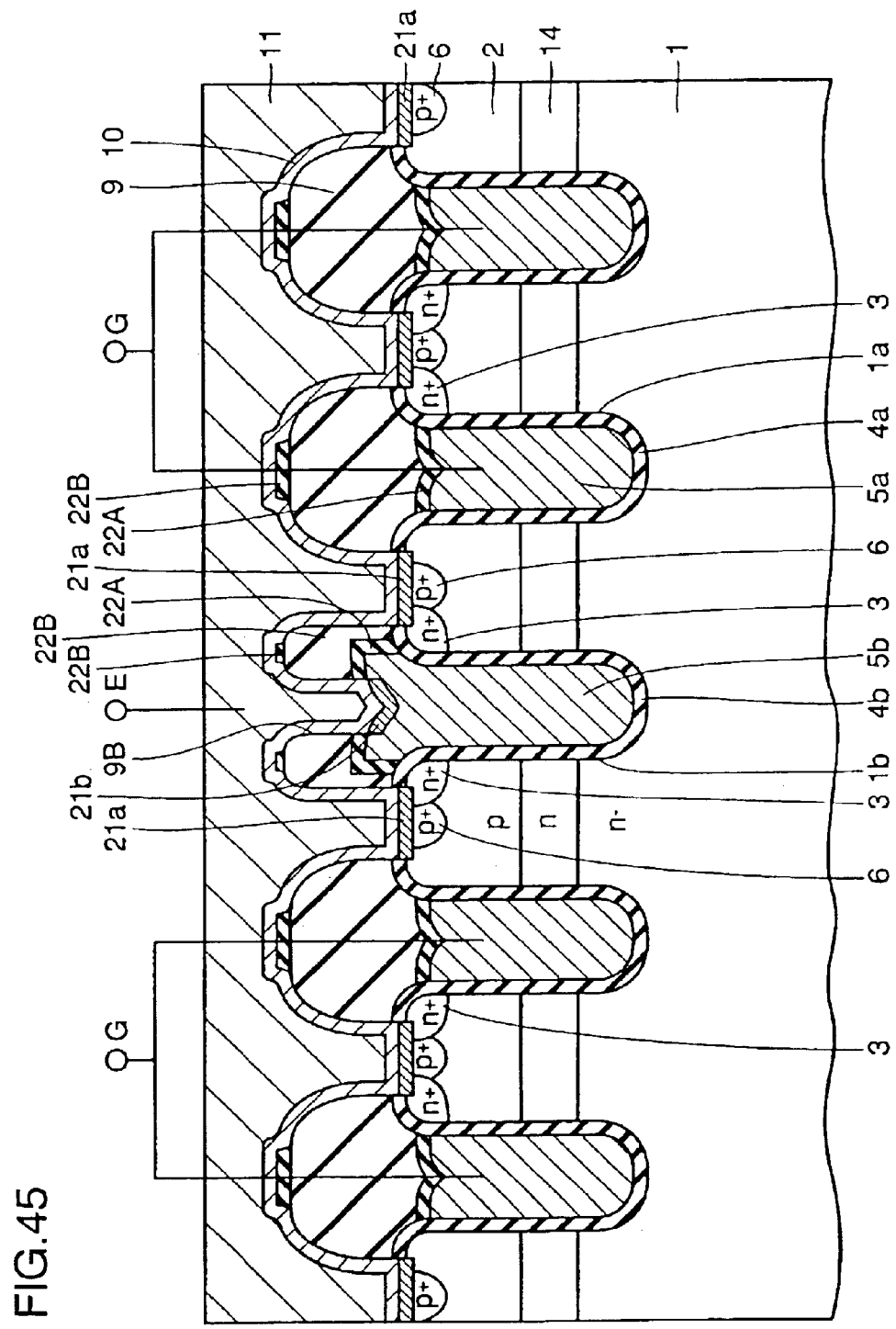

The configuration shown in FIG. 45 differs from the configuration shown in FIG. 44 in the point that n-type impurity diffusion region 3 is added to the two sides of trench 1b for an emitter, which is in the first main surface.

Figure 46:
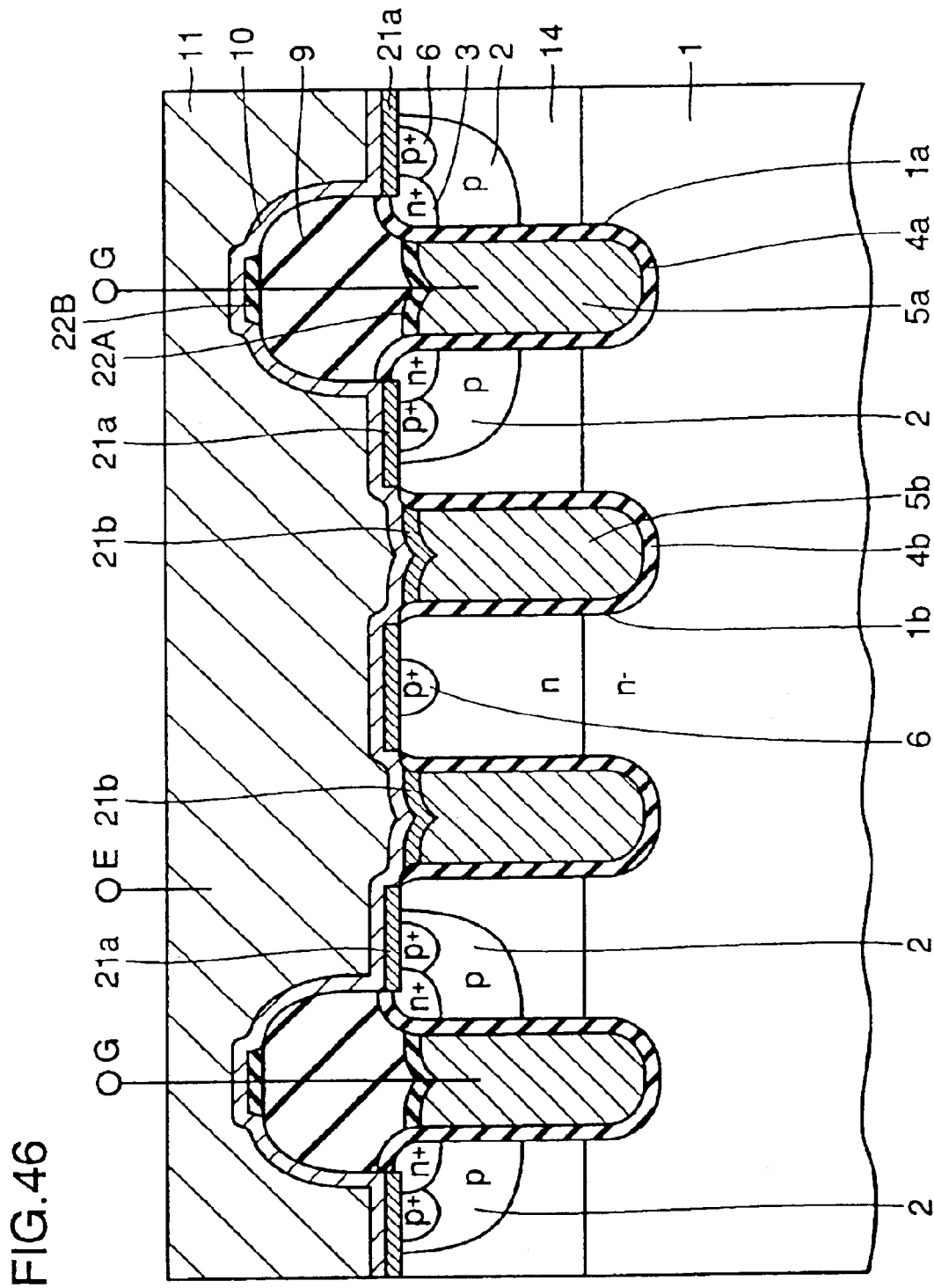

The configuration shown in FIG. 46 differs from the configuration shown in FIG. 28 in the point that p-type body region 2 is formed only in the vicinity of a sidewall of trench 1a for a gate.

Figure 47:
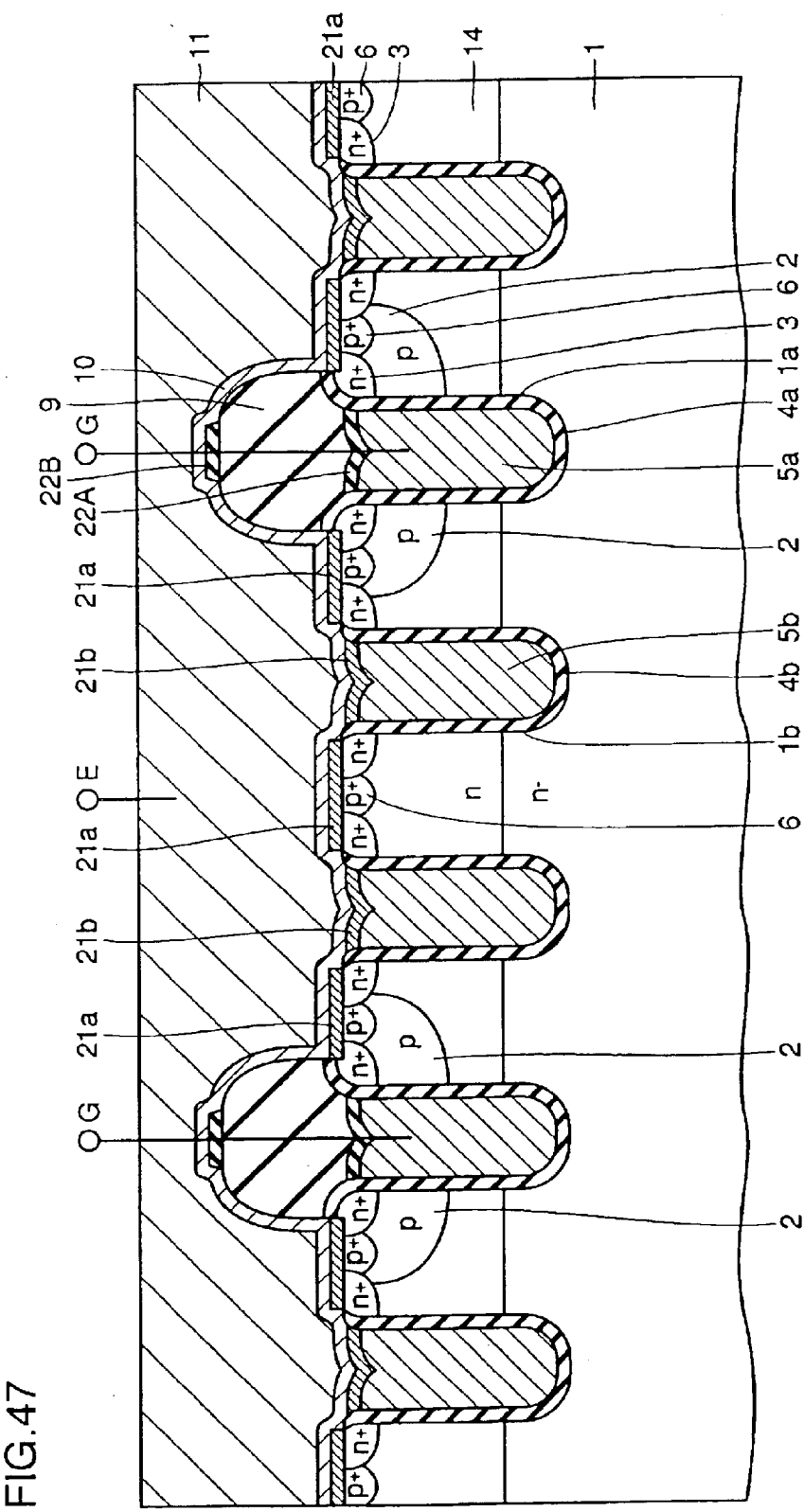

The configuration shown in FIG. 47 differs from the configuration shown in FIG. 30 in the point that p-type body region 2 is formed only in the vicinity of a sidewall of trench 1a for a gate.

Figure 48:
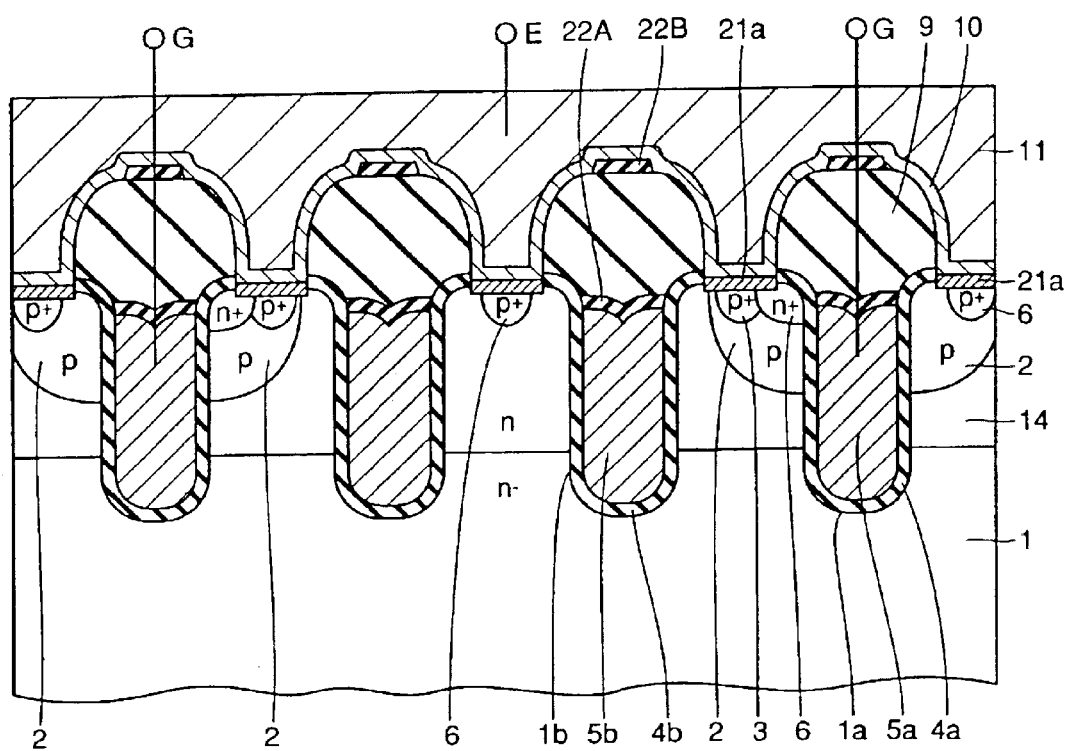

The configuration shown in FIG. 48 differs from the configuration shown in FIG. 46 in the point that conductive layer 5b that fills in trench 1b for an emitter becomes of a floating potential. In this case, insulating films 22A, 9 and 22B are formed above conductive layer 5b.

Figure 49:
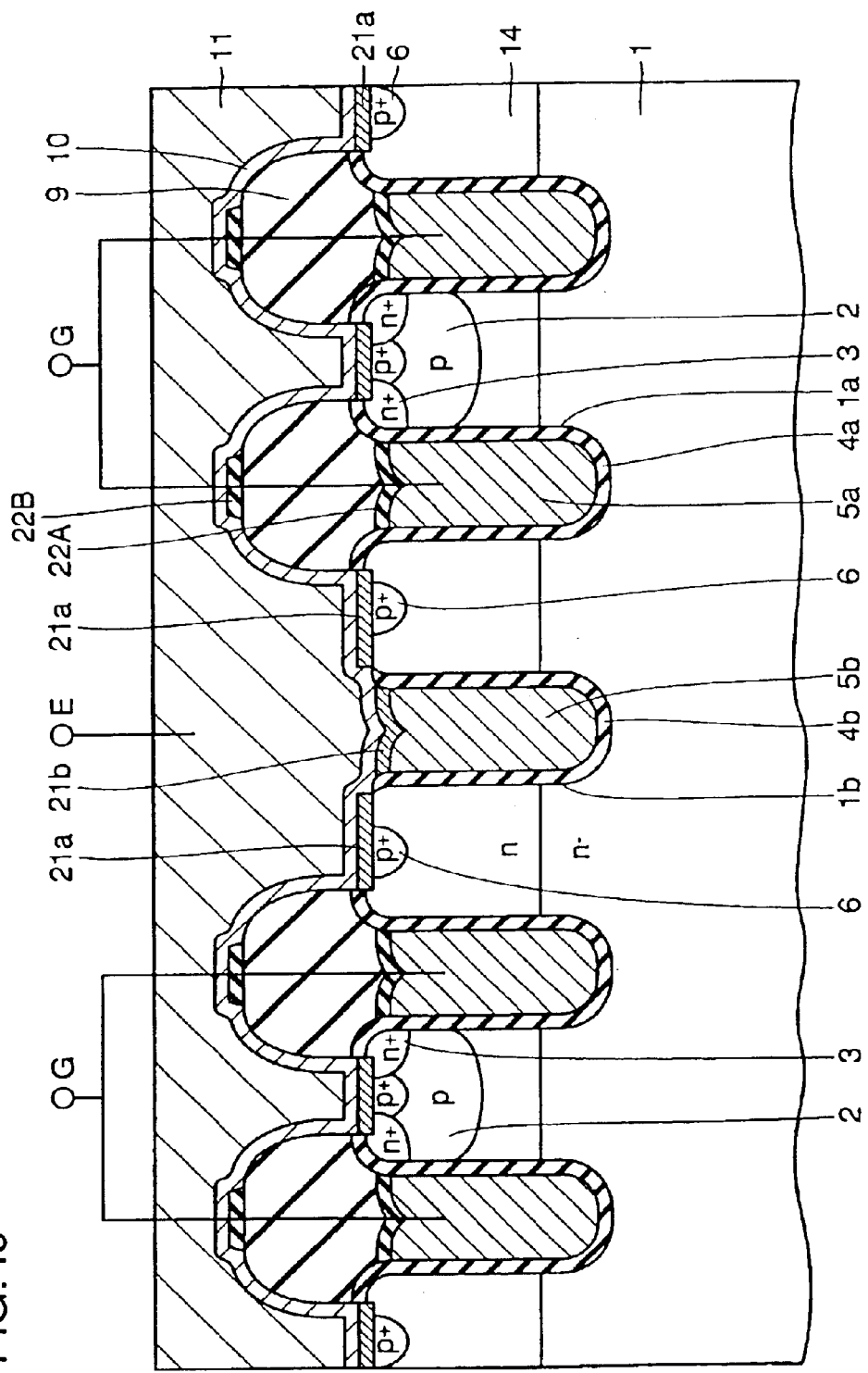

The configuration shown in FIG. 49 differs from the configuration shown in FIG. 39 in the point that p-type body region 2 is formed only in a region sandwiched between two gate trenches.

Figure 50:
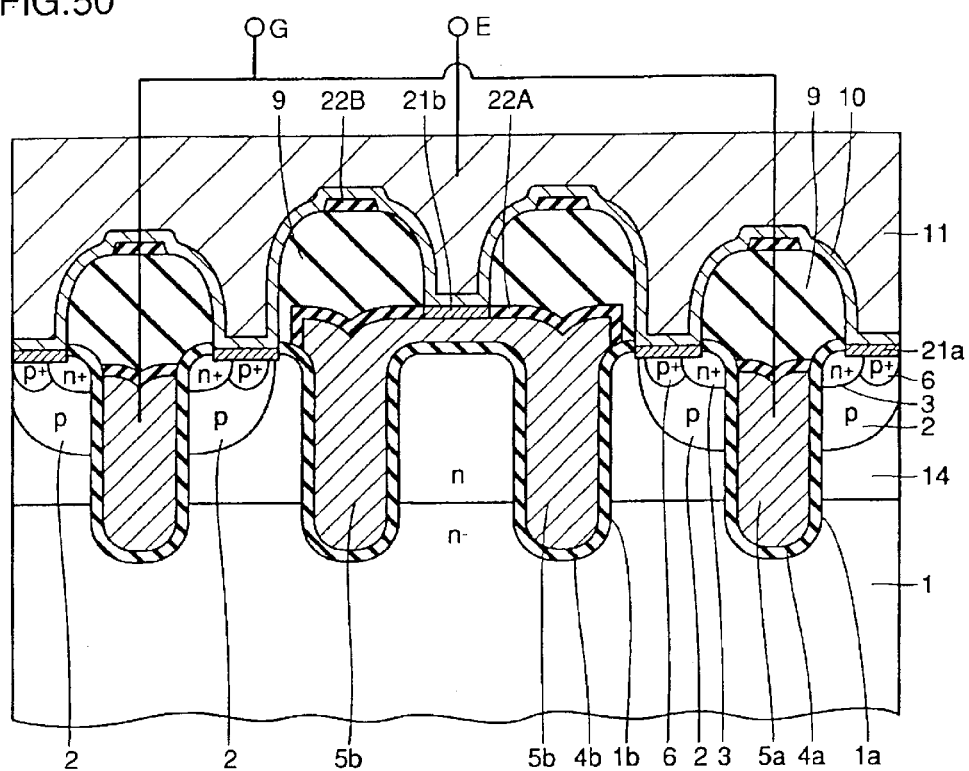

The configuration shown in FIG. 50 differs from the configuration shown in FIG. 40 in the point that p-type body region 2 is formed only in the vicinity of a sidewall of trench 1a for a gate.

Figure 51:
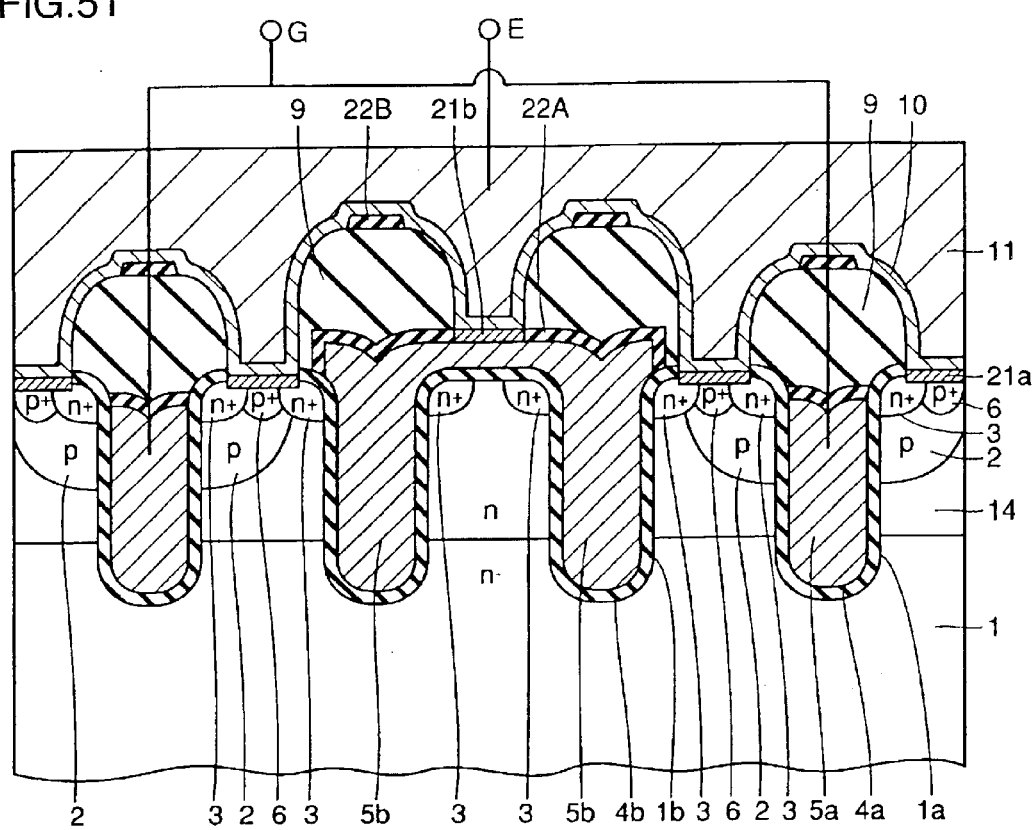

The configuration shown in FIG. 51 differs from the configuration shown in FIG. 41 in the point that p-type body region 2 is formed only in the vicinity of a sidewall of trench 1a for a gate.

Figure 52:
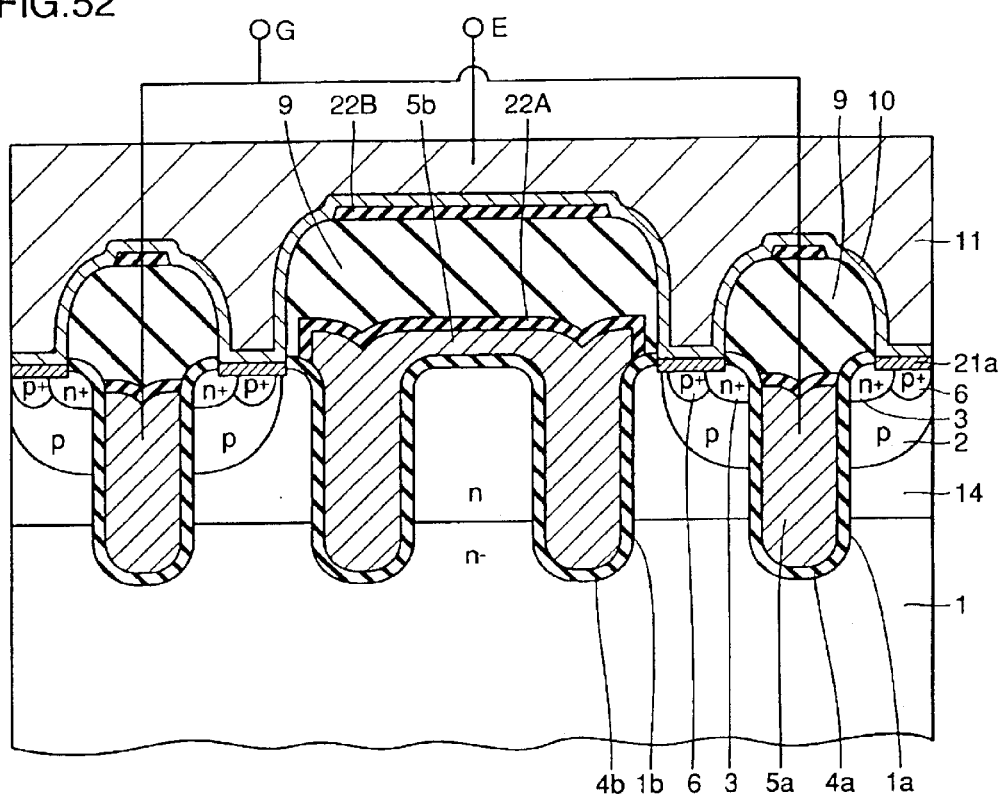

The configuration shown in FIG. 52 differs from-the configuration shown in FIG. 42 in the point that p-type body region 2 is formed only in the vicinity of a sidewall of trench 1a for a gate.

Figure 53:
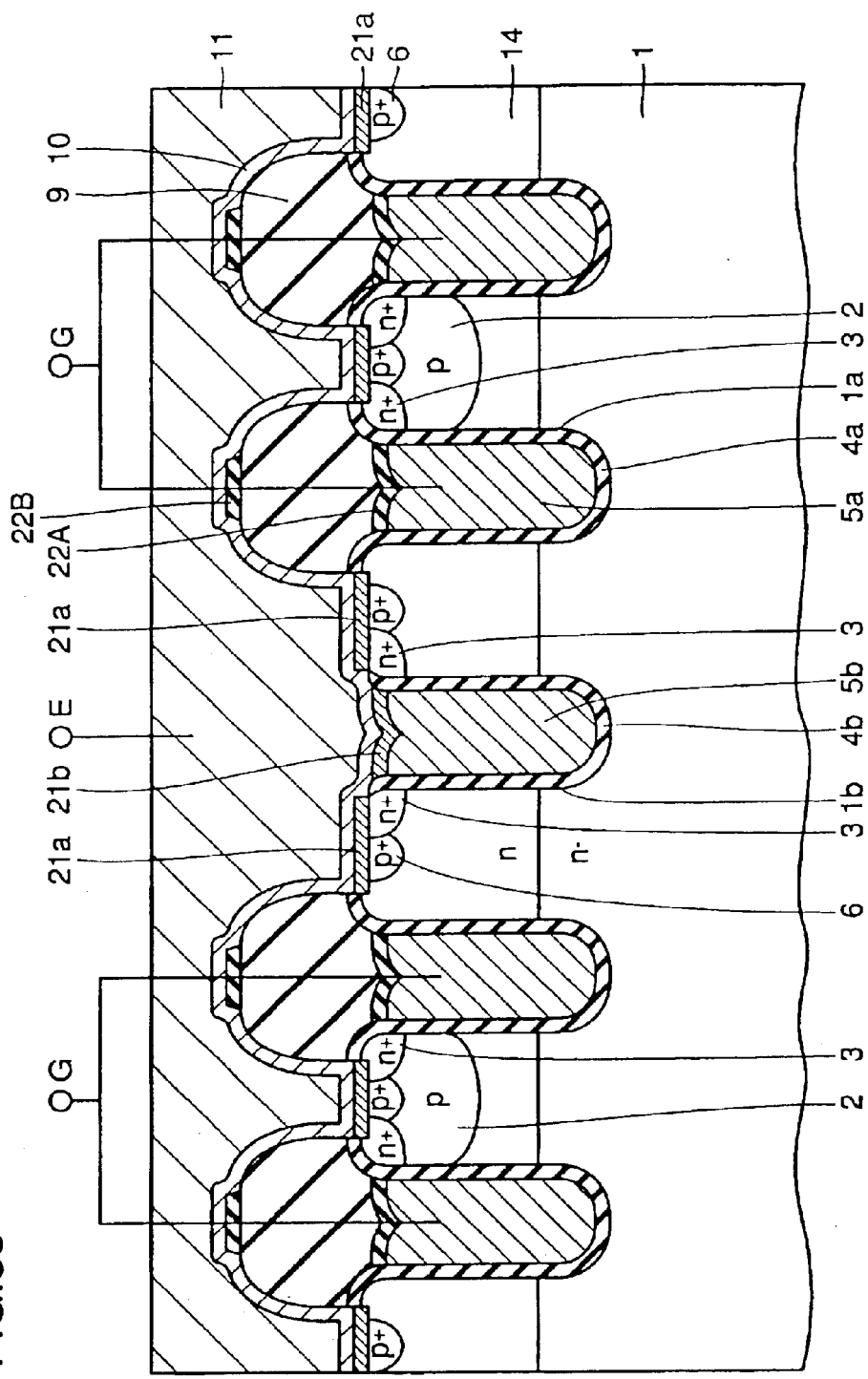

The configuration shown in FIG. 53 differs from the configuration shown in FIG. 49 in the point that n-type impurity diffusion region 3 is added to the two sidewalls of trench 1b for an emitter, which is in the first main surface.

Figure 54:
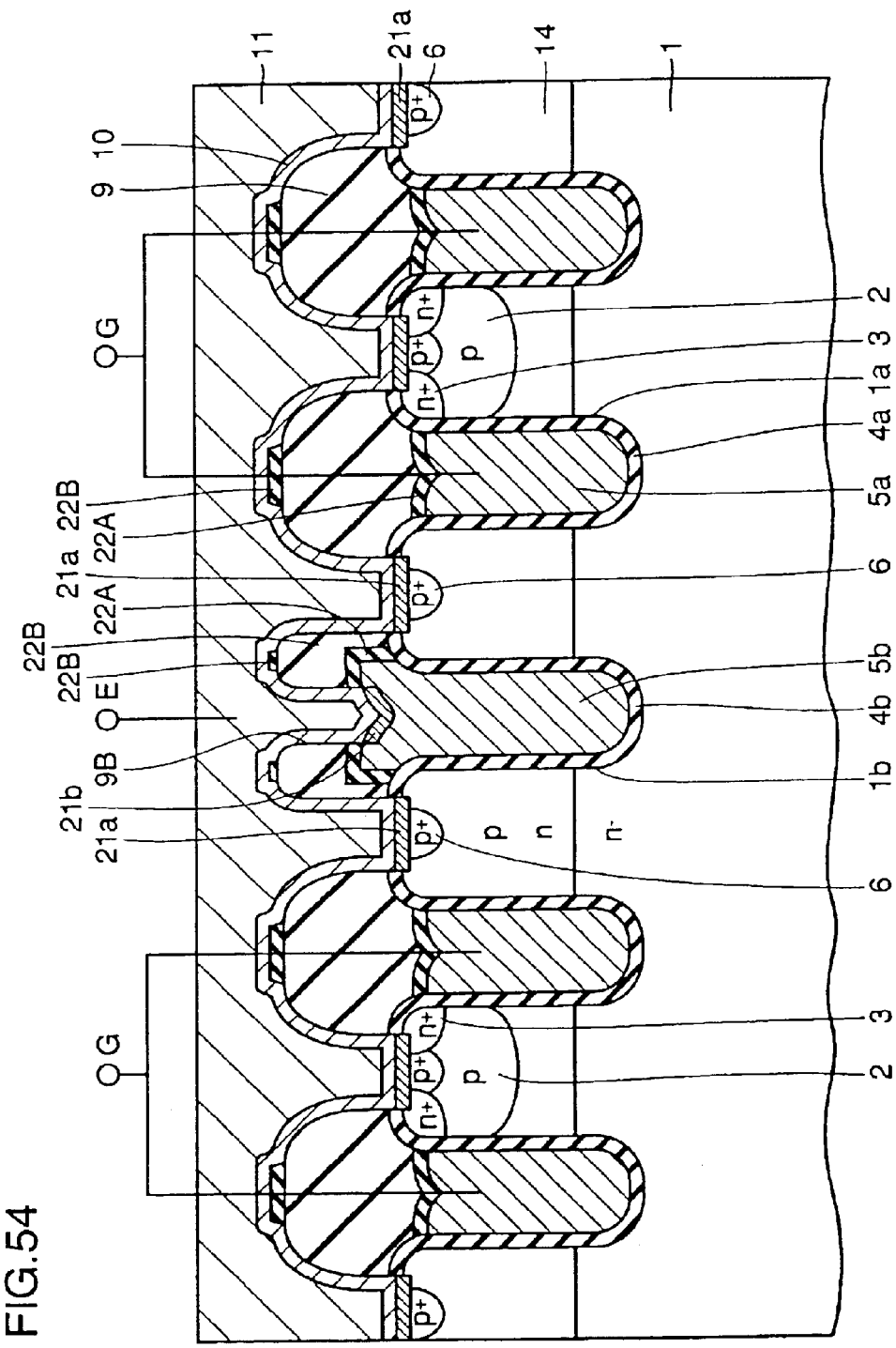

The configuration shown in FIG. 54 differs from the configuration shown in FIG. 44 in the point that p-type body region 2 is formed only in a region sandwiched between two gate trenches.

Figure 55:
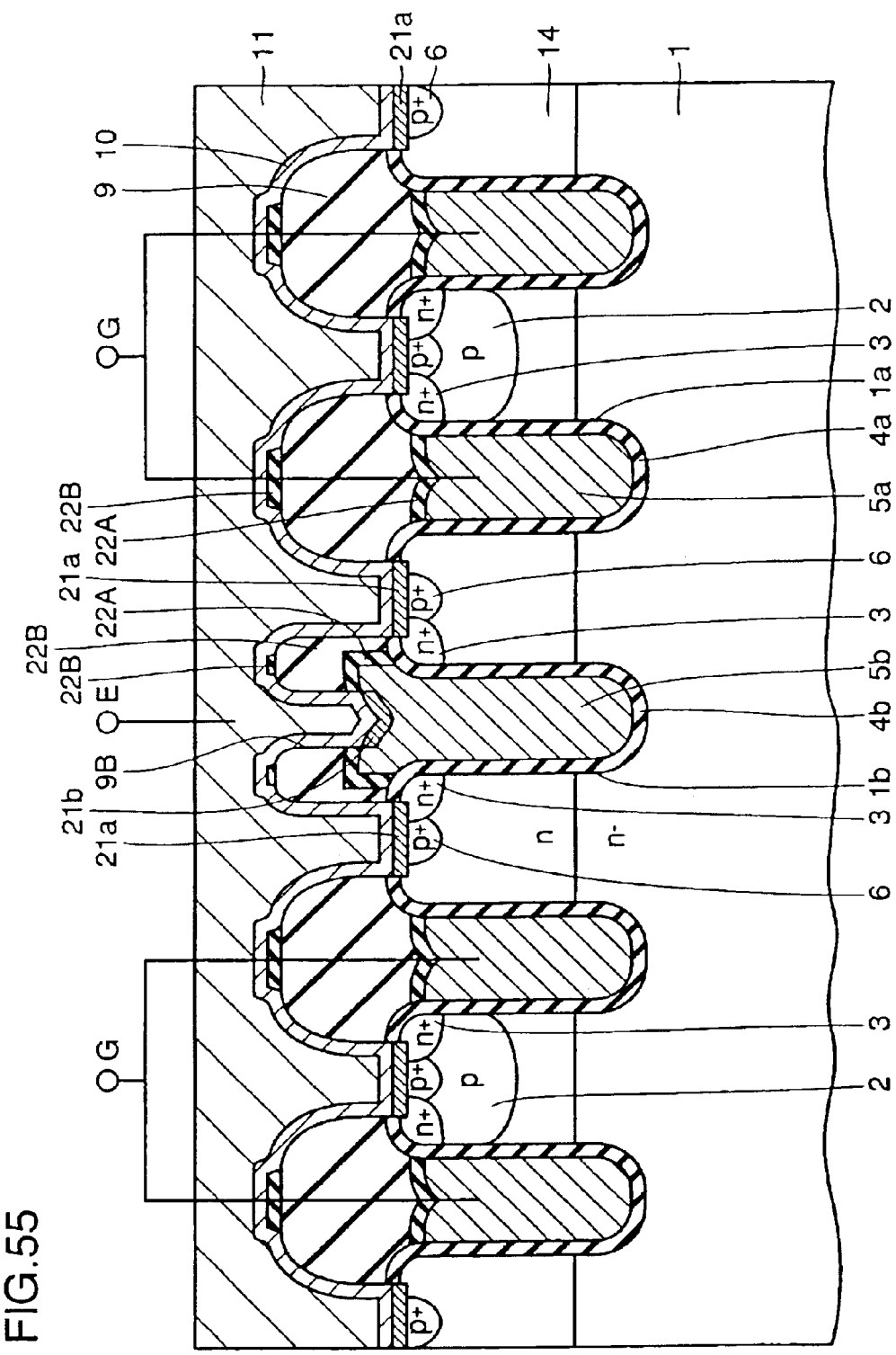

The configuration shown in FIG. 55 differs from the configuration shown in FIG. 45 in the point that p-type body region 2 is formed only in a region sandwiched between two gate trenches.

Figure 56:
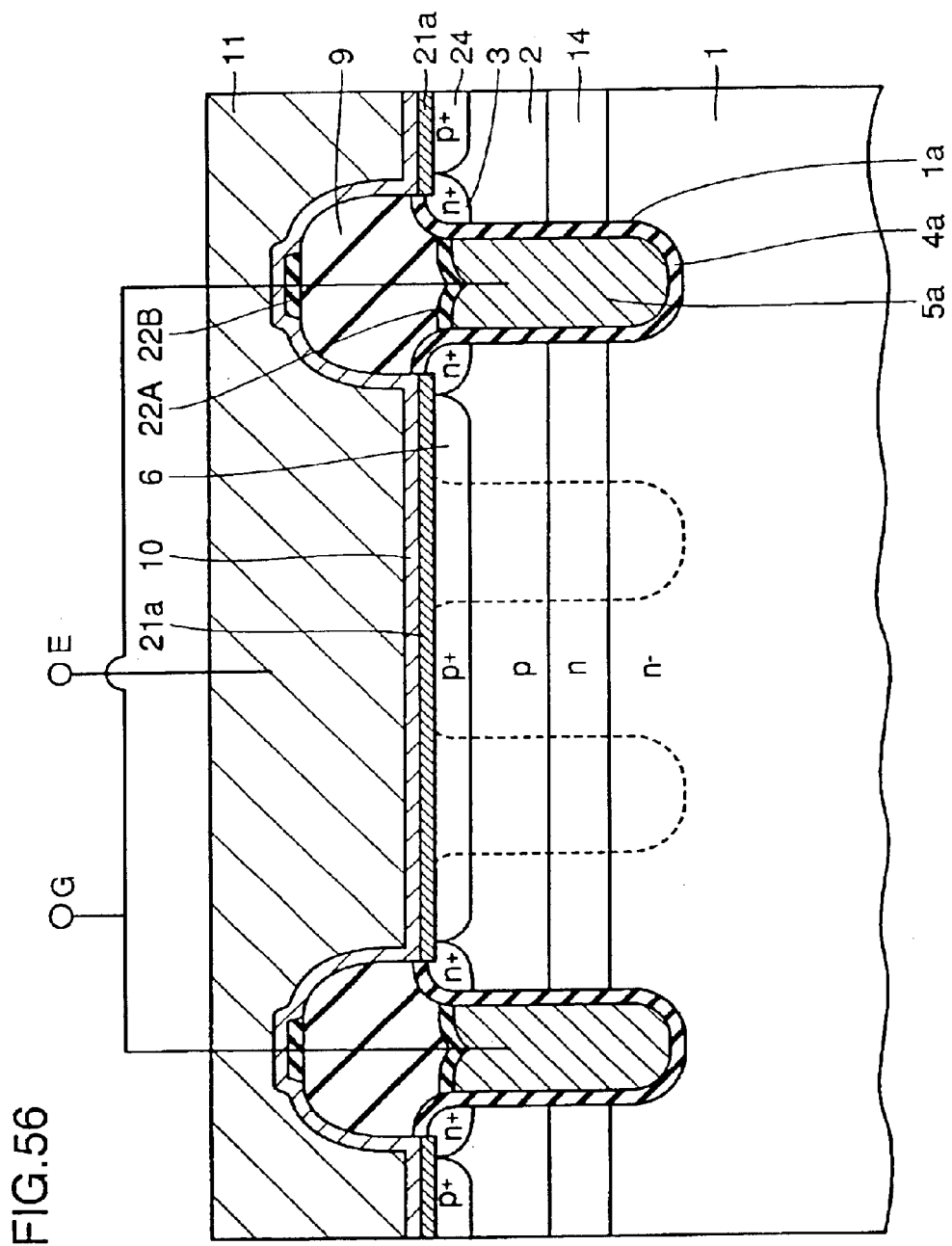

The configuration shown in FIG. 56 is a configuration wherein a gate trench is formed so that the gate width (W) becomes the same as in the above described MOS transistor structures E to G instead of creating a trench in a region wherein the emitter trench exists in FIG. 28, that is to say, a configuration wherein the width between the gate trenches is expanded to an arbitrary dimension so as to be of the emitter potential.

In this case, $p^+$ impurity diffusion region 6 for forming a low resistance contact with the p-type body region extends within the first main surface sandwiched between two gate trenches. Silicide layer 21a is formed so as to contact this $p^+$ impurity diffusion region 6 and n-type emitter region 3. $p^+$ impurity diffusion region 6 and n-type emitter region 3 are electrically connected to emitter electrode 11 via this silicide layer 21a and barrier metal layer 10.

Here, the parts of the configuration other than the above are approximately the same as in the above described configuration shown in FIG. 28 and, therefore, the same symbols are attached to the same members, of which the descriptions are omitted.

Figure 57:
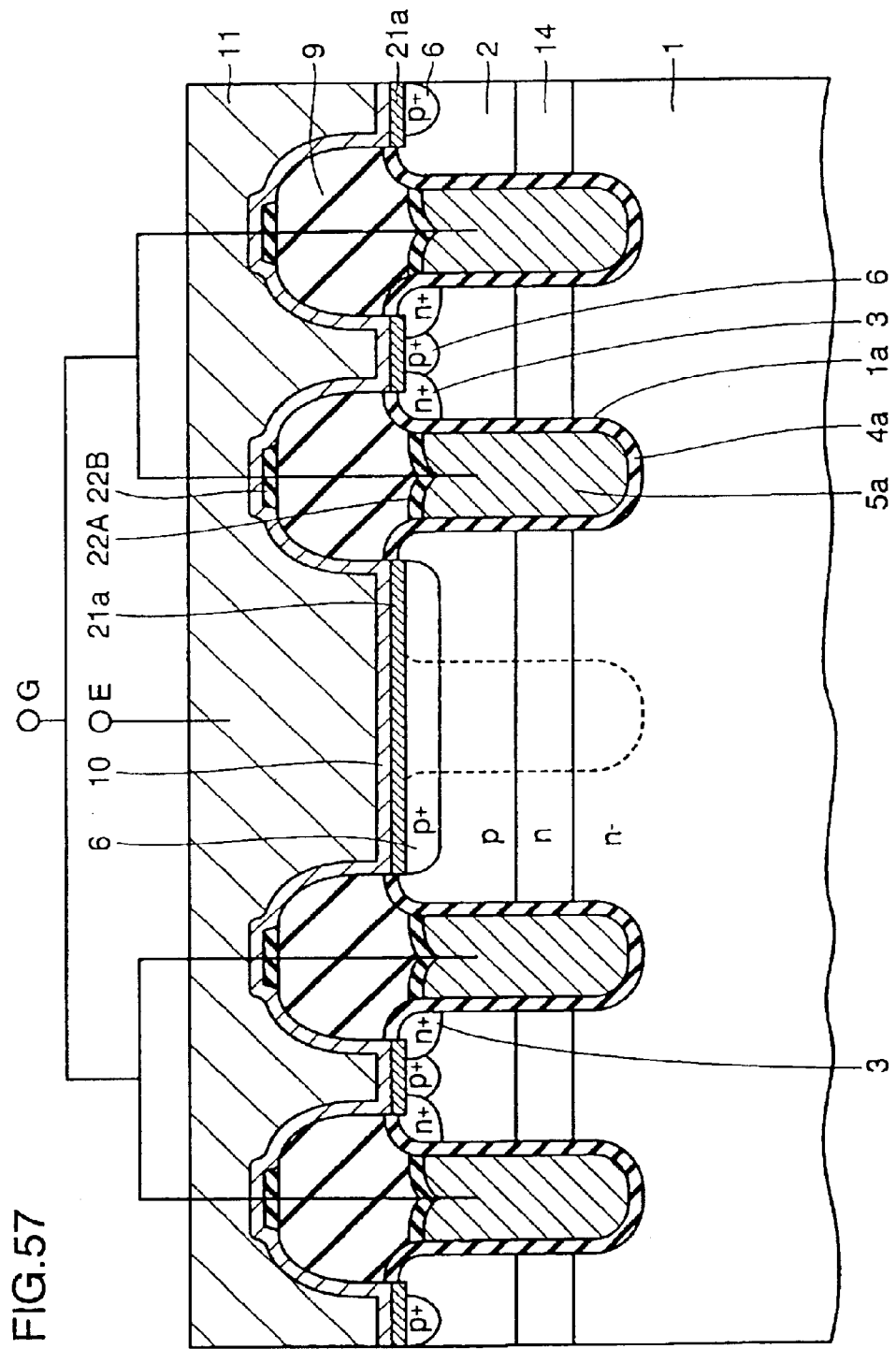

The configuration shown in FIG. 57 is a configuration wherein a gate trench is formed so that the gate width (W) becomes the same as in the above described MOS transistor structures E to G instead of creating a trench in a region wherein the emitter trench exists in FIG. 39, that is to say, a configuration wherein the width between the gate trenches is expanded to an arbitrary dimension so as to be of the emitter potential.

In this configuration also, $p^+$ impurity diffusion region 6 for forming a low resistance contact with the p-type body region extends within the first main surface sandwiched between gate trenches. Silicide layer 21a is formed so as to contact this p+ impurity diffusion region 6 and n-type emitter region 3. p+ impurity diffusion region 6 and n-type emitter region 3 are electrically connected to emitter electrode 11 via this silicide layer 21a and barrier metal layer 10.

Here, the parts of the configuration other than the above are approximately the same as in the above described configuration shown in FIG. 39 and, therefore, the same symbols are attached to the same members, of which the descriptions are omitted.

Figure 58:
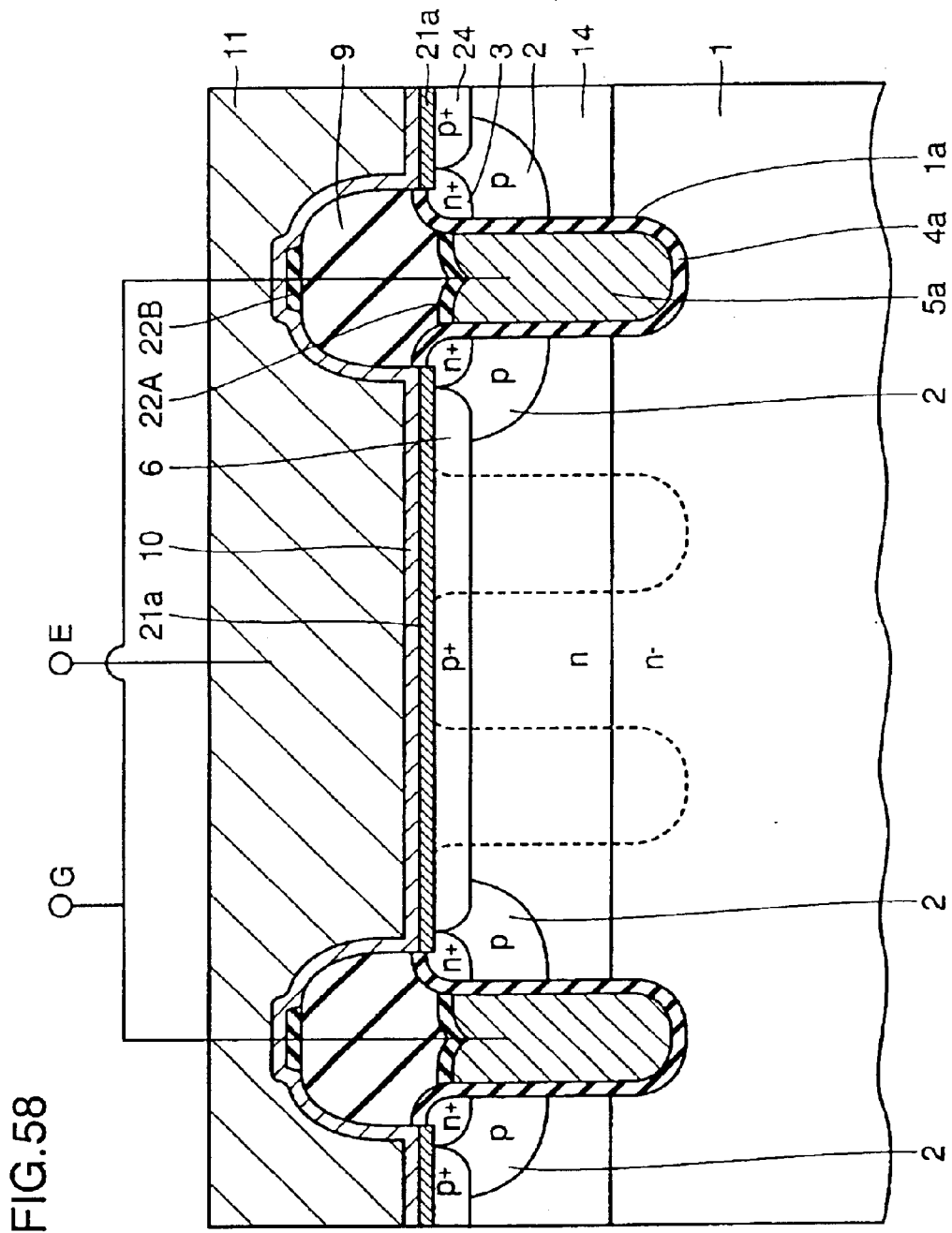

FIG. 58 differs from the configuration shown in FIG. 56 in the point that p-type body region 2 is formed only in the vicinity of a sidewall of trench 1a for a gate.

Figure 59:
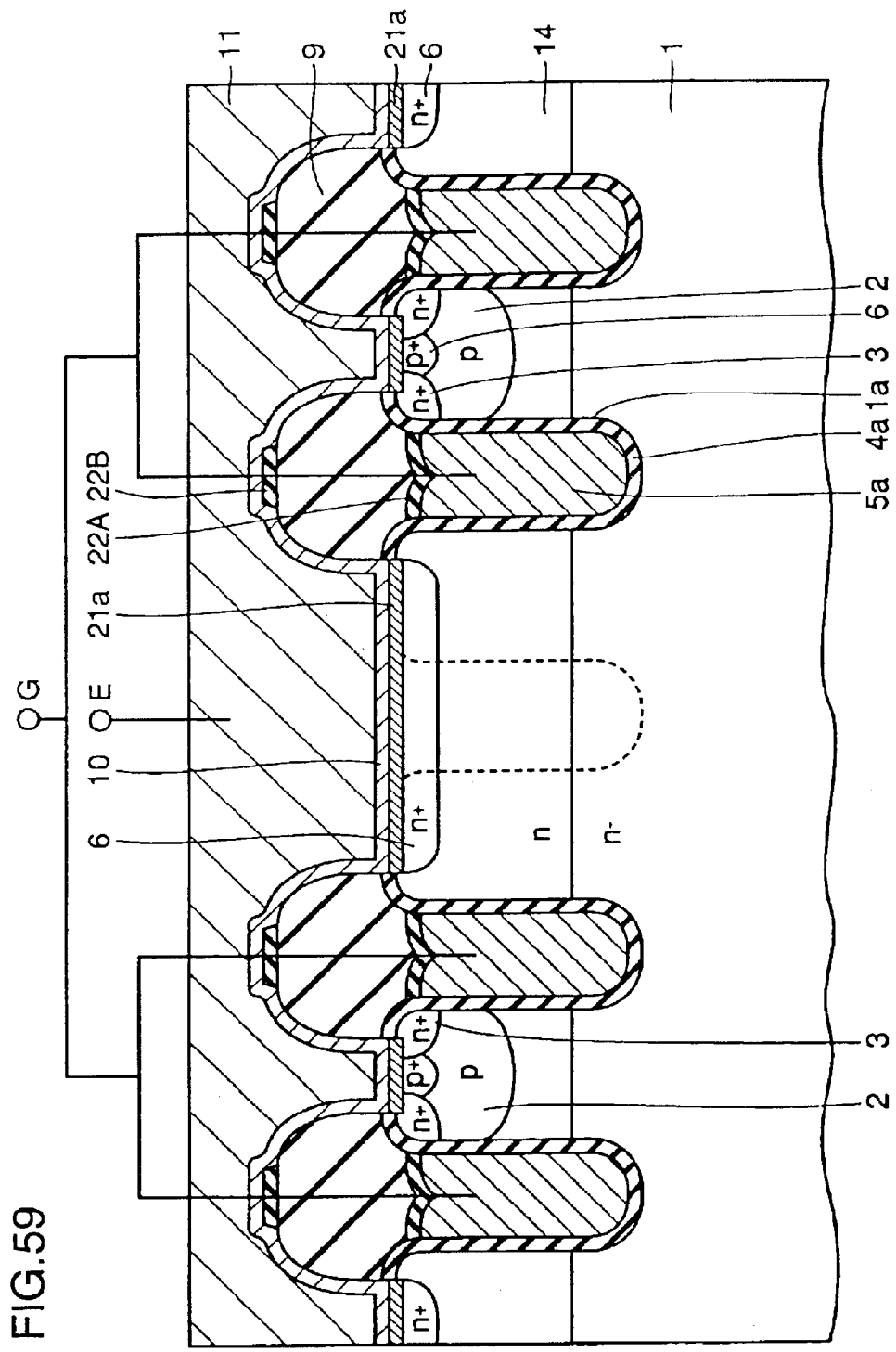

The configuration shown in FIG. 59 differs from the configuration shown in FIG. 57 in the point that p-type body region 2 is formed only in a region sandwiched between two gate trenches.

Though in the above a case is described wherein the upper surface of gate electrode 5a is positioned within trench 1a for a gate, it may protrude above trench 1a for a gate. The configuration wherein the upper surface of gate electrode 5a protrudes above upper surface of trench 1a for a gate is shown in FIGS. 60 to 70.

Figure 60:
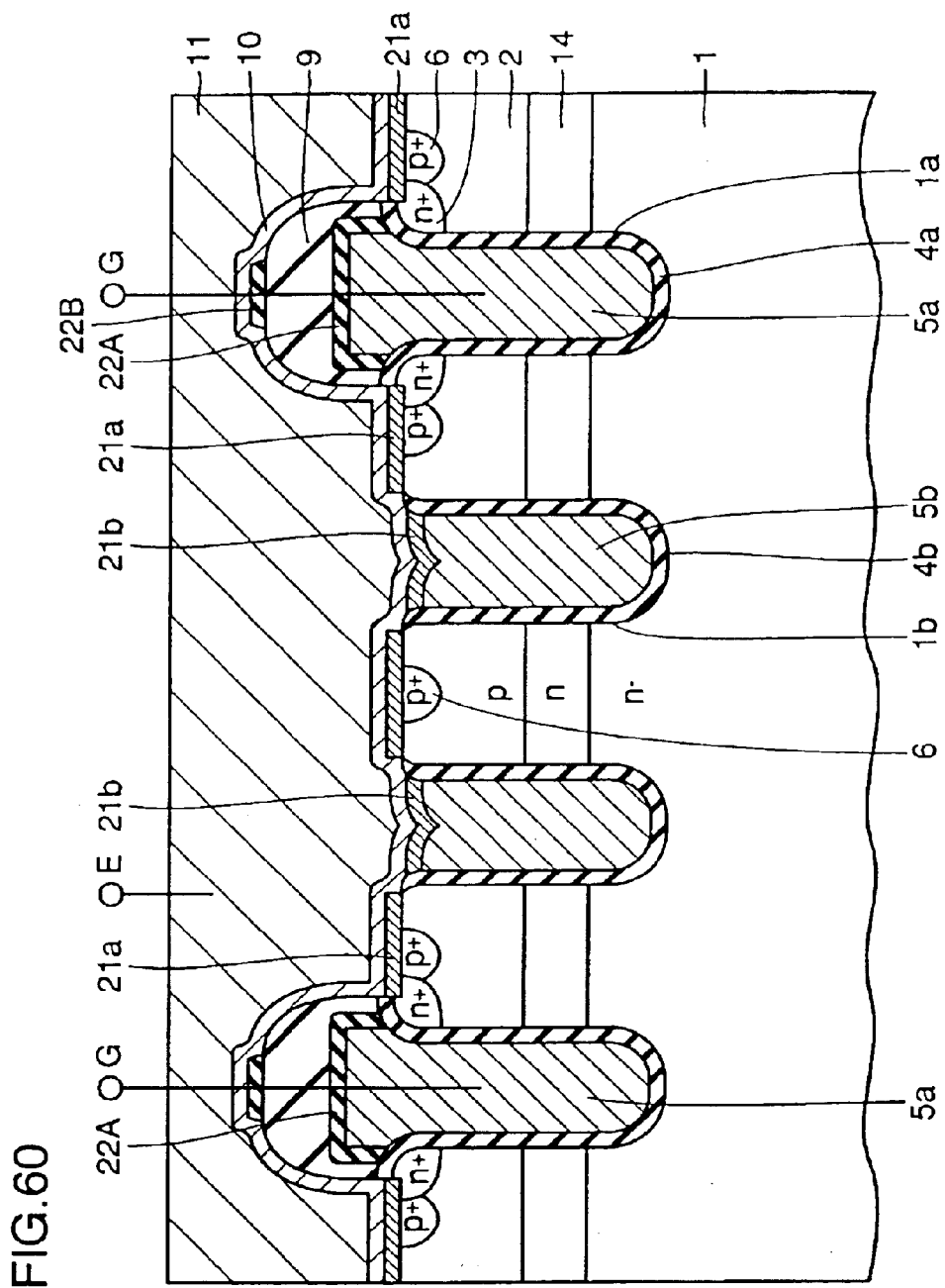
Figure 61:
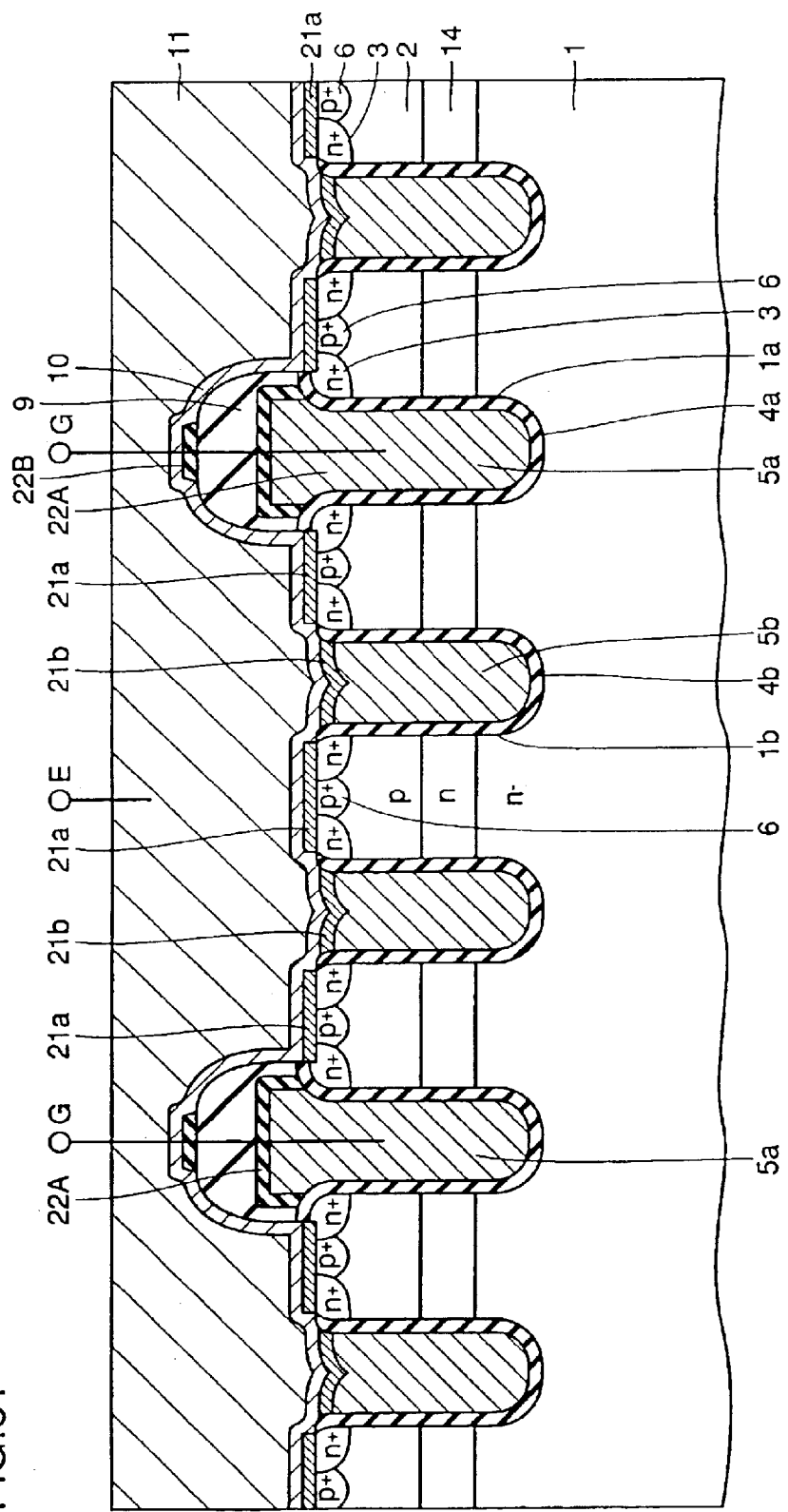
Figure 62:
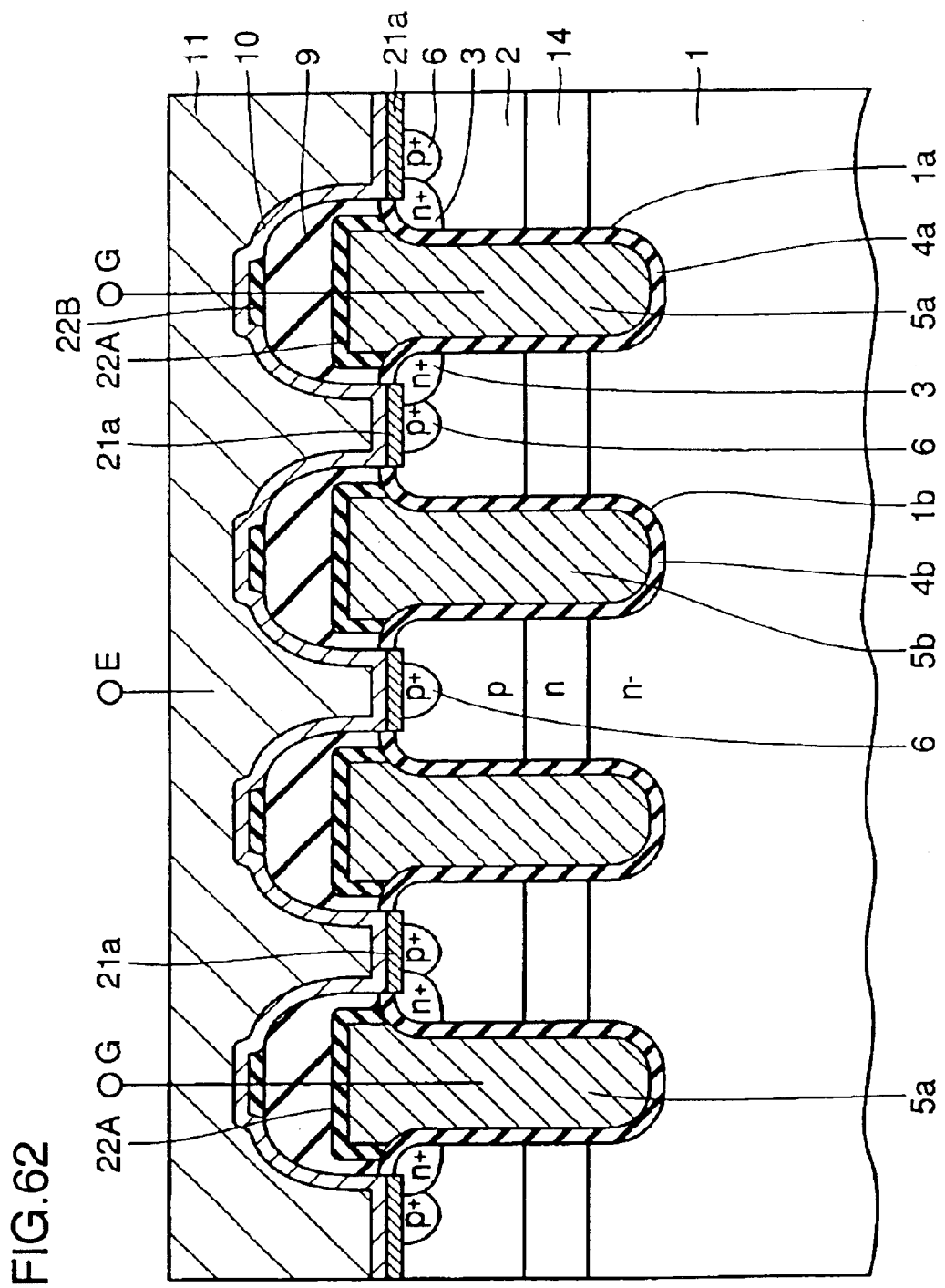
Figure 63:
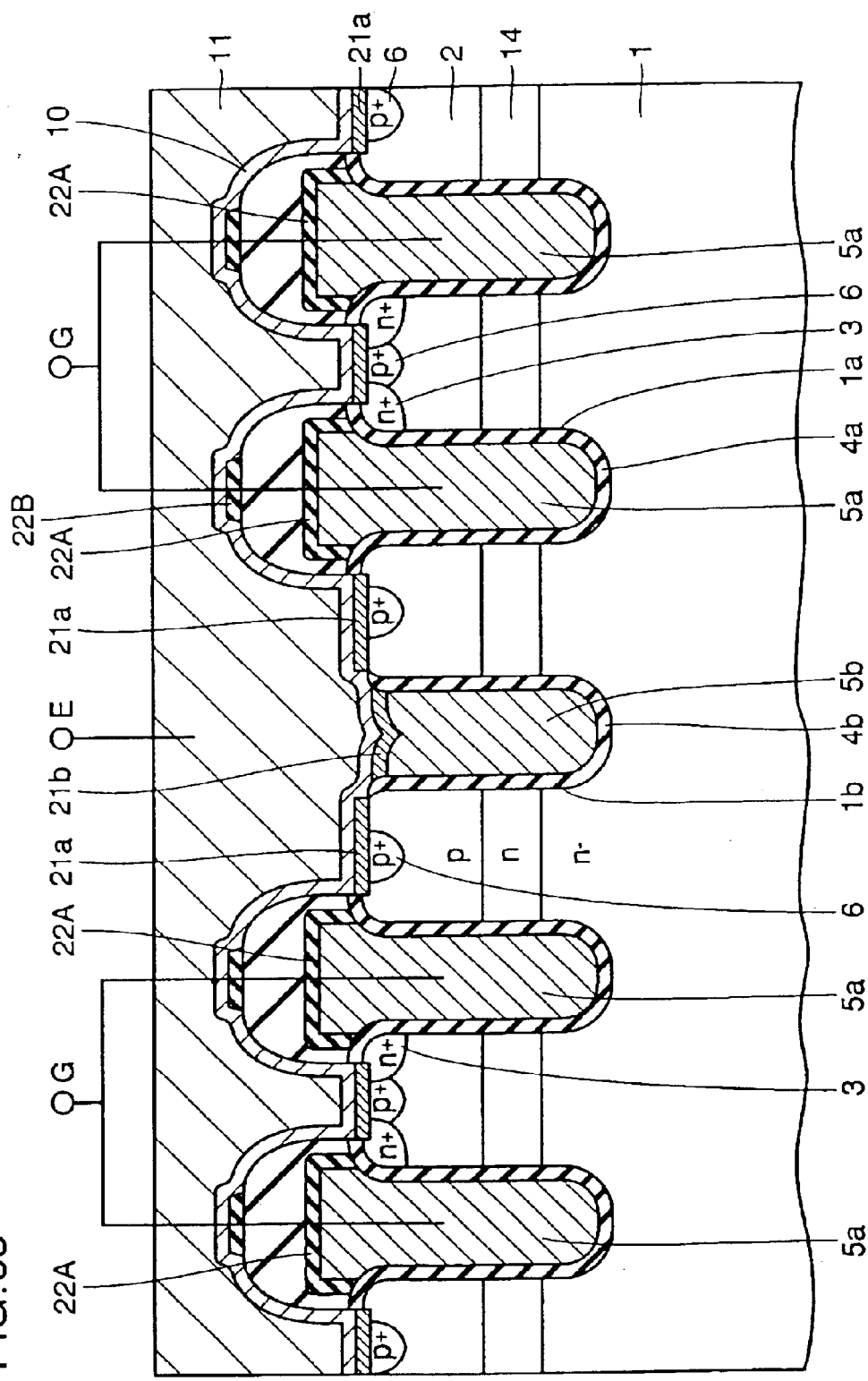
Figure 64:
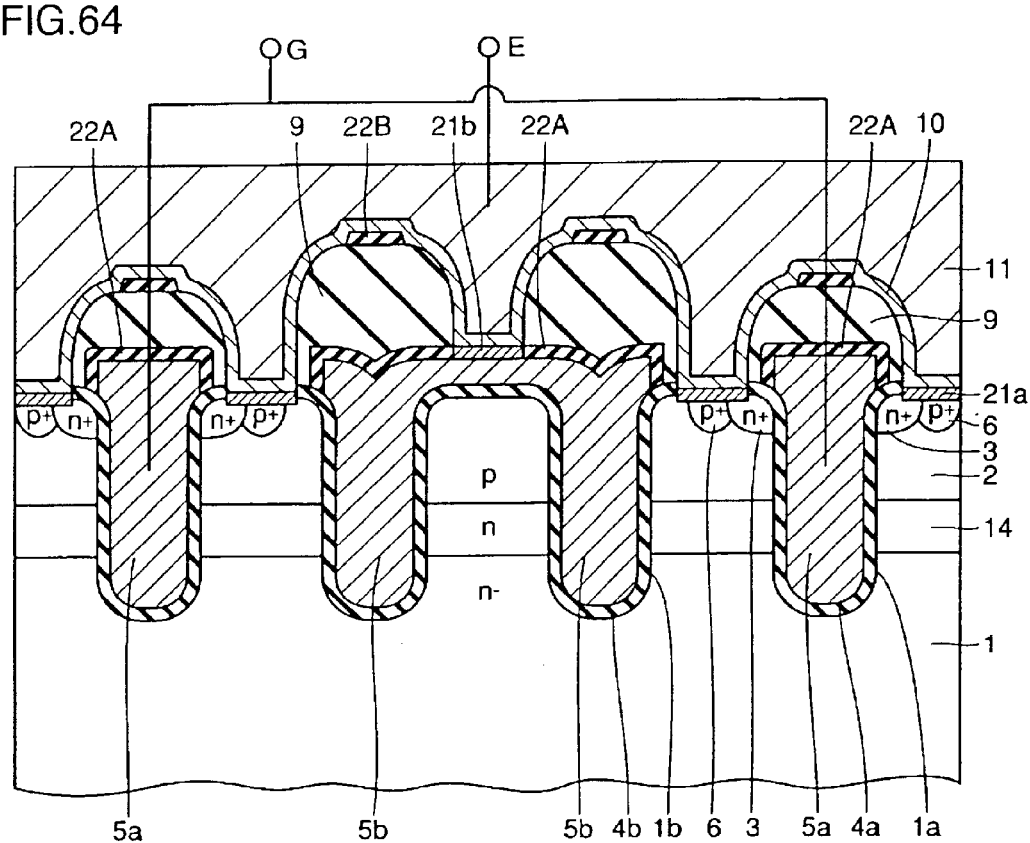
Figure 65:
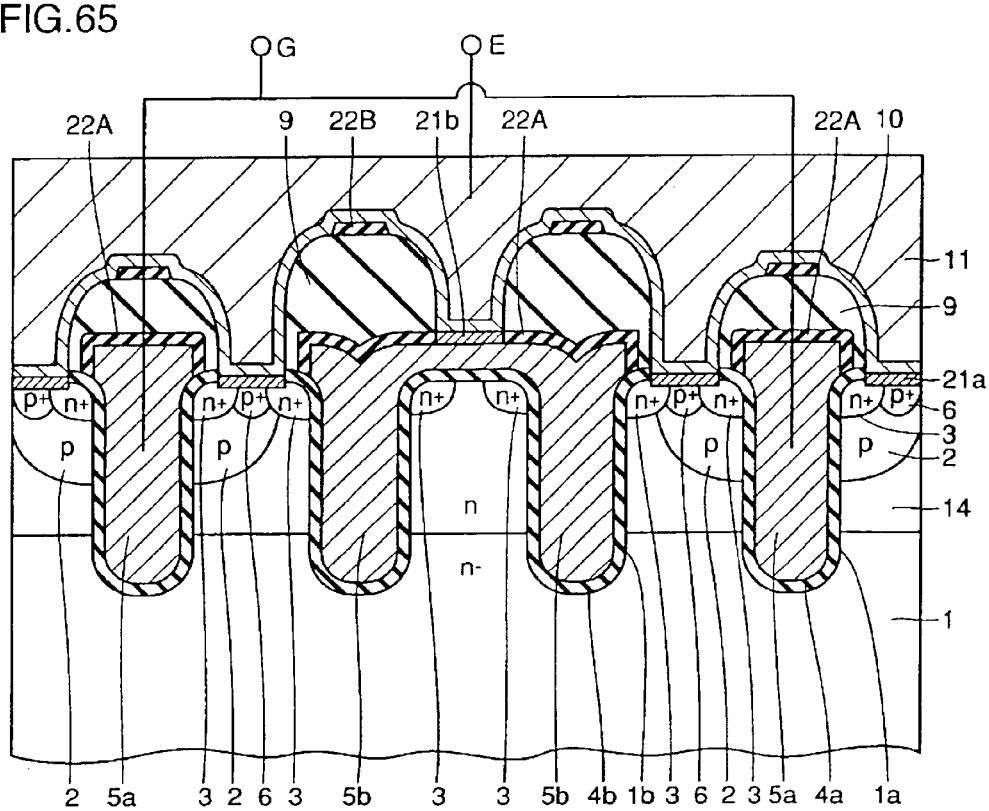
Figure 66:
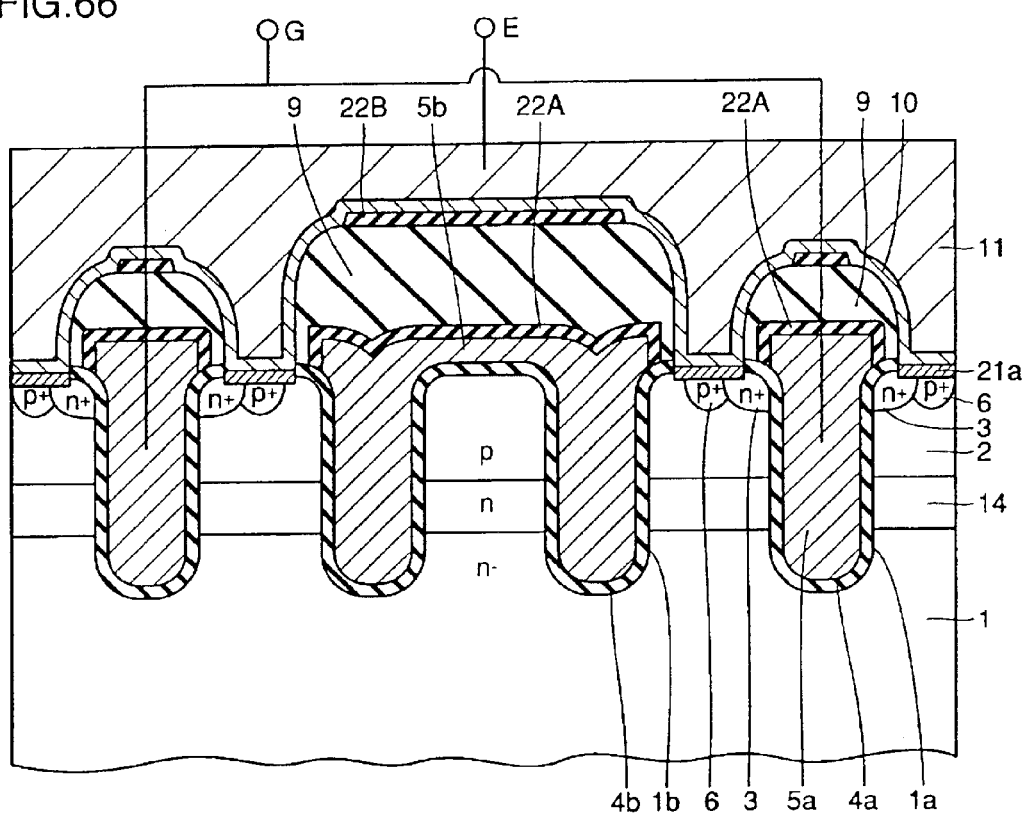
Figure 67:
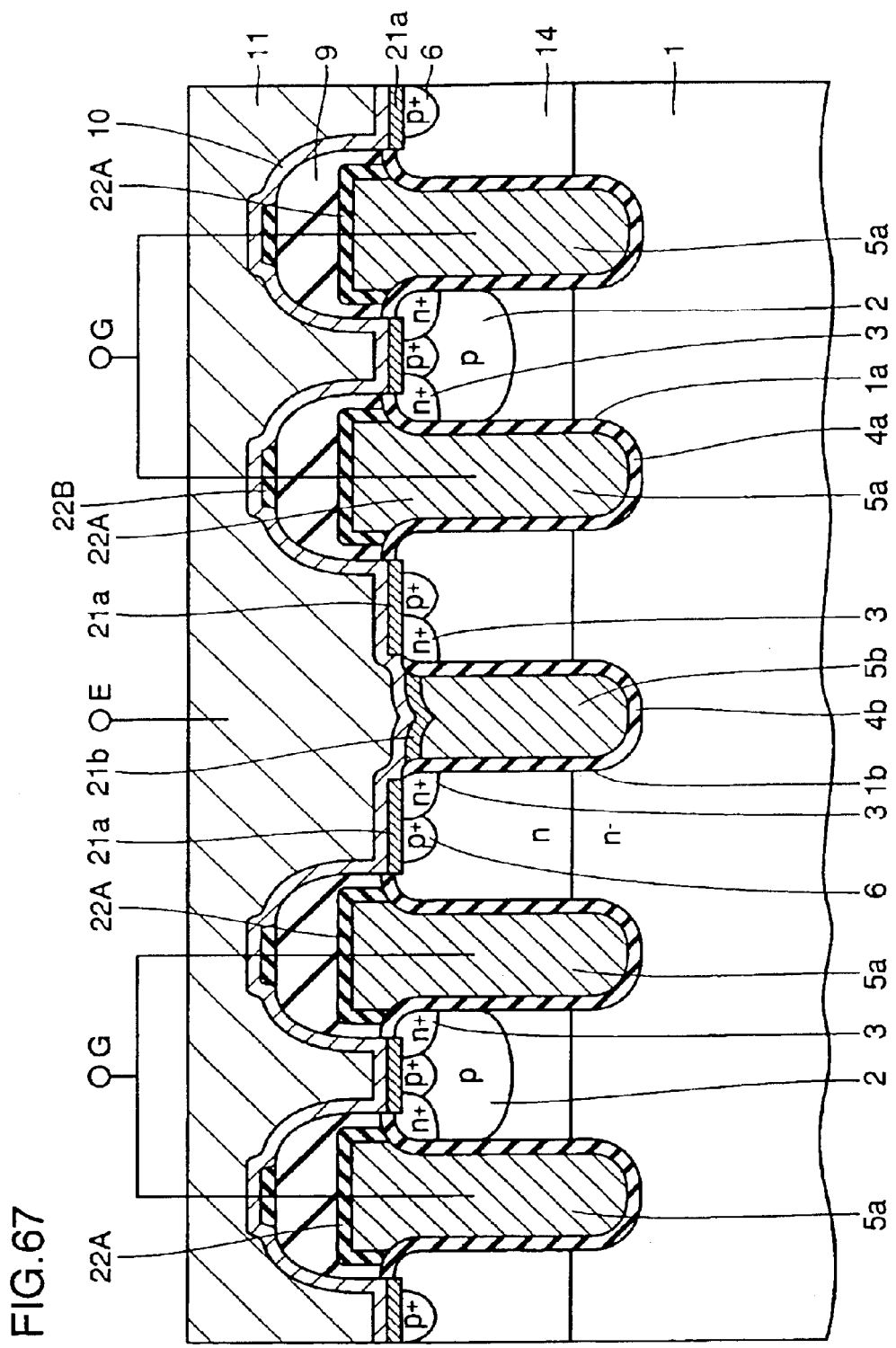
Figure 68:
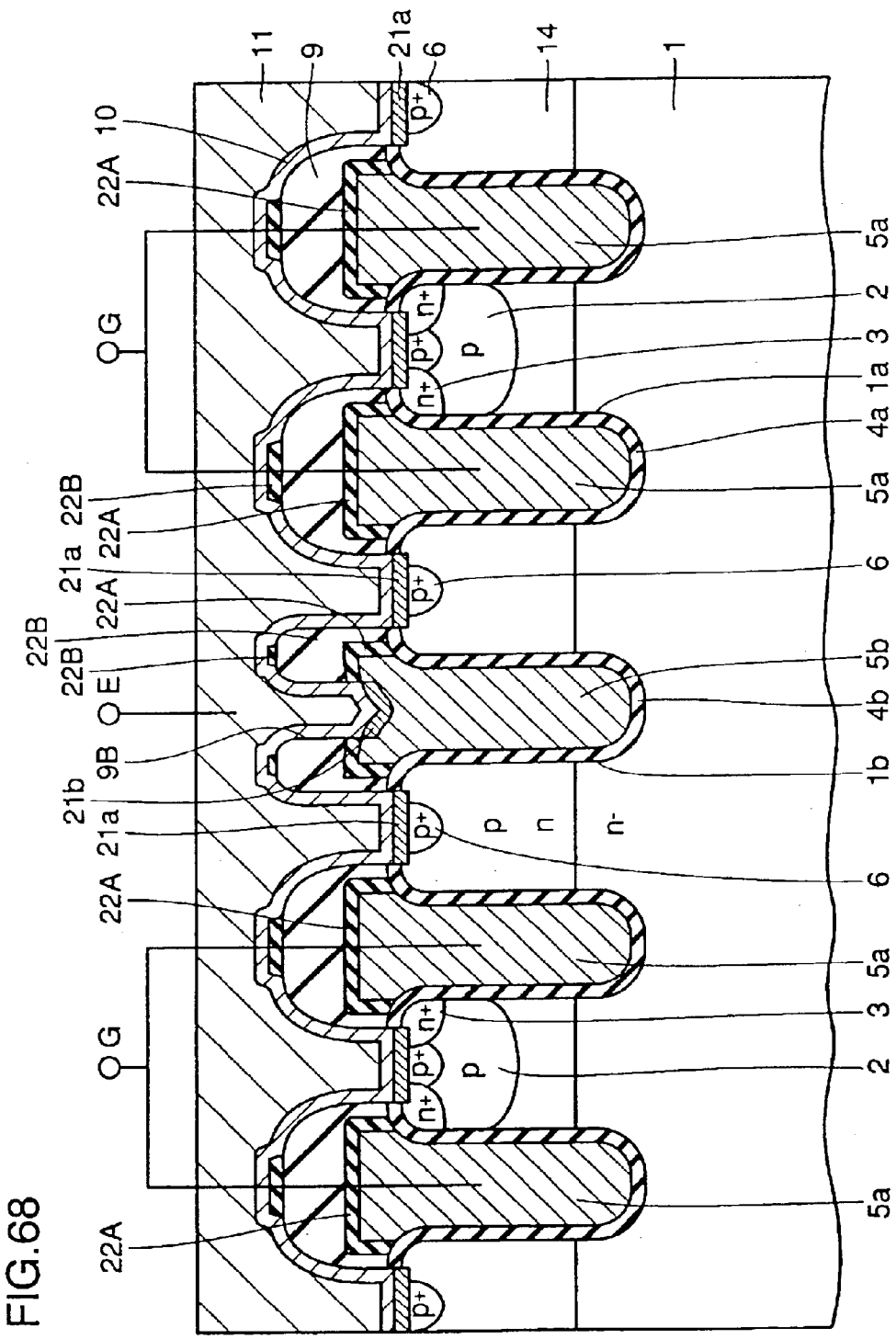
Figure 69:
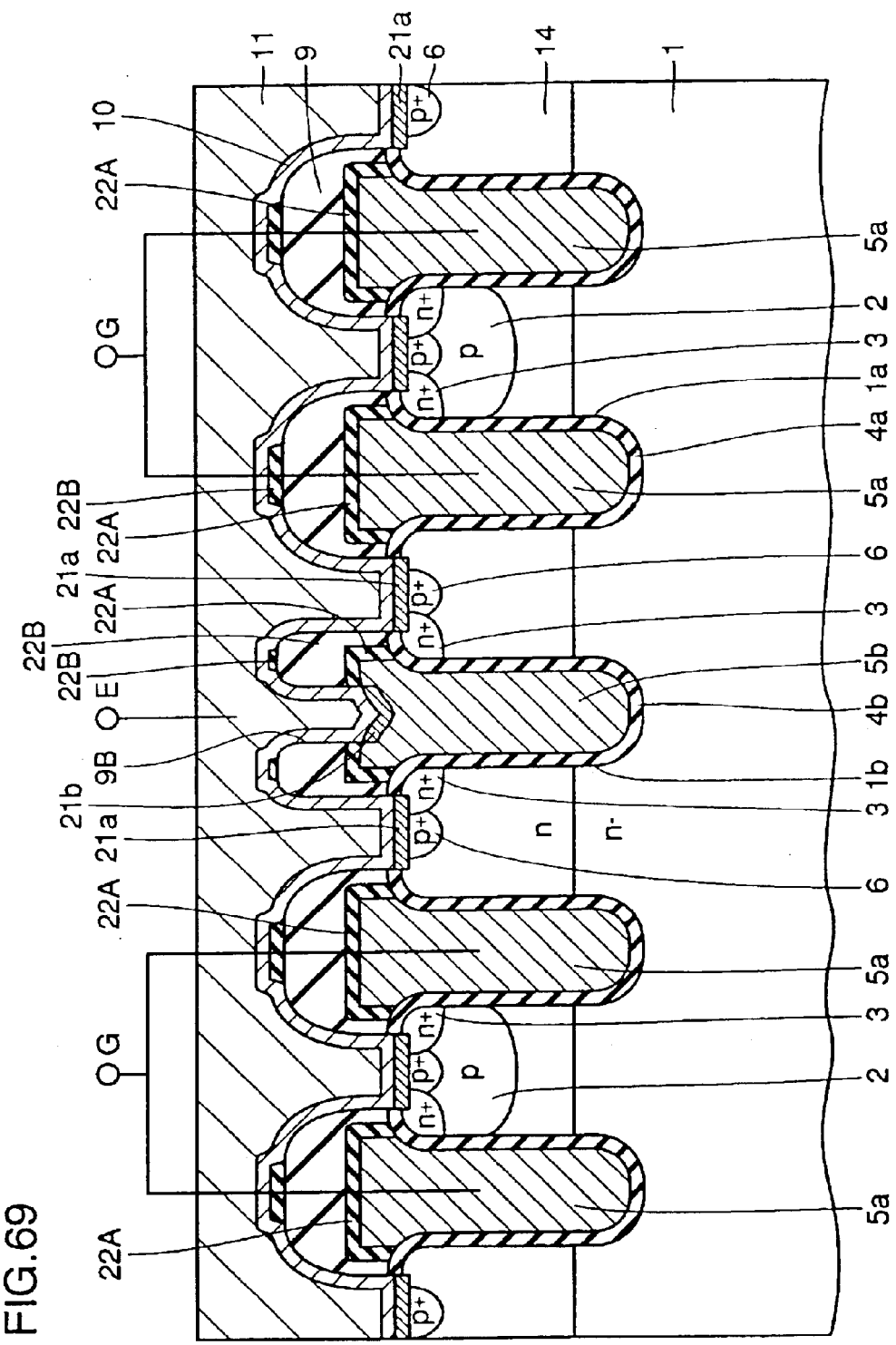
Figure 70:
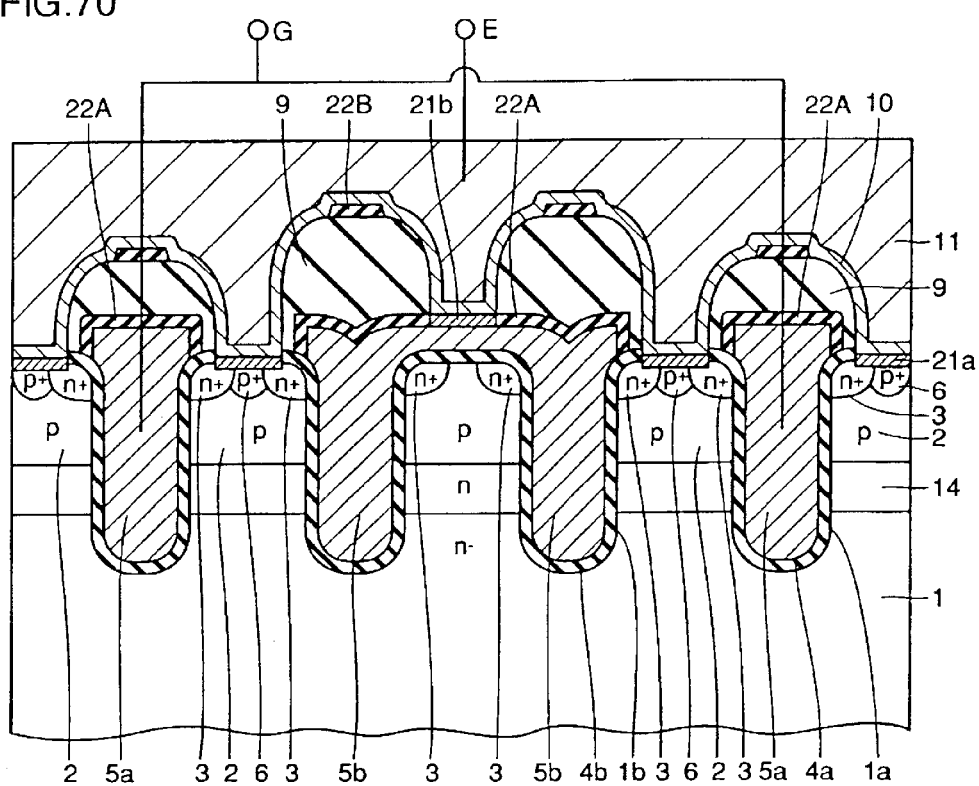

In the configuration in FIG. 60, which corresponds to the configuration shown in FIG. 28, in the configuration in FIG. 61, which corresponds to the configuration shown in FIG. 30, in the configuration in FIG. 62, which corresponds to the configuration shown in FIG. 32, in the configuration in FIG. 63, which corresponds to the configuration shown in FIG. 39, in the configuration in FIG. 64, which corresponds to the configuration shown in FIG. 40, in the configuration in FIG. 65, which corresponds to the configuration shown in FIG. 51, in the configuration in FIG. 66, which corresponds to the configuration shown in FIG. 42, in the configuration in FIG. 67, which corresponds to the configuration shown in FIG. 53, in the configuration in FIG. 68, which corresponds to the configuration shown in FIG. 54, in the configuration in FIG. 69, which corresponds to the configuration shown in FIG. 55 and in the configuration in FIG. 70, which corresponds to the configuration shown in FIG. 41, the upper surface of gate electrode 5a protrudes above trench 1a for a gate. Here, in the configuration shown in FIG. 62, the upper surface of conductive layer 5b that fills in trench 1b also protrudes above trench 1b.

Here, though in the above description, trench-type gate structures are described, the structures of Embodiments 1 to 5 can also be applied to a plane gate-type IGBT. FIGS. 71 to 74 are schematic cross sectional views showing configurations of plane gate-type IGBTs.

Figure 71:
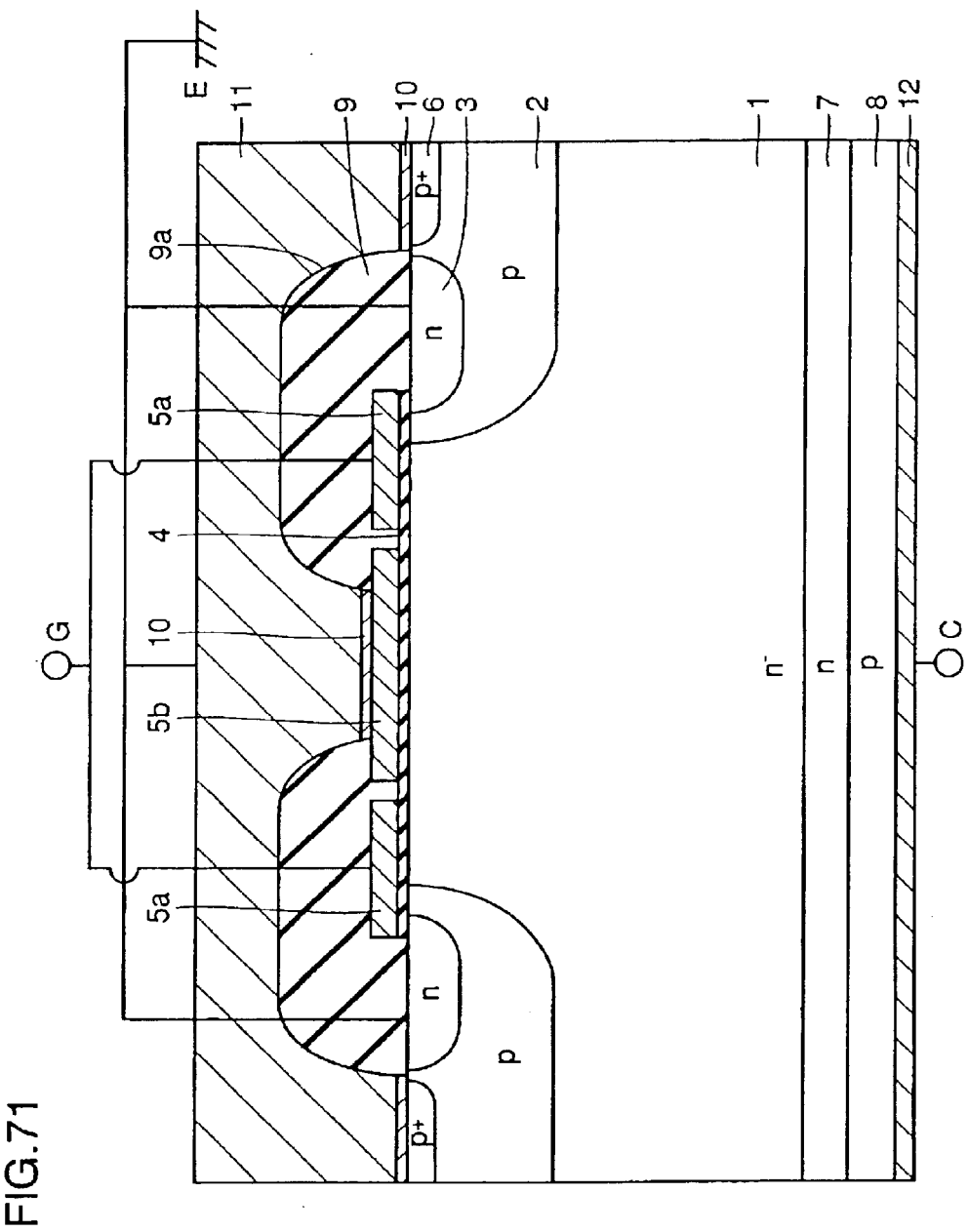

In reference to FIG. 71, a plane gate-type IGBT is formed in a semiconductor substrate of which the thickness is, for example, no less than 50 μm and no greater than 250 μm. p-type body region 2 made of a p-type semiconductor substrate is selectively formed on the first main surface side of n⁻ silicon substrate 1 of which the concentration is, for example, $1 \times 10^{14}$ cm$^{-3}$. p-type body region 2 has the concentration of, for example, $1 \times 10^{15}$ cm$^{-3}$ to $1 \times 10^{18}$ cm$^{-3}$ and has a diffusion depth of approximately 1.0 μm to 4.0 μm from the first main surface. n-type emitter region 3 of which the concentration is, for example, $1 \times 10^{18}$ cm$^{-3}$ to $1 \times 10^{20}$ cm$^{-3}$, or higher, and of which the diffusion depth from the first main surface is approximately 0.3 μm to 2.0 μm is formed in the first main surface within p-type body region 2. p+ impurity diffusion region 6 for forming a low resistance contact with p-type body region 2 is formed having, for example, approximately $1 \times 10^{18}$ cm$^{-3}$ to $1 \times 10^{20}$ cm$^{-3}$ next to this n-type emitter region 3 so that the diffusion depth from the first main surface is no greater than the depth of n-type emitter region 3.

Gate electrode 5a is formed above the first main surface via gate insulating film 4a so as to be opposed to p-type body region 2 sandwiched between n⁻ silicon substrate 1 and n-type emitter region 3.

This n⁻ silicon substrate 1, n-type emitter region 3 and gate electrode 5a form an insulating gate type field effect transistor portion (here MOS transistor portion) having n⁻ silicon substrate 1 as a drain and n-type emitter region 3 as a source.

Conductive layer 5b, which becomes of the emitter potential, is formed in the first main surface sandwiched between two MOS transistor portions. A polycrystal silicon into which phosphorus, for example, is introduced so as to have a high concentration, a high melt point metal material, a high melt point metal silicide or a compound film of these is used for the material of this conductive layer 5b and gate electrode 5a.

Insulating film 9 is formed in the first main surface and contact hole 9a that reaches to a portion of the surface of the first main surface is created in this insulating film 9. Barrier metal layer 10 is formed at the bottom portion of this contact hole 9a. Emitter electrode 11 is electrically connected to p+ impurity diffusion region 6 and to n-type emitter region 3 so as to provide emitter potential E via this barrier metal layer 10.

In addition, n-type impurity diffusion region 7 and p-type collector region 8 are sequentially formed on the second main surface side of n⁻ silicon substrate 1. Collector electrode 12, which provides collector potential C, is electrically connected to p-type collector region 8. The material of this collector electrode 12 is, for example, an aluminum compound.

In the present embodiment, the thickness $t_1$ of the semiconductor substrate is no less than 50 μm and no greater than 250 μm. In addition, the impurity activation ratio of p-type collector region 8 is no greater than 50%. In addition, it is preferable for the depth of p-type collector region 8 from the second main surface to be no greater than 1 μm. In addition, it is preferable for n-type impurity diffusion region 7 to have an impurity concentration peak lower than the impurity concentration peak of p-type collector region 8. In addition, it is preferable for this n-type impurity diffusion region 7 to be formed at a depth of no greater than 2 μm from the second main surface.

Figure 72:
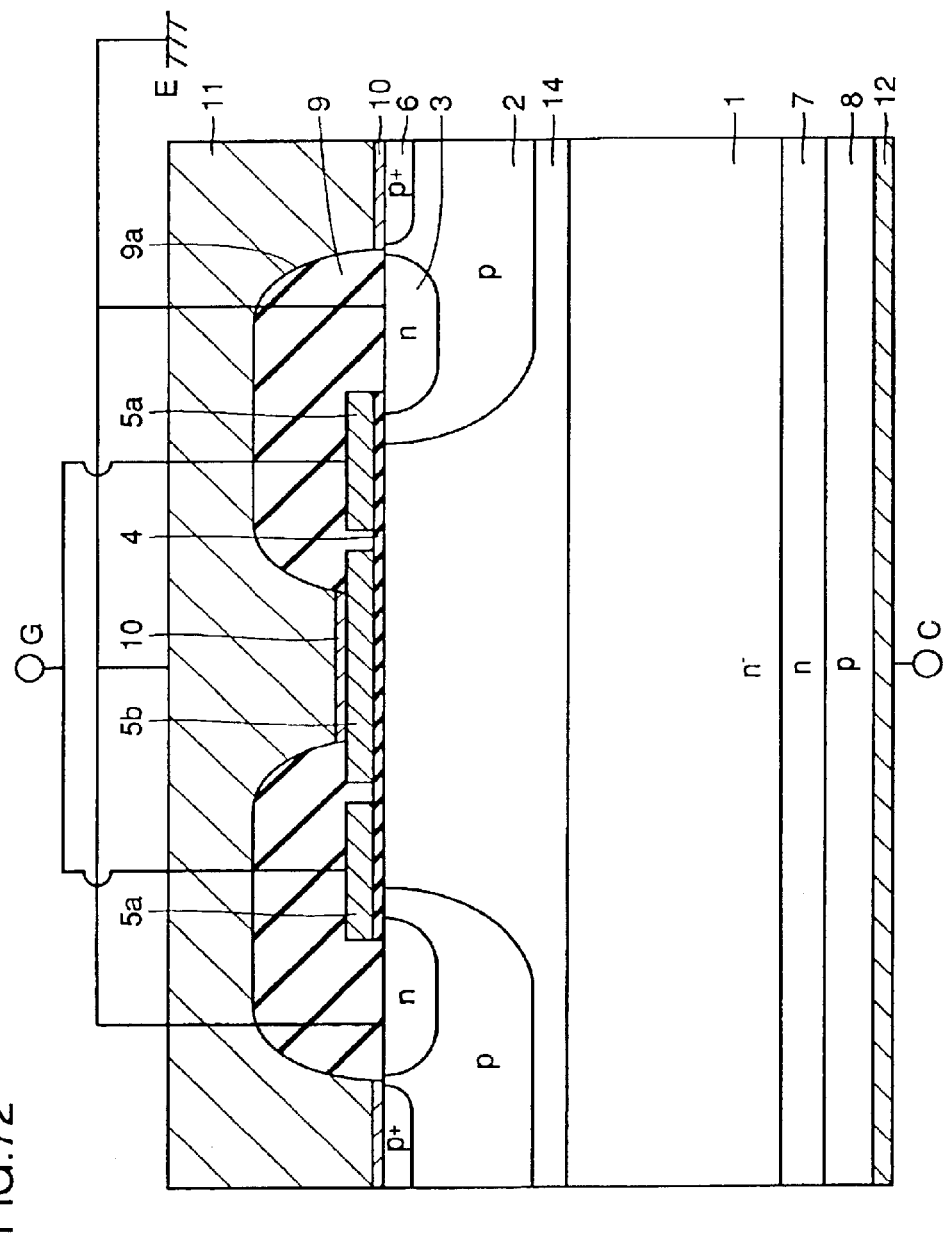
Figure 73:
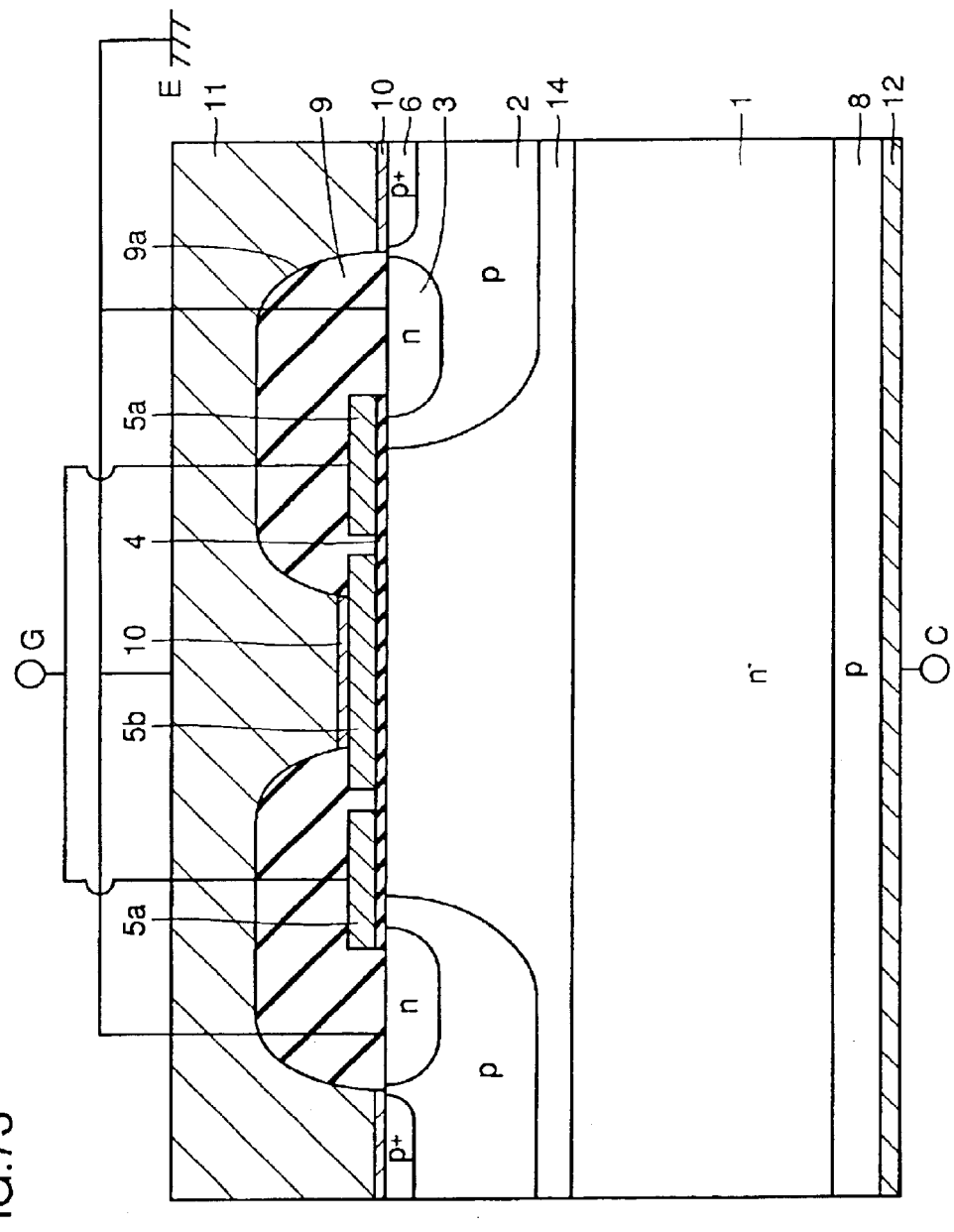
Figure 74:
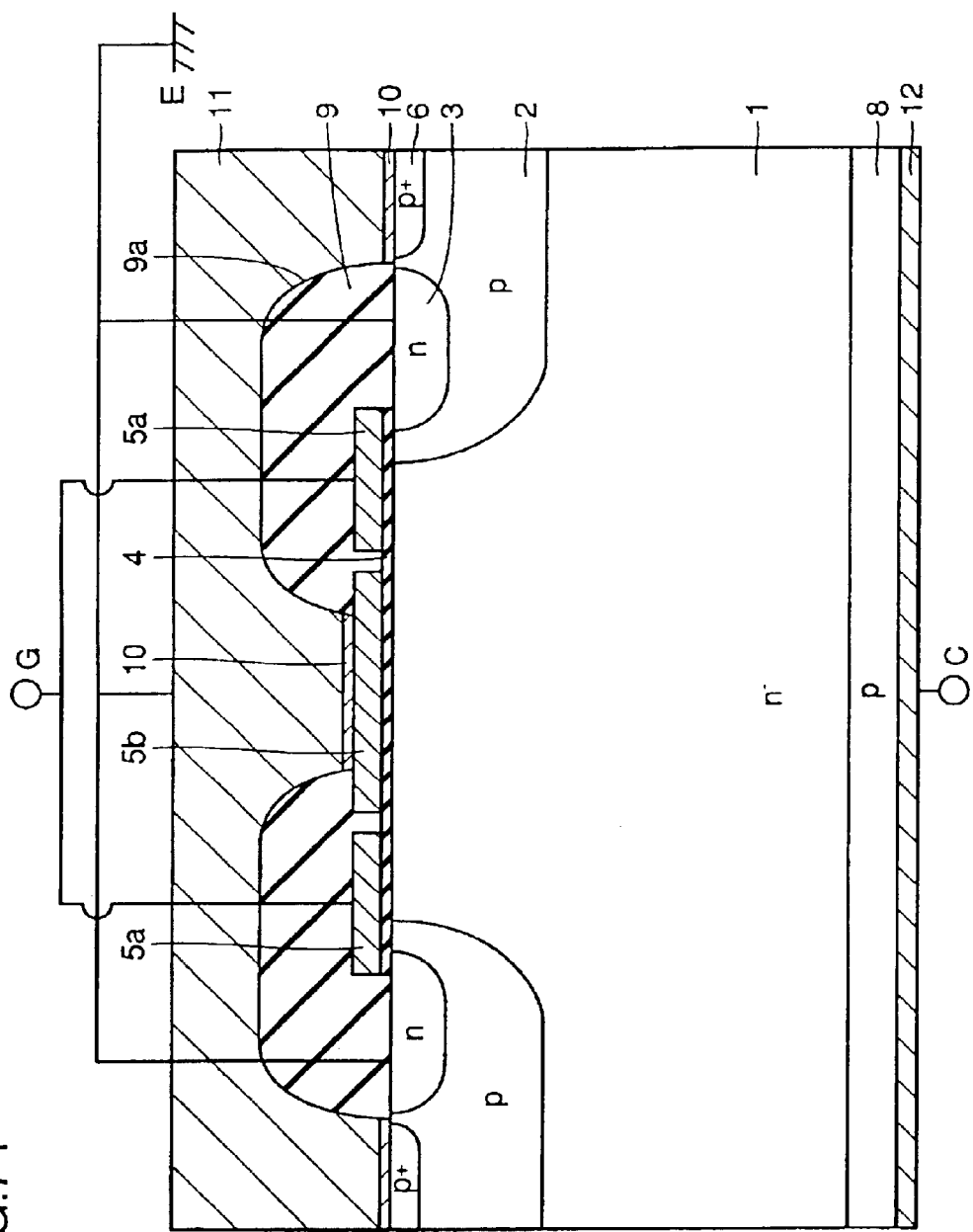

Here, as shown in FIG. 72, n-type impurity diffusion region 14 may be added to the configuration of FIG. 71 or, as shown in FIG. 73, n-type impurity diffusion region 7 may be omitted or, as shown in FIG. 74, n-type impurity diffusion region 14 may be added and n-type impurity diffusion region 7 may be omitted.

Here, though in the present embodiment, IGBTs are cited as examples and are described, the present invention can be applied to an element that has an insulating gate type field effect transistor, which is not limited to an IGBT.

The embodiments disclosed herein should be considered as illustrative from all points of view and are not limitative. The scope of the present invention is not defined by the above description but, rather, is defined by the claims and is intended to include meanings equivalent to the claims and all modifications within the scope.

INDUSTRIAL APPLICABILITY

The present invention relates to a high withstanding voltage element, in particular, to the structure of an IGBT and exercises, specifically in a trench gate IGBT, the effects to the maximum. In addition, the present invention can be advantageously applied to a semiconductor device wherein the lowering of the ON voltage is implemented, wherein the withstanding capacity against breakdown is secured and wherein switching loss on the high voltage side can be reduced and can be applied to a manufacturing method for the same. In addition, the present invention can. be advantageously applied to a semiconductor device wherein negative effects on device characteristics due to fluctuations in process conditions can be prevented and can be applied to a manufacturing method for the same. In addition, the present invention can be advantageously applied to a manufacturing method for a semiconductor device wherein the limitations on the freedom of the thickness of the substrate are reduced and the is suitable for reduction in price.

What is claimed is:

1. A semiconductor device, comprising:
   a semiconductor substrate having a first main surface and a second main surface that are opposed to each other; and
   an element that includes an insulating gate type field effect transistor portion, having an insulating gate structure on said first main surface side, in which a main current flows between said first main surface and said second main surface, wherein:
   said insulating gate type field effect transistor portion is a bipolar transistor, a gate electrode of said insulating gate type field effect transistor portion is formed within a trench for a gate provided in said first main surface of said semiconductor substrate, and
   the thickness of said semiconductor substrate is no less than 50 $\mu$m and no greater than 250 $\mu$m.

2. The semiconductor device according to claim 1, characterized in that
   said insulating gate type field effect transistor portion has a source diffusion region and a drain diffusion region of a first conductive type, and in that
   said source diffusion region of the first conductive type is formed in said first main surface and is opposed to said drain diffusion region sandwiching a body region of a second conductive type.

3. The semiconductor device according to claim 1, characterized in that a trench for a gate is formed in said first main surface of said semiconductor substrate, in that said gate electrode of said insulating gate type field effect transistor portion is filled in said trench for a gate and in that an upper surface of said gate electrode protrudes from said trench for a gate.

4. The semiconductor device according to claim 1, wherein:
   said trench for a gate is formed in said first main surface of said semiconductor substrate;
   a gate electrode of said insulating gate type field effect transistor portion is filled in said trench for a gate; and
   an upper surface of said gate electrode is shifted not toward said first main surface but toward said second main surface side.

5. The semiconductor device according to claim 1, further comprising, on said first main surface side, a source side electrode electrically connected to said source diffusion region.

6. The semiconductor device according to claim 5, characterized in that said semiconductor substrate has a trench for a source side electrode in said first main surface and in that a conductive layer electrically connected to said source side electrode is filled in said trench for a source side electrode.

7. The semiconductor device according to claim 5, characterized in that said source side electrode is formed in said first main surface, to which no trenches are provided, and in that a second high concentration region of the second conductive type is provided to said first main surface, to which no trenches are provided, so as to be electrically connected to said source side electrode.

8. A semiconductor device comprising;
   a semiconductor substrate having a first main surface and a second main surface that are opposed to each other; and
   an element that includes an insulating gate type field effect transistor portion, having an insulating gate structure on said first main surface side, in which a main current flows between said first main surface and said second main surface, wherein
   said element has an impurity diffusion region which is formed in said second main surface and of which the impurity activation ratio is no greater than 50%.

9. The semiconductor device according to claim 8, characterized in that the impurity surface concentration of said impurity diffusion region in said second main surface is no lower than $5 \times 10^{15}$ cm$^{-3}$.

10. The semiconductor device according to claim 8, characterized in that the diffusion depth of said impurity diffusion region from said second main surface is no greater than 1 $\mu$m.

11. The semiconductor device according to claim 8, characterized in that
    said impurity diffusion region and the drain diffusion region of said insulating gate type field effect transistor portion from a pn junction, in that
    said drain diffusion region has a first high concentration region of a first conductive type in a region that contacts said impurity diffusion region and in that
    said first high concentration region has an impurity concentration peak of a concentration, or lower, of an impurity concentration peak of said impurity diffusion region.

12. The semiconductor device according to claim 8, characterized in that a trench for a gate is created in said first main surface of said semiconductor substrate, in that a gate electrode of said insulating gate type field effect transistor portion is filled in said trench for a gate and in that an upper surface of said gate electrode protrudes from said trench for a gate.

13. The semiconductor device according to claim 8, characterized in that a trench for a gate is created in said first main surface of said semiconductor substrate, in that a gate electrode of said insulating gate type field effect transistor portion is filled in said trench for a gate and in that an upper surface of said gate electrode is shifted not toward said first main surface but, rather, toward said second main surface side.

14. The semiconductor device according to claim 8, characterized by further comprising, on said first main surface side, a source side electrode electrically connected to the source diffusion region of said insulating gate type field effect transistor portion.

15. The semiconductor device according to claim 14, characterized in that said semiconductor substrate has a trench for a source side electrode in said first main surface and in that a conductive layer electrically connected to said source side electrode is filled in said trench for a source side electrode.

16. The semiconductor device according to claim 14, characterized in that said source side electrode is formed in said first main surface, to which no trenches are provided, and in that a second high concentration region of the second conductive type is provided to said first main surface, to which no trenches are provided, so as to be electrically connected to said source side electrode.

* * * * *